(12) United States Patent
Tanaka et al.

(10) Patent No.: US 9,841,684 B2
(45) Date of Patent: Dec. 12, 2017

(54) LIGHT SOURCE APPARATUS AND DATA PROCESSING METHOD

(71) Applicant: GIGAPHOTON INC., Oyama-shi, Tochigi (JP)

(72) Inventors: Hiroshi Tanaka, Oyama (JP); Akihiko Kurosu, Oyama (JP); Hiroyuki Masuda, Oyama (JP); Hideyuki Ochiai, Oyama (JP); Osamu Wakabayashi, Oyama (JP); Masato Moriya, Oyama (JP)

(73) Assignee: Gigaphoton Inc., Tochigi (JP)

( * ) Notice: Subject to any disclaimer, the term of this patent is extended or adjusted under 35 U.S.C. 154(b) by 153 days.

(21) Appl. No.: 14/629,282

(22) Filed: Feb. 23, 2015

(65) Prior Publication Data

US 2015/0168848 A1 Jun. 18, 2015

Related U.S. Application Data

(63) Continuation of application No. PCT/JP2013/072197, filed on Aug. 20, 2013.

(30) Foreign Application Priority Data

Aug. 23, 2012 (JP) .................................. 2012-184557

(51) Int. Cl.
*G03F 7/20* (2006.01)
*H01L 21/268* (2006.01)
(Continued)

(52) U.S. Cl.
CPC ...... *G03F 7/70483* (2013.01); *G03F 7/70041* (2013.01); *G03F 7/70058* (2013.01);
(Continued)

(58) Field of Classification Search
CPC .. H01S 3/0014; H01S 5/0014; G03F 7/70025; G03F 7/70525; G03F 7/70558;
(Continued)

(56) References Cited

U.S. PATENT DOCUMENTS 6,008,497 A 12/1999 Mizoguchi et al.
6,084,897 A 7/2000 Wakabayashi et al.
(Continued)

FOREIGN PATENT DOCUMENTS

AU 2003236345 A1 4/2003
JP 09085474 A 3/1997
(Continued)

OTHER PUBLICATIONS

Jinphil Choi et al, "Enhancing Lithography Process Control Through Advanced, On-Board Beam Parameter Metrology for Wafer Level Monitoring of Light Source Parameters," Optical Microlithography XXV, Proc. of SPIE, vol. 8326, pp. 832620-1-832620-6.
(Continued)

*Primary Examiner* — Michelle M Iacoletti
(74) *Attorney, Agent, or Firm* — Studebaker & Brackett PC

(57) ABSTRACT

A light source apparatus according to an embodiment may be used for an exposure apparatus which exposes a plurality of wafers by repeating a wafer exposure for exposing a total exposure area of each wafer. The wafer exposure may include a sequential execution of scanning exposures in which each divided area defined by dividing the total exposure area of each wafer is scanned by pulsed light. The apparatus may comprise: a light source controller configured to execute a control for outputting the pulsed light based on a luminescence trigger signal received from the exposure apparatus; a detector configured to detect a characteristic of
(Continued)

| WAFER NUMBER | SCANNING NUMBER | PULSE NUMBER | TIME Time | TRIGGER INTERVAL T | PULSE ENERGY CONTROL RELATED DATA | | | WAVELENGTH CONTROL RELATED DATA | | |
|---|---|---|---|---|---|---|---|---|---|---|
| | | | | | TARGET PULSE ENERGY Et | PULSE ENERGY E | CHARGE VOLTAGE V | TARGET WAVELENGTH λt | WAVE-LENGTH λ | SPECTRUM WIDTH Δλ |
| #1 | #1 | #1 | Time(1,1,1) | T(1,1,1) | Et(1,1,1) | E(1,1,1) | V(1,1,1) | λt(1,1,1) | λ(1,1,1) | Δλ(1,1,1) |
| #1 | #1 | #2 | Time(1,1,2) | T(1,1,2) | Et(1,1,2) | E(1,1,2) | V(1,1,2) | λt(1,1,2) | λ(1,1,2) | Δλ(1,1,2) |
| #1 | #1 | #3 | Time(1,1,3) | T(1,1,3) | Et(1,1,3) | E(1,1,3) | V(1,1,3) | λt(1,1,3) | λ(1,1,3) | Δλ(1,1,3) |
| #1 | #1 | . | . | . | . | . | . | . | . | . |
| #1 | #1 | . | . | . | . | . | . | . | . | . |
| #1 | #2 | #1 | Time(1,2,1) | T(1,2,1) | Et(1,2,1) | E(1,2,1) | V(1,2,1) | λt(1,2,1) | λ(1,2,1) | Δλ(1,2,1) |
| #1 | #2 | #2 | Time(1,2,2) | T(1,2,2) | Et(1,2,2) | E(1,2,2) | V(1,2,2) | λt(1,2,2) | λ(1,2,2) | Δλ(1,2,2) |
| #1 | #2 | #3 | Time(1,2,3) | T(1,2,3) | Et(1,2,3) | E(1,2,3) | V(1,2,3) | λt(1,2,3) | λ(1,2,3) | Δλ(1,2,3) |
| #1 | #2 | . | . | . | . | . | . | . | . | . |
| #1 | #3 | . | . | . | . | . | . | . | . | . |
| . | . | . | . | . | . | . | . | . | . | . |
| . | . | . | . | . | . | . | . | . | . | . |
| . | . | . | . | . | . | . | . | . | . | . |
| #w | #s | #p | Time(w,s,p) | T(w,s,p) | Et(w,s,p) | E(w,s,p) | V(w,s,p) | λt(w,s,p) | λ(w,s,p) | Δλ(w,s,p) |
| . | . | . | . | . | . | . | . | . | . | . |
| . | . | . | . | . | . | . | . | . | . | . | the pulsed light; and a data collection processor configured to collect at least a piece of data in data included in a pulse light data group related to the pulsed light detected by the detector and a control data group related to the control, and execute a mapping process of mapping the collected data by at least one of scanning exposure basis and wafer exposure basis.

27 Claims, 52 Drawing Sheets

(51) Int. Cl.
  *H01L 21/67* (2006.01)
  *H01L 21/66* (2006.01)

(52) U.S. Cl.
  CPC ........ *G03F 7/70358* (2013.01); *H01L 21/268* (2013.01); *H01L 21/67115* (2013.01); *H01L 21/67253* (2013.01); *H01L 22/10* (2013.01); *H01L 22/26* (2013.01)

(58) Field of Classification Search
  CPC ............. G03F 7/70575; G03F 7/70041; G03F 7/70483; H01L 21/67253; H01L 22/10; H01L 22/26
  See application file for complete search history.

(56) References Cited

U.S. PATENT DOCUMENTS

| | | | |
|---|---|---|---|
| 6,408,260 | B1 | 6/2002 | Watts et al. |
| 6,697,695 | B1 | 2/2004 | Kurihara et al. |
| 7,203,562 | B2 | 4/2007 | Patel et al. |
| 8,165,181 | B2 | 4/2012 | Nagai et al. |
| 8,891,574 | B2 | 11/2014 | Nagai et al. |
| 8,902,948 | B2 | 12/2014 | Nagai et al. |
| 2001/0020195 | A1 | 9/2001 | Patel et al. |
| 2004/0186609 | A1 | 9/2004 | Patel et al. |
| 2009/0147231 | A1 | 6/2009 | Sukegawa |
| 2010/0007864 | A1 | 1/2010 | Tsuchiya |
| 2011/0220816 | A1 | 9/2011 | Kakizaki et al. |

FOREIGN PATENT DOCUMENTS

| | | |
|---|---|---|
| JP | 09122949 B2 | 5/1997 |
| JP | 09248682 B2 | 9/1997 |
| JP | 11201869 A | 7/1999 |
| JP | 11204856 A | 7/1999 |
| JP | 2000003872 A | 1/2000 |
| JP | 2000036462 A | 2/2000 |
| JP | 2001244531 A | 9/2001 |
| JP | 2002015986 A | 1/2002 |
| JP | 2002043219 A | 2/2002 |
| JP | 2002084020 A | 3/2002 |
| JP | 2009141154 A | 6/2009 |
| JP | 2010021211 A | 1/2010 |
| JP | 2010050299 A | 3/2010 |
| JP | 2011210704 A | 10/2011 |

OTHER PUBLICATIONS

International Search Report dated Oct. 29, 2013 corresponding to PCT/JP2013/072197.
An Office Action; "Notification of Reasons for Refusal" issued by the Japanese Patent Office dated Jun. 13, 2017, which corresponds to Japanese Patent Application No. 2014-531637 and is related to U.S. Appl. No. 14/629,282; with English language translation.

FIG.7

| PULSE NUMBER | TIME Time | TRIGGER INTERVAL T | PULSE ENERGY CONTROL RELATED DATA | | | WAVELENGTH CONTROL RELATED DATA | | SPECTRUM WIDTH Δλ |
|---|---|---|---|---|---|---|---|---|
| | | | TARGET PULSE ENERGY Et | PULSE ENERGY E | CHARGE VOLTAGE V | TARGET WAVELENGTH λt | WAVELENGTH λ | |
| #1 | Time(1) | T(1) | Et(1) | E(1) | V(1) | λt(1) | λ(1) | Δλ(1) |
| #2 | Time(2) | T(2) | Et(2) | E(2) | V(2) | λt(2) | λ(2) | Δλ(2) |
| #3 | Time(3) | T(3) | Et(3) | E(3) | V(3) | λt(3) | λ(3) | Δλ(3) |
| . | . | . | . | . | . | . | . | . |
| #k | Time(k) | T(k) | Et(k) | E(k) | V(k) | λt(k) | λ(k) | Δλ(k) |
| . | . | . | . | . | . | . | . | . |
| #n | Time(n) | T(n) | Et(n) | E(n) | V(n) | λt(n) | λ(n) | Δλ(n) |

FIG.12

| WAFER NUMBER | SCANNING NUMBER | PULSE NUMBER | TIME Time | TRIGGER INTERVAL T | PULSE ENERGY CONTROL RELATED DATA | | | WAVELENGTH CONTROL RELATED DATA | | |
|---|---|---|---|---|---|---|---|---|---|---|
| | | | | | TARGET PULSE ENERGY Et | PULSE ENERGY E | CHARGE VOLTAGE V | TARGET WAVELENGTH λt | WAVE-LENGTH λ | SPECTRUM WIDTH Δλ |
| #1 | #1 | #1 | Time(1,1,1) | T(1,1,1) | Et(1,1,1) | E(1,1,1) | V(1,1,1) | λt(1,1,1) | λ(1,1,1) | Δλ(1,1,1) |
| #1 | #1 | #2 | Time(1,1,2) | T(1,1,2) | Et(1,1,2) | E(1,1,2) | V(1,1,2) | λt(1,1,2) | λ(1,1,2) | Δλ(1,1,2) |
| #1 | #1 | #3 | Time(1,1,3) | T(1,1,3) | Et(1,1,3) | E(1,1,3) | V(1,1,3) | λt(1,1,3) | λ(1,1,3) | Δλ(1,1,3) |
| #1 | #1 | . | . | . | . | . | . | . | . | . |
| #1 | #1 | . | . | . | . | . | . | . | . | . |
| #1 | #2 | #1 | Time(1,2,1) | T(1,2,1) | Et(1,2,1) | E(1,2,1) | V(1,2,1) | λt(1,2,1) | λ(1,2,1) | Δλ(1,2,1) |
| #1 | #2 | #2 | Time(1,2,2) | T(1,2,2) | Et(1,2,2) | E(1,2,2) | V(1,2,2) | λt(1,2,2) | λ(1,2,2) | Δλ(1,2,2) |
| #1 | #2 | #3 | Time(1,2,3) | T(1,2,3) | Et(1,2,3) | E(1,2,3) | V(1,2,3) | λt(1,2,3) | λ(1,2,3) | Δλ(1,2,3) |
| #1 | #2 | . | . | . | . | . | . | . | . | . |
| #1 | #3 | . | . | . | . | . | . | . | . | . |
| . | . | . | . | . | . | . | . | . | . | . |
| . | . | . | . | . | . | . | . | . | . | . |
| #w | #s | #p | Time(w,s,p) | T(w,s,p) | Et(w,s,p) | E(w,s,p) | V(w,s,p) | λt(w,s,p) | λ(w,s,p) | Δλ(w,s,p) |
| . | . | . | . | . | . | . | . | . | . | . |
| . | . | . | . | . | . | . | . | . | . | . |

FIG.16

| WAFER NUMBER | SCANNING NUMBER | TIME Time | TRIGGER INTERVAL T | PULSE ENERGY CONTROL RELATED DATA ||| WAVELENGTH CONTROL RELATED DATA |||
|---|---|---|---|---|---|---|---|---|---|
| | | | | AVERAGE PULSE ENERGY $E_{av}$ | PULSE ENERGY STANDARD DEVIATION $E\sigma$ | AVERAGE CHARGE VOLTAGE $V_{av}$ | AVERAGE WAVELENGTH $\lambda_{av}$ | WAVELENGTH STANDARD DEVIATION $\lambda\sigma$ | AVERAGE SPECTRUM WIDTH $\Delta\lambda_{av}$ |
| #1 | #1 | Time(1,1) | T(1,1) | Eav(1,1) | Eσ(1,1) | Vav(1,1) | λav(1,1) | λσ(1,1) | Δλav(1,1) |
| #1 | #2 | Time(1,2) | T(1,2) | Eav(1,2) | Eσ(1,2) | Vav(1,2) | λav(1,2) | λσ(1,2) | Δλav(1,2) |
| #1 | #3 | Time(1,3) | T(1,3) | Eav(1,3) | Eσ(1,3) | Vav(1,3) | λav(1,3) | λσ(1,3) | Δλav(1,3) |
| . | . | . | . | . | . | . | . | . | . |
| . | . | . | . | . | . | . | . | . | . |
| #2 | #1 | Time(2,1) | T(2,1) | Eav(2,1) | Eσ(2,1) | Vav(2,1) | λav(2,1) | λσ(2,1) | Δλav(2,1) |
| #2 | #2 | Time(2,2) | T(2,2) | Eav(2,2) | Eσ(2,2) | Vav(2,2) | λav(2,2) | λσ(2,2) | Δλav(2,2) |
| #2 | #3 | Time(2,3) | T(2,3) | Eav(2,3) | Eσ(2,3) | Vav(2,3) | λav(2,3) | λσ(2,3) | Δλav(2,3) |
| . | . | . | . | . | . | . | . | . | . |
| . | . | . | . | . | . | . | . | . | . |
| #w | #s | Time(w,s) | T(w,s) | Eav(w,s) | Eσ(w,s) | Vav(w,s) | λav(w,s) | λσ(w,s) | Δλav(w,s) |
| . | . | . | . | . | . | . | . | . | . |

FIG.20

| WAFER NUMBER | TIME Time | TRIGGER INTERVAL T | PULSE ENERGY CONTROL RELATED DATA ||| WAVELENGTH CONTROL RELATED DATA |||
| --- | --- | --- | --- | --- | --- | --- | --- | --- |
| | | | AVERAGE PULSE ENERGY Eav | PULSE ENERGY STANDARD DEVIATION Eσ | AVERAGE CHARGE VOLTAGE Vav | AVERAGE WAVELENGTH λav | WAVELENGTH STANDARD DEVIATION λσ | AVERAGE SPECTRUM WIDTH Δλav |
| #1 | Time(1) | T(1) | Eav(1) | Eσ(1) | Vav(1) | λav(1) | λσ(1) | Δλav(1) |
| #2 | Time(2) | T(2) | Eav(2) | Eσ(2) | Vav(2) | λav(2) | λσ(2) | Δλav(2) |
| #3 | Time(3) | T(3) | Eav(3) | Eσ(3) | Vav(3) | λav(3) | λσ(3) | Δλav(3) |
| . | . | . | . | . | . | . | . | . |
| . | . | . | . | . | . | . | . | . |
| . | . | . | . | . | . | . | . | . |
| #w | Time(w) | T(w) | Eav(w) | Eσ(w) | Vav(w) | λav(w) | λσ(w) | Δλav(w) |
| . | . | . | . | . | . | . | . | . |

FIG.22

| RELATED DATA | DATA TO BE COLLECTED AND PROCESSED | PER PULSE | PER SCAN-NING | PER WAFER | DEFINITION |
|---|---|---|---|---|---|
| ENERGY CONTROL RELATED DATA Dec | TARGET PULSE ENERGY Et | ✓ | — | — | TARGET PULSE ENERGY RECEIVED FROM EXPOSURE APPARATUS |
| | PULSE ENERGY OF PO Epo | ✓ | — | — | PULSE ENERGY OF PO DETECTED BY PO PULSE ENERGY DETECTOR; PULSE ENERGY BEING TO BE INPUTTED INTO EXPOSURE APPARATUS |
| | EXPOSURE AMOUNT ERROR De | ✓ | — | — | De=(D-N·Et) D: MOVING INTEGRATION VALUE OF Epo AT PULSE NUMBER N N: NUMBER OF PULSES OF MOVING INTEGRATION VALUE (NUMBER OF PULSES TO BE INTRODUCED INTO SAME AREA OF WAFER) |
| | MAXIMUM VALUE OF EXPOSURE AMOUNT ERROR Demax | — | ✓ | ✓ | - |
| | MINIMUM VALUE OF EXPOSURE AMOUNT ERROR Demin | — | ✓ | ✓ | - |
| | AVERAGE VALUE OF EXPOSURE AMOUNT ERROR Deav | — | ✓ | ✓ | - |
| WAVELENGTH CONTROL RELATED DATA D$\lambda$c | TARGET WAVELENGTH $\lambda$t | ✓ | — | — | TARGET WAVELENGTH RECEIVED FROM EXPOSURE APPARATUS |
| | WAVELENGTH $\lambda$ | ✓ | — | — | E.G. WAVELENGTH AT BARYCENTRIC POSITION OF SPECTRUM WAVEFORM |
| | WAVELENGTH ERROR $\lambda$e | ✓ | — | — | $\lambda e=\lambda-\lambda t$ |
| | AVERAGE WAVELENGTH $\lambda$av | — | ✓ | ✓ | - |
| | FWHM OF SPECTRUM $\Delta\lambda$_FWHM | ✓ | — | — | FWHM AT HALF VALUE OF PEAK VALUE OF SPECTRUM WAVEFORM |
| | 95% WIDTH OF SPECTRUM $\Delta\lambda$_E95 | ✓ | — | — | FWHM INTO WHICH 95% ENERGY OF TOTAL ENERGY OF SPECTRUM WAVEFORM IS INCLUDED |
| BEAM RELATED DATA Db | CENTER POSITION (VERTICAL DIRECTION: Bcv, HORIZONTAL DIRECTON: Bch) | ✓ | — | — | E.G. VALUE OF BARYCENTRIC POSITION OF BEAM OBTAINED FROM BEAM PROFILE DETECTED BY BEAM PROFILER |
| | BEAM SIZE (VERTICAL DIRECTION: Bsv, HORIZONTAL DIRECTON: Bsh) | ✓ | — | — | E.G. WIDTH AT $1/e^2$ VALUE OF PEAK VALUE OF BEAM PROFILE DETECTED BY BEAM PROFILER |
| | BEAM DIVERGENCE (VERTICAL DIRECTION: Bdv, HORIZONTAL DIRECTON: Bdh) | ✓ | — | — | DIVERGENCE CORRESPONDING TO SIZE OF COLLECTED BEAM DETECTED BY POINTING DETECTOR (E.G. SIZE CORRESPONDING TO WIDHT AT $1/e^2$ VALUE OF PEAK VALUE OF COLLECTED BEAM WAVEFORM) |
| | BEAM POINTING (VERTICAL DIRECTION: Bpv, HORIZONTAL DIRECTON: Bph) | ✓ | — | — | SIZE OF COLLECTED BEAM DETECTED BY POINTING DETECTOR (E.G. DIRECTION CORRESPONDING TO BARYCENTRIC POSITION OF COLLECTED BEAM WAVEFORM) |
| | POLARIZATION DEGREE P | ✓ | — | — | P=Ph/(Ph+Pv) Ph: ENERGY IN DESIRED POLARIZATION DIRECTION |
| | AVERAGE VALUE OF POLARIZATION DEGREE Pav | — | ✓ | ✓ | - |

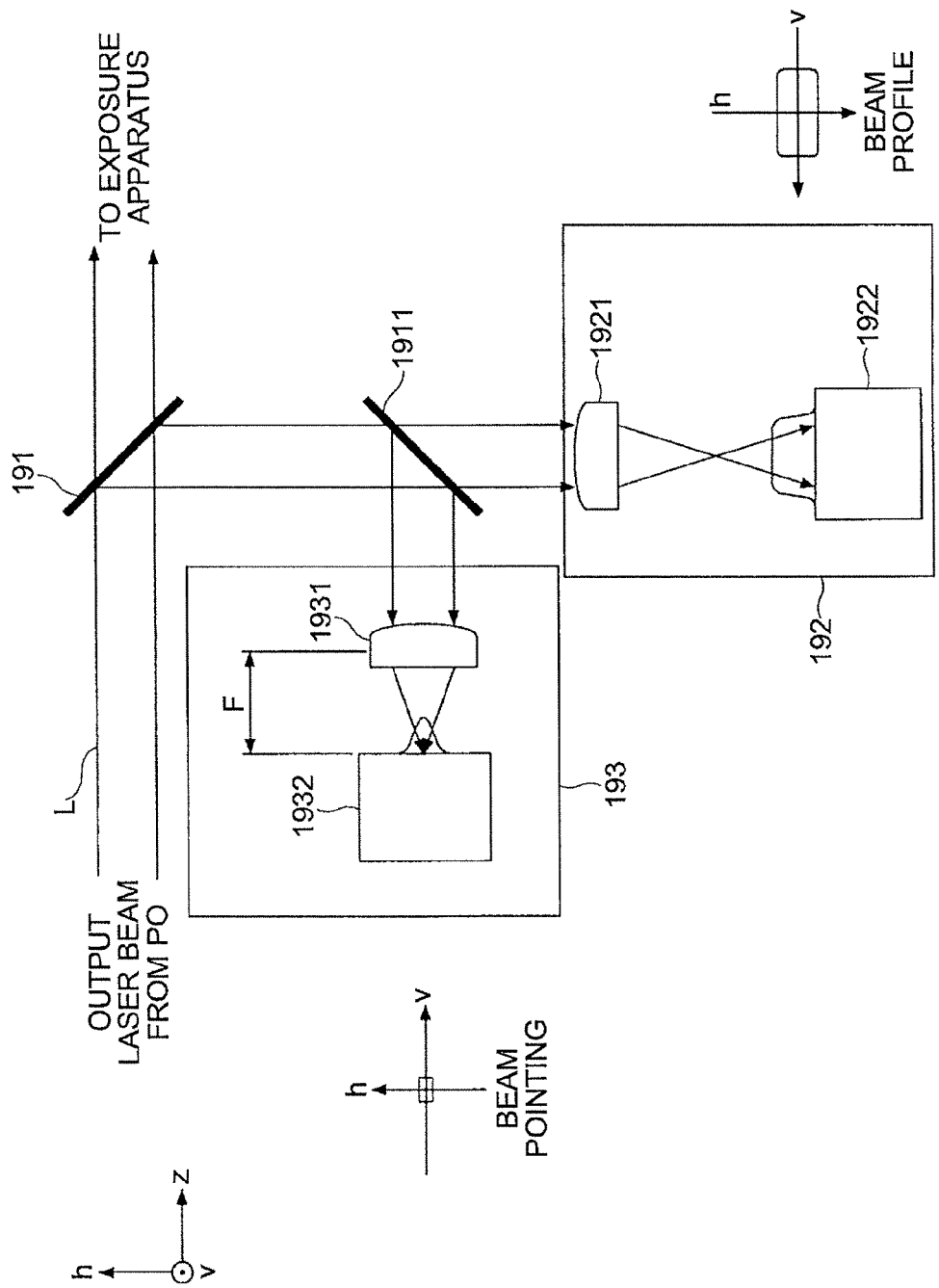

FIG.26

| RECEPTION NUMBER | TIME Time | RECEPTION ID |
|---|---|---|
| #1 | Time(1) | RecvID(1) |
| #2 | Time(2) | RecvID(2) |
| #3 | Time(3) | RecvID(3) |
| . | . | . |
| . | . | . |
| . | . | . |
| #r | Time(r) | RecvID(r) |
| . | . | . |

FIG.28

| WAFER NUMBER | WAFER ID | TIME Time | TRIGGER INTERVAL T | PULSE ENERGY CONTROL RELATED DATA | | | WAVELENGTH CONTROL RELATED DATA | | |
|---|---|---|---|---|---|---|---|---|---|
| | | | | AVERAGE PULSE ENERGY $E_{av}$ | PULSE ENERGY STANDARD DEVIATION $E\sigma$ | AVERAGE CHARGE VOLTAGE $V_{av}$ | AVERAGE WAVELENGTH $\lambda_{av}$ | WAVELENGTH STANDARD DEVIATION $\lambda\sigma$ | AVERAGE SPECTRUM WIDTH $\Delta\lambda_{av}$ |
| #1 | ID(1) | Time(1) | T(1) | Eav(1) | Eσ(1) | Vav(1) | λav(1) | λσ(1) | Δλav(1) |
| #2 | ID(2) | Time(2) | T(2) | Eav(2) | Eσ(2) | Vav(2) | λav(2) | λσ(2) | Δλav(2) |
| #3 | ID(3) | Time(3) | T(3) | Eav(3) | Eσ(3) | Vav(3) | λav(3) | λσ(3) | Δλav(3) |
| . | . | . | . | . | . | . | . | . | . |
| . | . | . | . | . | . | . | . | . | . |
| . | . | . | . | . | . | . | . | . | . |
| #w | ID(w) | Time(w) | T(w) | Eav(w) | Eσ(w) | Vav(w) | λav(w) | λσ(w) | Δλav(w) |
| . | . | . | . | . | . | . | . | . | . |

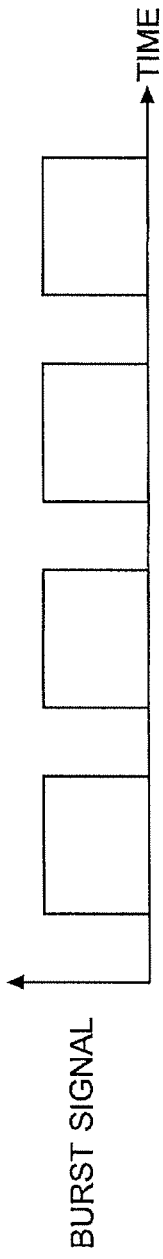

FIG.52

| RELATED DATA | DATA TO BE COLLECTED AND PROCESSED | UNIT OF DATA PROCESSING | | | DEFINITION |
|---|---|---|---|---|---|
| | | PER PULSE | PER SCANNING | PER WAFER | |
| LAASER PULSE ENERGY RELATED DATA | TARGET VALUE OF PULSE ENERGY OF LASER BEAM ELt | ✓ | – | – | TARGET PULSE ENERGY RECEIVED FROM EUV LIGHT GENERATION APPARATUS |
| | PULSE ENERGY OF LASER BEAM EL | ✓ | – | – | PULSE ENERGY OF LASER BEAM DETECTED BY PULSE ENERGY SENSOR OF LASER BEAM |
| LASER BEAM RELATED DATA | CENTER POSITION OF BEAM (VERTICAL DIRECTION: Bcv, HORIZONTAL DIRECTION: Bch) | – | ✓ | – | E.G. VALUE OF BARYCENTRIC POSITION OBTAINED FROM BEAM PROFILE DETECTED BY BEAM PROFILER |
| | BEAM SIZE (VERTICAL DIRECTION: Bwv, HORIZONTAL DIRECTION: Bwh) | – | ✓ | – | E.G. WIDTH AT $1/e^2$ VALUE OF PEAK VALUE OF BEAM PROFILE DETECTED BY BEAM PROFILER |
| | BEAN DIVERGENCE (VERTICAL DIRECTION: Bdv, HORIZONTAL DIRECTION: Bdh) | – | ✓ | – | DIVERGENCE CORRESPONDING TO SIZE OF COLLECTED BEAM DETECTED BY POINTING DETECTOR (E.G. SIZE CORRESPONDING TO WIDTH AT $1/e^2$ VALUE OF PEAK VALUE OF COLLECTED BEAM WAVEFORM) |
| | BEAM POINTING (VERTICAL DIRECTION: Bpv, HORIZONTAL DIRECTION: Bph) | – | ✓ | – | SIZE OF COLLECTED BEAM DETECTED BY POINTING DETECTOR (E.G. DIRECTION CORRESPONDING TO BARYCENTRIC POSITION OF COLLECTED BEAM WAVEFORM) |
| | POLARIZATION DEGREE P | – | ✓ | – | $P=(Ph-Pv)/(Ph+Pv)$ Ph: ENERGY IN DESIRED POLARIZATION DIRECTION |
| EUV LIGHT RELATED DATA | TARGET ENERGY OF PULSE ENERGY OF EUV LIGHT EUVt | ✓ | – | – | TARGET PULSE ENERGY RECEIVED FROM EUV LIGHT GENERATION APPARATUS |
| | PULSE ENERGY OF EUV LIGHT EUV | ✓ | – | – | PULSE ENERGY OF EUV LIGHT DETECTED BY PULSE ENERGY SENSOR OF EUV LIGHT |
| | EXPOSURE ERROR De | ✓ | – | – | $De=(D-N \cdot EUVt)$ D: MOVING INTEGRATION VALUE OF Epo AT PULSE NUMBER N N: NUMBER OF PULSES OF MOVING INTEGRATION VALUE (NUMBER OF PULSES TO BE INTRODUCED INTO SAME AREA OF WAFER) |
| | MAXIMUM VALUE OF EXPOSURE ERROR Demax | – | ✓ | ✓ | - |
| | MINIMUM VALUE OF EXPOSURE ERROR Demin | – | ✓ | ✓ | - |
| | AVERAGE VALUE OF EXPOSURE ERROR Deav | – | ✓ | ✓ | - |

LIGHT SOURCE APPARATUS AND DATA PROCESSING METHOD

CROSS-REFERENCE TO RELATED APPLICATION

The application is a continuation of PCT International Application No. PCT/JP2013/072197 filed on Aug. 20, 2013 which claims the benefit of priority from Japanese Patent Application No. 2012-184557, filed on Aug. 23, 2012; the entire contents of which are incorporated herein by reference.

BACKGROUND

1. Technical Field

The present disclosure relates to a light source apparatus and a data processing method.

2. Related Art

In recent years, for a semiconductor exposure apparatus (hereinafter referred to as an exposure apparatus), a higher resolution is being required as miniaturization and integration of a semiconductor integrated circuit have been progressed. Therefore, wavelength-shortening of light outputted from an exposure apparatus has been developed. Generally, as an exposure apparatus, a gas laser apparatus is used instead of the traditional mercury lamp. For example, as a gas laser apparatus for exposure, a KrF excimer laser outputting an ultraviolet laser beam with 248 nm (nanometer) wavelength or an ArF excimer laser outputting an ultraviolet light beam with 193 nm wavelength may be used.

In a next generation exposure technology, an immersion exposure in which a gap between an exposure lens in an exposure apparatus and a wafer is filled with fluid has been put to practical use. In the immersion exposure, because refraction index between the exposure lens and the wafer is changed, an apparent wavelength of the exposure light source is shortened. In a case where an immersion exposure is conducted using an ArF excimer laser as an exposure light source, a wafer is irradiated with an ultraviolet light beam of which wavelength is equivalent to 134 nm. Such technique may be called as an ArF immersion exposure (or an ArF immersion lithography).

Natural oscillation amplitudes of a KrF excimer laser and an ArF excimer laser are wide such as about 350 to 400 pm (picometer). Therefore, when a projector lens is made by a material which transmits an ultraviolet light beam such as a KrF laser beam or an ArF laser beam, a chromatic distortion may occur. As a result, a resolution may be reduced. Therefore, a spectrum line width of a laser beam outputted from a gas laser apparatus should be narrowed to the extent a chromatic distortion can be ignored. In order to narrow a spectrum line width, in a laser resonator of a gas laser apparatus, a line narrow module (LNM) with a line narrowing element (an etalon, a grating, or the like) may be mounted. In the following, a laser apparatus of which spectrum line width is narrowed may be called as a line narrowed laser apparatus.

SUMMARY

A light source apparatus according to an aspect of the present disclosure may be used for an exposure apparatus which exposes a plurality of wafers by repeating a wafer exposure for exposing a total exposure area of each wafer. The wafer exposure may include a sequential execution of scanning exposures in which each divided area defined by dividing the total exposure area of each wafer is scanned by pulsed light. The apparatus may comprise: a light source controller configured to execute a control for outputting the pulsed light based on a luminescence trigger signal received from the exposure apparatus; a detector configured to detect a characteristic of the pulsed light; and a data collection processor configured to collect at least a piece of data in data included in a pulse light data group related to the pulsed light detected by the detector and a control data group related to the control, and execute a mapping process of mapping the collected data by at least one of scanning exposure basis and wafer exposure basis.

A data processing method according to another aspect of the present disclosure may be used for an exposure apparatus which exposes a plurality of wafers by repeating a wafer exposure for exposing a total exposure area of each wafer. The wafer exposure may include a sequential execution of scanning exposures in which each divided area defined by dividing the total exposure area of each wafer is scanned by pulsed light. The method may include: executing a control for outputting the pulsed light based on a luminescence trigger signal received from the exposure apparatus; detecting a characteristic of the pulsed light; executing a data collection process of collecting at least a piece of data in data included in a pulse light data group related to the pulsed light detected by the detector and a control data group related to the control; and executing a mapping process of mapping the collected data by at least one of scanning exposure basis and wafer exposure basis.

BRIEF DESCRIPTION OF THE DRAWINGS

Hereinafter, selected embodiments of the present disclosure will be described with reference to the accompanying drawings;

FIG. 7 is a diagram showing an example of a table of data stored in a data collection processing system;

FIG. 12 is a diagram showing an example of data associated by the process flow of FIG. 9 in the first embodiment and the process flow of FIG. 10 in the second embodiment;

FIG. 16 is a diagram showing a list of process data processed according to the process flow shown in FIG. 13;

FIG. 20 is a diagram showing a list of wafer numbers stored in the data collection processing system by the execution of the process flow shown in FIG. 17 and process data for each wafer;

FIG. 22 is a diagram showing an example of possible parameters to be transmitted from the double chamber laser apparatus to a FDC system;

FIG. 23 is a diagram showing detail structures of a beam profiler and a beam pointing detector;

FIG. 26 is a diagram showing an example of the stored verification result;

FIG. 28 is a diagram showing an example of data ordered by verifying the wafer number and the wafer ID;

FIG. 51A is a timing chart of burst signals;

FIG. 51B is a timing chart of droplet passage timing signals;

FIG. 51C is a timing chart of the luminescence trigger signals;

FIG. 52 is a diagram showing an example of data collection in a case where data collection of a light source apparatus constructed from the EUV light generation apparatus is executed.

DETAILED DESCRIPTION

Figure 1:
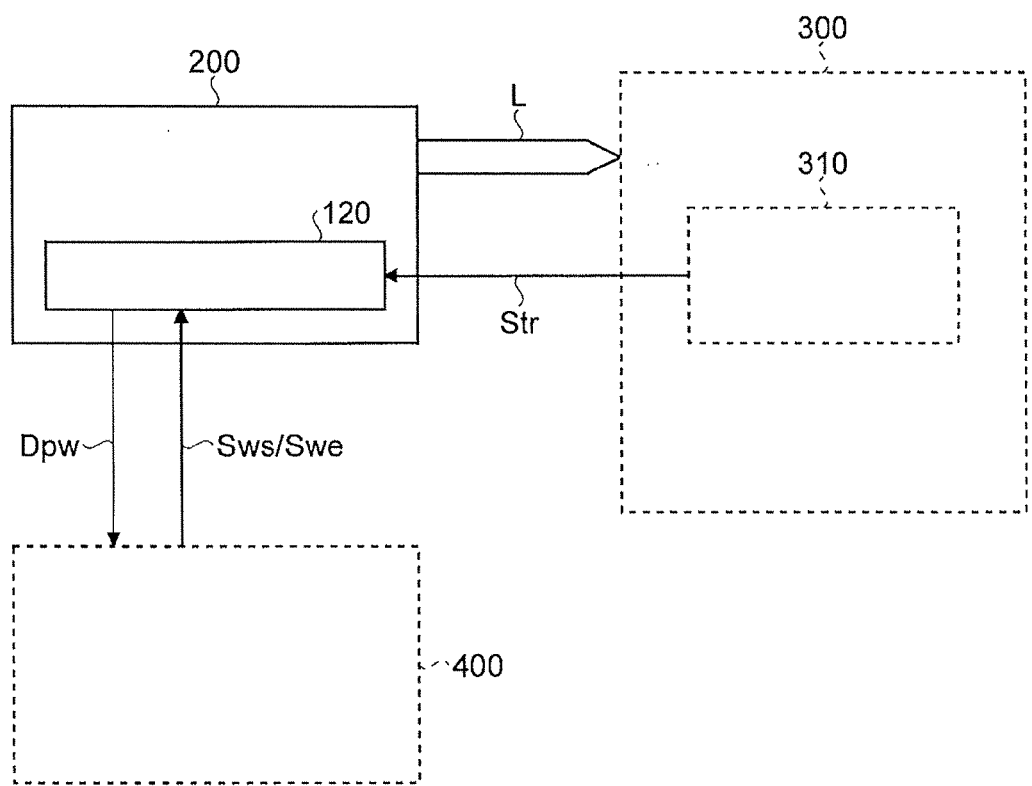
FIG. 1 is a diagram showing a total structure of an exposure laser apparatus and structural elements associated with the exposure laser apparatus according to one aspect of the disclosure.

In general, although a line narrowing laser apparatus may be used for a semiconductor exposure apparatus, in a semiconductor fabrication plant, in order to improve an yield rate of semiconductor process, a system (apparatus) for monitoring a state of a semiconductor production equipment may be installed.

A FDC (fault detection and classification) system may be used to analyze wafers manufactured by a semiconductor production equipment, and when wafers have defects, or the like, classify the wafers by each property of defect, and determining the causes of the defects, or the like. In the case where the FDC is used for such semiconductor exposure apparatus, data of measuring results of laser beams irradiated to wafers from a laser apparatus and control data for outputting laser beams may be recorded. Because pulse laser beams are generally used as the laser beams, data of each pulse laser beam will be recorded.

In such case, for recognizing exposure statuses of wafers accurately, data about each pulse laser beam outputted from a laser apparatus should be accurately associated with information about which wafer and which area of the wafer.

The exact recognition of data of pulse laser beams and data of exposure statuses associated with exposure areas in wafers should be executed not only in a case where a laser apparatus is used for exposing but also in a case where an extreme ultraviolet light (EUV) light generation apparatus outputting an EUV light is used for exposing.

Therefore, an exposure apparatus and a method of data processing according to the disclosure may associate data about pulse laser beams outputted for exposing wafers with information about which wafer and which area of the wafer.

Hereinafter, selected embodiments of the present disclosure will be described in detail along the following table of contents.

Table of Contents
1. Overview
2. Definition of term(s)
    2.1 Explanation and definition of burst driving
    2.2 Explanation and definition of scanning exposure
    2.3 Explanation and definition of FDC (fault detection and classification)
3. Exposure laser apparatus
    3.1 Structure
    3.2 Operation
    3.3 Purpose
4. Exposure laser apparatus which measure time interval between luminescence triggers
    4.1 Structure
    4.2 Operation
    4.3 Flow of data collection
    4.3.1 Flow of collecting measured data of laser apparatus
    4.3.2 Flow of associating measured data with recognition by wafer basis and scanning basis
        4.3.2.1 First embodiment
        4.3.2.2 Second embodiment
    4.3.3 Data processing flow
5. Embodiment in double chamber laser system
    5.1 Double chamber laser system
    5.1.1 Structure
    5.1.2 Operation
    5.1.3 Example of parameter for data collection process in double chamber laser system
    5.2 Detector of laser beam
    5.2.1 Beam profiler and beam pointing detector
    5.2.2 Polarization detector
    5.3 Transmission to FDC
6. Double chamber laser apparatus with beam detector system
    6.1 Structure
    6.2 Operation
    6.3 Effect
7. Beam detector system
    7.1 Structure
    7.2 Operation
    7.3 Effect
    7.4 Process flow
8. Alternative of beam detector system
    8.1 First alternative
    8.2 Second alternative
9. Alternative of control circuit
10. Data processing system of EUV generator apparatus
11. Epilegomenon
    11.1 Controller Hereinafter, selected embodiments of the present disclosure will be described in detail with reference to the accompanying drawings. The embodiments to be described below are merely illustrative in nature and do not limit the scope of the present disclosure. Further, the configuration(s) and operation(s) described in each embodiment are not all essential in implementing the present disclosure. Note that like elements are referenced by like reference numerals and characters, and duplicate descriptions thereof will be omitted herein. The embodiments of the present disclosure will be described following the table of contents below.

1. Overview

The disclosure may relate to a method or an apparatus of collecting and processing property data of laser beams used for scanning exposure by every wafer based on a time interval of triggers of laser beams.

2. Definition of Term(s)

2.1 Explanation and Definition of Burst Driving

Burst driving may indicate a driving in which a burst term for continuously oscillating line narrowed pulse laser beams based on exposure and an idle term for resting oscillation based on a stage movement are repeated alternately.

2.2 Explanation and Definition of Scanning Exposure

Scanning exposure may indicate an exposure method of exposing a specific exposure area while scanning a pulse laser beam.

2.3 Explanation and Definition of FDC (Fault Detection and Classification)

FDC system may indicate a system or an apparatus for monitoring a state of a semiconductor production equipment in order to improve an yield rate of wafer process. In addition, as a system for managing an yield rate of a semiconductor fabrication plant, in addition to the FDC, there is a system such as a MES (manufacturing execution system), or the like. In the disclosure, although the FDC system is described as an example, the other system can also be used.

3. Laser Apparatus for Exposure Apparatus 3.1 Structure

FIG. 1 is a diagram showing a total structure of an exposure laser apparatus and structural elements associated with the exposure laser apparatus according to one aspect of the disclosure. As shown in FIG. 1, the exposure laser apparatus 200 may have a laser controller 120. The exposure apparatus 300 may have an exposure controller 310. As a corresponding element of the exposure apparatus 300, a FDC system 400 may be installed.

The laser apparatus 200 may be connected with the exposure apparatus 300, and be configured to receive luminescence trigger signals Str transmitted from the exposure controller 310 of the exposure apparatus 300, and output pulse laser beams L based on the oscillation triggers Str. The laser controller 120 may be connected with the FDC system 400, and be configured to receive wafer starting/ending signals SWs/SWe from the FDC system 400, and transmit data per wafer Dpw to the FDC system 400. The wafer starting/ending signal SWs/SWe may be a signal for notifying a starting/ending of wafer exposure.

3.2 Operation

When the laser controller 120 receives the luminescence trigger signals Str from the exposure controller 310, the laser controller 120 may output pulse laser beams L in synchronization with the received luminescence trigger signals Str. The laser controller 120 may measure characteristics of a pulse laser beam L using a detector at the time when the pulse laser beam L is outputted, and execute a feedback control so that the characteristics of pulse laser beams L becomes target characteristics. Furthermore, the laser controller 120 may store measurements such as pulse energy, a wavelength, a spectrum width, or the like, measured by the detector in a storage.

The characteristics of a pulse laser beam L may indicate various kinds of items representing properties of the pulse laser beam L, and for example, it may include pulse energy, a wavelength, a spectrum width, a beam profile, or the like. Laser light data may indicate a specific measured value or a specific calculated value of these items, and for example, it may include a measured value of pulse energy, a calculated value of a wavelength, a calculated value of a spectrum width, a measured value of a beam profile, or the like. A set of the laser light data including a plurality of these items may be referred to as a laser light data set.

When the laser controller 120 receive the wafer end signal SWe from the FDC system 400, the laser controller 120 may load data stored in the storage and compute the data. Thereby, it is possible to obtain an average value, a maximum value, a minimum value, or the like, of each of the measured values such as pulse energy, a wavelength, a spectrum width, or the like, for instance. The laser controller 120 may transmit data, which is the average value, the maximum value, the minimum value, or the like, of each of the measured value such as the pulse energy, the wavelength, the spectrum width, or the like, for instance, to the FDC system 400.

3.3 Purpose

Figure 2:
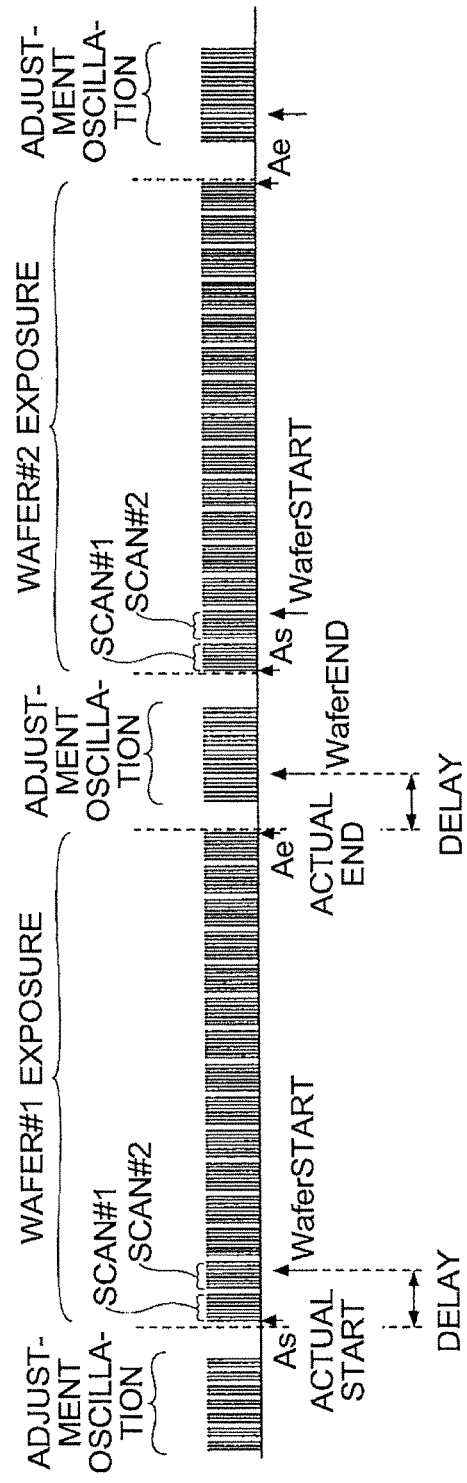
FIG. 2 is a diagram showing an example of output timings of pulse laser beams outputted from a laser apparatus according to an embodiment.

FIG. 2 is a diagram showing an example of output timings of pulse laser beams outputted from the laser apparatus according to the embodiment. In FIG. 2, each vertical line shows each pulse of pulse laser beams L.

As shown in FIG. 2, firstly, the laser apparatus 200 may execute an adjustment oscillation, and after a specific period of time is elapsed, the laser apparatus 200 may execute an exposure of an initial wafer #1. The adjustment oscillation may indicate an oscillation for outputting pulse laser beams L for adjusting which are not delivered to a wafer. The pulse laser beams L may be outputted with a specific frequency about several hundred hertz to several kilohertz, for instance. In a common method of outputting pulse laser beams L, a driving for continuously outputting pulse laser beams L for a specific period of time is repeated with specific periods of rest in between. For the adjustment oscillation, such method may be applied. A term in which pulses are clustered may indicate that pulse laser beams L are continuously outputted for a specific period of time, and a term without pulse may indicate an idle term. In FIG. 2, an example in which the adjustment oscillation with seven continuous output terms is executed is shown. In the adjustment oscillation, a time length of each continuous output term does not have to be constant, and for the adjustment, it is also possible that the time length of each continuous output term is set different.

After the adjustment oscillation, an exposure for an initial wafer #1 is executed when a comparatively long period of time has elapsed. In the exposure, steps of dividing an exposure surface of the initial wafer #1 is divided into specific areas, exposing a first divided area at a first scanning exposure Scan#1, and exposing a second divided area at a second scanning exposure Scan#2 are repeated. In the scanning exposure, pulse laser beams L are continuously outputted from the laser apparatus 200, and when the scanning exposure Scan#1 for the first divided area is finished, a next scanning exposure Scan#2 for the second divided area is executed after a specific period of time.

When the initial wafer #1 is exposed, as shown in FIG. 1, although the wafer start signal SWs is transmitted from the FDC system 400 to the laser apparatus 200, a reception timing of the wafer start signal SWs does not correspond to a start timing. As of an actual exposure, and the reception timing may be delayed. In such case, even if the laser apparatus 200 records characteristics of each pulse laser beam L, a recorded correspondence relationship between a wafer and a scanning exposure may not correspond to that of an actual exposure. Accordingly, because data Dpw for each wafer to be transmitted to the FDC system 400 may be such data recorded with a delay, or the like and not data accurately corresponding to each wafer, it is difficult that the FDC system 400 executes an accurate FDC analysis.

Therefore, in the laser apparatus 200 according to the embodiment of the disclosure, oscillation trigger intervals T of the pulse laser beams L transmitted from the exposure apparatus 300 may be monitored, and based on a result of monitoring the oscillation trigger intervals T, a scanning exposure for each wafer may be identified. And then, the characteristics data of pulse laser beams L of each scanning exposure is processed and the processed data Dpw may be transmitted to the FDC system 400.

Figure 3:
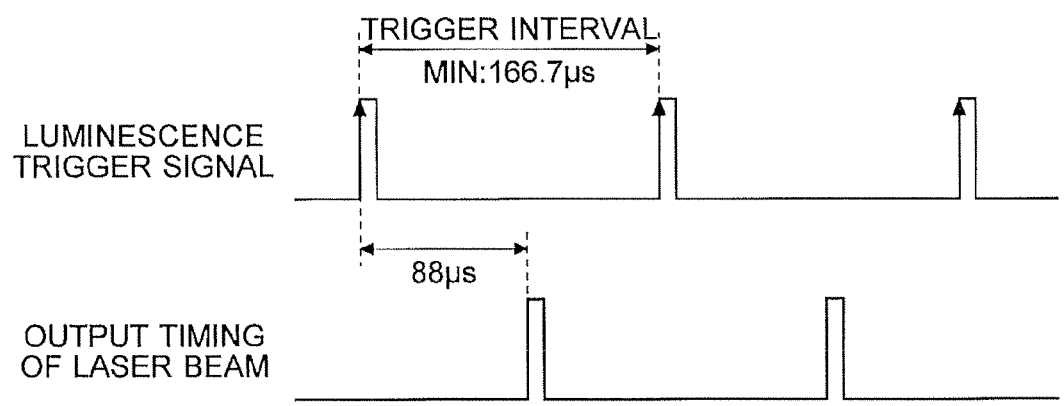
FIG. 3 is a diagram for explaining a definition of a trigger interval.

FIG. 3 is a diagram for explaining a definition of a trigger interval. An interval of the luminescence trigger signals Str transmitted from the exposure apparatus 300 to the laser apparatus 200 for every pulse may be defined as a trigger interval. In the laser apparatus 200, the pulse laser beams L may be outputted in synchronization with the luminescence trigger signals Str. A period of time from a reception of a luminescence trigger signal Str till an output of a pulse laser beam L is constant, and it may be 88 microseconds. Because output timings of pulse laser beams L and the luminescence trigger signals Str are synchronous, time intervals of the luminescence trigger signals Str may correspond to time intervals of output of the pulse laser beams L. A pulse width of an actually outputted pulse laser beams L may be about several dozen nanoseconds, and the trigger interval may be about 166.7 microseconds, for instance.

Therefore, although it is described that FIG. 2 shows the output of the pulse laser beams L of the laser apparatus 200, it is also possible to understand that FIG. 2 shows the luminescence trigger signals Str received by the laser apparatus 200. As explained with FIG. 3, because the output timings of the pulse laser beams L outputted from the laser apparatus 200 and the luminescence trigger signals Str received by the laser apparatus 200 are synchronous, it is also possible to understand that FIG. 2 shows both the luminescence trigger signals Str and the pulse laser beams L.

4. Laser Apparatus for Exposure Apparatus which Measure Luminescence Trigger Interval

4.1 Structure

Figure 4:
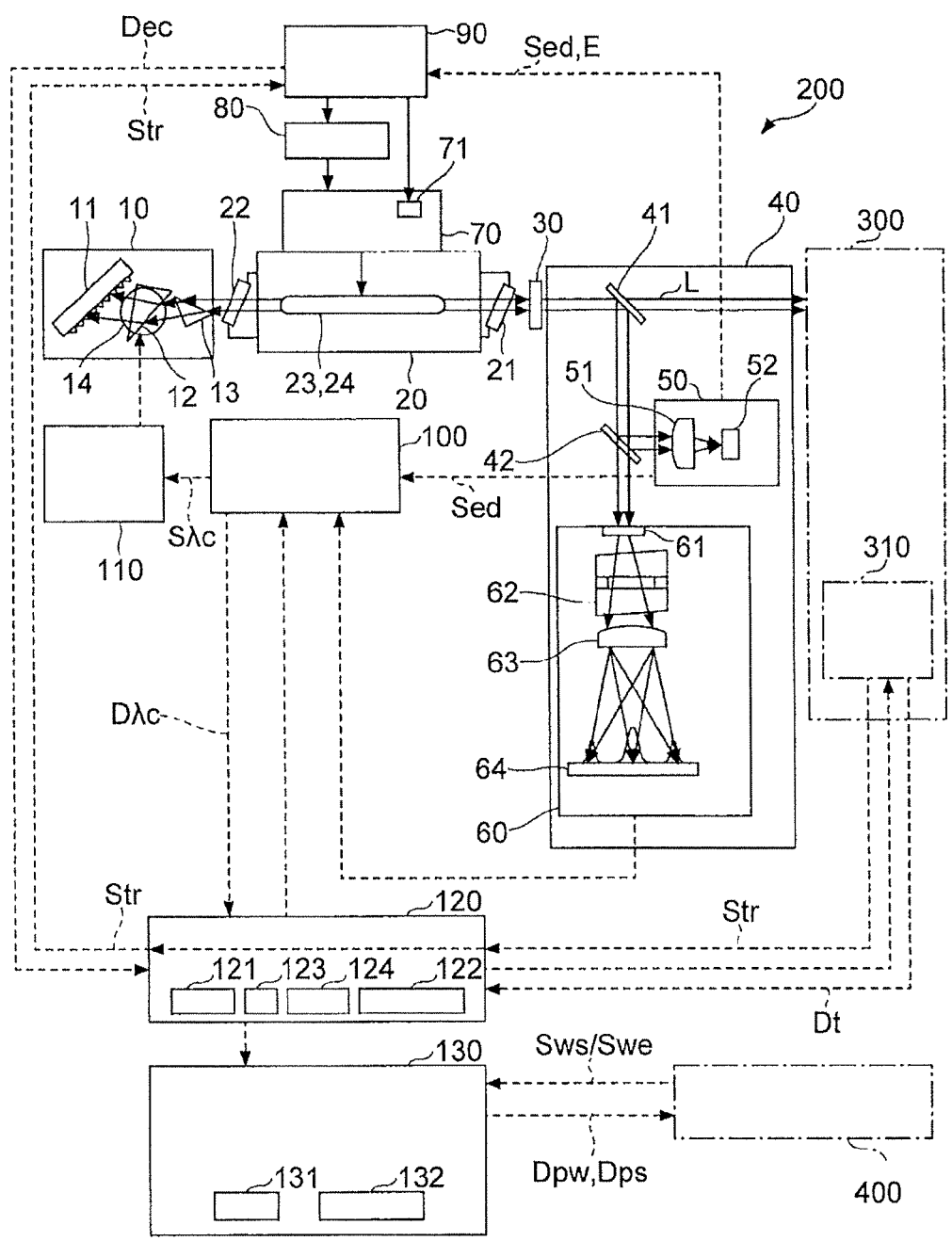
FIG. 4 is a diagram showing an example of a total structure of the laser apparatus according to the embodiment of the disclosure.

FIG. 4 is a diagram showing an example of a total structure of the laser apparatus according to the embodiment of the disclosure.

The laser apparatus according to the embodiment may include a line narrowing module (LNM) 10, a laser chamber 20, an output coupler (OC) 30, a monitor module 40, a pulse power module (PPM) 70, a charger 80, an energy controller 90, a wavelength controller 100, a wavelength adjuster 110, a laser controller 120, and a data collection processing system 130.

The LNM 10 and the OC 30 may construct a laser resonator, and the laser chamber 20 may be located on a light path of the laser resonator.

The LNM 10 is means for narrowing a spectrum width of a laser beam. The LNM 10 may include a grating 11, a plurality of prism beam expanders (hereinafter also referred to as prism) 12 and 13, and a rotary stage 14. The prism 12 may be disposed on the rotary stage 14. The grating 11 may be arranged in Littrow arrangement in which an incident angle and a diffraction angle become the same angle.

The laser chamber 20 may include windows 21 and 22, and a pair of discharge electrodes 23 and 24. The laser chamber 20 is filled with laser gas including Ar gas, F2 gas and Ne gas. With occurrence of a pulse discharge in the laser chamber 20, an excimer being in an excited state may occur, and with occurrence of stimulated emission at the excimer, a pulse laser beam L may be emitted.

The monitor module 40 may be disposed on a light path of the pulse laser beam L outputted from the OC 30. The monitor module 40 may include a beam splitter 41, a pulse energy detector 50, and a spectrum detector 60.

The beam splitter 41 may be disposed on the light path of the laser beam L outputted from the OC 30 so that a transmitted light having been passed through the beam splitter 41 may enter the exposure apparatus 300 and a reflected light may enter the beam splitter 42. A reflected light by the beam splitter 42 may enter the pulse energy detector 50, and a transmitted light may enter the spectrum detector 60.

The pulse energy detector 50 may be a detector for measuring energy of a pulse laser beam L. The pulse energy detector 50 may include a collector lens 51 and an optical sensor 52. The reflected light by the beam splitter 42 may enter the optical sensor 52 via the collector lens 51, and energy thereof may be measured by the optical sensor 52. The pulse energy detector 50 may detect that a pulse laser beam L is outputted by measuring energy of a pulse laser beam L, and output a luminescence detection signal Sed.

On the other hand, a light transmitted through the beam splitter 52 may enter the spectrum detector 60. The spectrum detector 60 may be a detector for measuring a spectrum of a pulse laser beam L. The spectrum detector 60 may include a diffuser plate 61, a monitor etalon 62, a collector lens 63, and an image sensor 64. The spectrum detector 60 may diffuse the entered pulse laser beam L by the diffuser plate 61, and disperse the diffused pulse laser beam L by the monitor etalon 62. Furthermore, the spectrum detector 60 may form an image of the dispersed pulse laser beam L on the image sensor 64 by focusing the dispersed pulse laser beam L using the collector lens 63, and measure a spectrum of the pulse laser beam L. A CCD (charge coupled device) sensor, a CMOS (complementary metal oxide semiconductor) sensor, or the like can be used as the image sensor 64.

The wavelength controller 100 may be installed while connected to the spectrum detector 60 and the wavelength adjuster 110. To the wavelength controller 100, a luminescence detection signal Sed may be inputted from the pulse energy detector 50 detecting an output of a laser beam. That is, as described above, when a pulse laser beam L is outputted, the luminescence detection signal Sed may be inputted from the pulse energy detector 50 to the wavelength controller 100. After the wavelength detector 100 receives the luminescence detection signal Sed, the wavelength detector 100 may receive data of a fringe pattern from the spectrum detector 60, and calculate a wavelength $\lambda$ and a spectrum width from the fringe pattern. The wavelength controller 100 may control an installation angle of the prism 12 via the wavelength adjuster 110 before a next pulse laser oscillation so that a difference between the calculated wavelength $\lambda$ and a target wavelength $\lambda t$ becomes smaller. Furthermore, the wavelength controller 100 may transmit wavelength control related data $D\lambda c$ to the laser controller 120.

The wavelength adjuster 110 may be connected to the rotary stage 14 of the LNM 10 while connected to the wavelength controller 100. The wavelength adjuster 110 may receive a wavelength control signal $S\lambda c$ from the wavelength controller 100, rotate the rotary stage 14 based on the received wavelength control signal $S\lambda c$, and adjust a wavelength of pulse laser beams L by controlling the installation angle of the prism 12.

That is, the wavelength controller 100 may fulfill a role to control a wavelength, and transmit a command to the wavelength adjuster 110 so that the wavelength of the pulse laser beams L becomes the target wavelength $\lambda t$. Meanwhile, the wavelength adjuster 110 may receive the command from the wavelength controller 100, and fulfill a role as an actuator which actually rotates the rotary stage 14 in order to output the pulse laser beam L with the desired wavelength $\lambda$.

The energy controller 90 may be connected to the pulse energy detector 50, the charger 80 and a switch 71 of the PPM 70.

The laser controller 120 may be connected to the wavelength controller 100, the energy controller 90, the data collection processing system 130 and the exposure controller 310. The laser controller 120 may have a storage 121, a processor 122, a timer 123 and a clock 124, if necessary.

The data collection processing system 130 may be connected to the FDC system 400. The data collection processing system 130 may be a system separated from the body of the laser apparatus 200, or may be a system installed in the body of the laser apparatus 200. The data collection processing system 130 may have a storage 131 and a processor 132, if necessary.

4.2 Operation

The laser apparatus 120 may receive target data Dt (which may be a target wavelength $\lambda t$, a target pulse energy Et, or the like, for instance) from the exposure controller 310. The laser apparatus 120 may transmit the target wavelength $\lambda t$ and the target pulse energy Et to the wavelength controller 100 and the energy controller 90, respectively.

The energy controller 90 may control energy of outputted pulse laser beams L. The energy controller 90 may set a charge voltage V to the charger 90 so that pulse energy E of outputted pulse laser beams L becomes the target pulse energy Et.

The wavelength controller 100 may control a wavelength of outputted pulse laser beams L by adjusting an installation angle of the prism 12 using the wavelength adjuster 110 so that a wavelength of outputted pulse laser beams L becomes the target wavelength $\lambda t$.

The timer 123 may measure luminescence trigger intervals T. The clock 124 may measure a current time. When the laser controller 120 receives the luminescence trigger signal Str from the exposure controller 310, the laser controller 120 may transmit a luminescence trigger interval T measured by the timer 123 and a current time measured by the clock 124 to the data collection processing system 130, and cause the data collection processing system 130 to store the received luminescence trigger interval T and the received current time. Then, the laser controller 120 may transmit the received luminescence trigger signal Str to the energy controller 90. Furthermore, when the laser controller 120 receives the luminescence trigger signal Str, the laser controller 120 may reset and restart the measurement of luminescence trigger intervals T. The energy controller 90 may receive the luminescence trigger signal Str, and transmit a signal to the switch 71 in the PPM 70. By tuning on the switch 71, pulse discharge may occur between the electrodes 23 and 24.

The laser gas in the laser chamber 20 may be excited by discharge based on the high voltage set in the charger 80. When discharge occurs in an excimer laser gas, the excimer laser gas may be excited, laser oscillation may occur between the OC (MO-OC) 30 and the LNM 10, and a pulse laser beam L with a narrowed spectrum width may be outputted through the OC 30.

In this way, the pulse laser beams L may be outputted through the OC 30. A part of the outputted pulse laser beam L may be reflected by the beam splitter 41, and enter the pulse energy detector 50 and the spectrum detector 60. A transmitted light of the pulse laser beam L having been passed through the beam splitter 41 may enter the exposure apparatus 300.

The pulse laser beam L reflected by the beam splitter 42 may enter the pulse energy detector 50, and enter the optical sensor 52 through the collector lens 51.

The pulse energy detector 50 may detect pulse energy E of the pulse laser beam L outputted through the OC 30, and transmit a pulse energy value E to the energy controller 90. The pulse energy detector 50 may transmit, to the energy controller 90 and the wavelength controller 100, a luminescence detection signal Sed indicating that the pulse laser beam L is outputted.

A transmitted light of the pulse laser beam L having been passed through the beam splitter 42 may enter the spectrum detector 60.

The pulse laser beam L entered to the spectrum detector 60 may be diffused by passing through the diffuser plate 61. The diffused pulse laser beam L may pass through the monitor etalon 62 (for instance, an etalon of an air gap), and form a circular fringe pattern on a focal plane of the collector lens 63. On the focal plane of the collector lens 63, the image sensor 64 may be located. The spectrum detector 60 may detect the formed fringe pattern using the image sensor 64. The spectrum detector 60 may transmit data of the fringe pattern to the wavelength controller 100.

The wavelength controller 100 may calculate a spectrum waveform from the data of the fringe pattern transmitted from the spectrum detector 60, and acquire wavelength control related data $D\lambda c$ from the calculated spectrum waveform by an additional calculation. As the wavelength control related data $D\lambda c$, a wavelength $\lambda$ of the pulse laser beam L may be calculated from a center of balance of the spectrum waveform, or a spectrum width $\Delta\lambda$ may be calculated from a FWHM (full width at half maximum) of the spectrum waveform, for instance.

The wavelength controller 100 may transmit the wavelength control related data $D\lambda c$ (for instance, the target wavelength $\lambda t$, the oscillation wavelength $\lambda$, the spectrum width $\Delta\lambda$, or the like) to the data collection processing system 130 via the laser controller 120, and cause the data collection processing system 130 to store the wavelength control related data $D\lambda c$ in the storage 131. The wavelength controller 100 may calculate a difference $\delta\lambda$ ($=\lambda-\lambda t$) between the target wavelength $\lambda t$ and the wavelength $\lambda$ of the pulse laser beam L, and execute a feedback control of the wavelength via the wavelength adjuster 110 before a next pulse laser oscillation so that an absolute value of the difference $\delta\lambda$ becomes smaller.

The energy controller 90 may transmit energy control related data Dec (for instance, the target energy Et, the measured pulse energy E, the charge voltage V) to the data collection processing system 130 via the laser controller 120, and cause the data collection processing system 130 to store the energy control related data Dec in the storage 131.

The energy controller 90 may calculate a difference $\Delta E$ between the target pulse energy Et and the pulse energy E received from the pulse energy detector 50, set the charge voltage V to the charger 90 so that the pulse energy E changes by the difference $\Delta E$, and execute a feedback control of the pulse energy.

The above-described series of controls after the laser controller 120 receives the target data Dt from the exposure apparatus 300 may be executed for every input of the luminescence trigger signal Str from the exposure apparatus to the laser controller 120.

A set of the control data of these various kinds of items may be referred to as a control data set. That is, the wavelength control related data $D\lambda c$, the energy control related data Dec, the items included therein (the target wavelength $\lambda t$, the oscillation wavelength $\lambda$, or the like), and data thereof may be included in the control data set, for instance.

The laser controller 120 may transmit the acquired various data to the data collection processing system 130 for every reception of the luminescence trigger signal Str from the exposure apparatus 300, and cause the data collection processing system 130 to store the various data in the storage 131.

4.3 Flow of Data Collection

Figure 5:
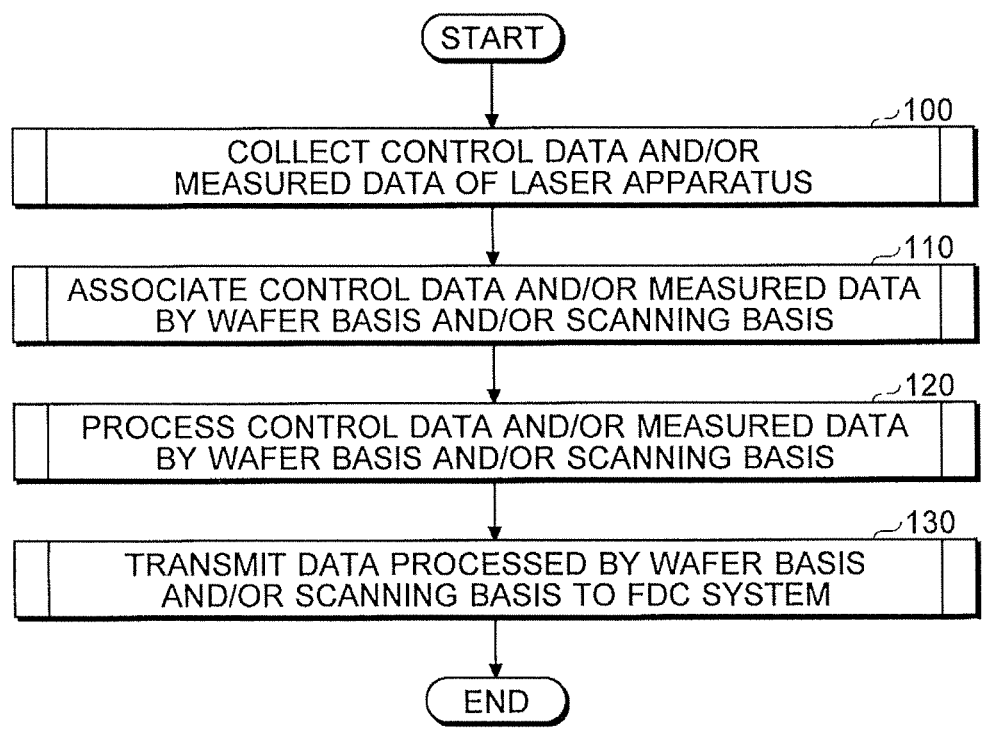
FIG. 5 is a flowchart showing an example of a process flow for collecting data related to the laser apparatus.

FIG. 5 is a flowchart showing an example of a process flow for collecting data related to the laser apparatus. In FIG. 5, as the above-described structural elements, the same reference numbers will be applied, and the redundant explanation thereof will be omitted.

In FIG. 5, in step S100, control data and/or measured data of the laser apparatus 200 may be collected. In the collection of the measured data and/or the control data, processes shown in FIG. 4 may be executed.

In step S110, acquired laser light data or an acquired laser light data set of pulse laser beams L is associated with data indicating which wafer and which scanning. A detail of this process will be described later on.

In step S120, the control data and/or the measured data are processed for every wafer and/or every scanning. This process may be a process for data reduction such as a process of averaging the various data for every wafer and/or every scanning by every wafer and/or every scanning, or a process of calculating a Gaussian distribution thereof. A detail of this process will be described later on.

In step S130, data Dpw/Dps processed by every wafer and/or every scanning may be transmitted to the FDC system 400, and the operation will be finished. Thereby, the FDC system 400 can execute a data analysis for every wafer and/or every scanning. A detail of this process will be described later on.

4.3.1 Flow of Collecting Measured Data of Laser Apparatus

Figure 6:
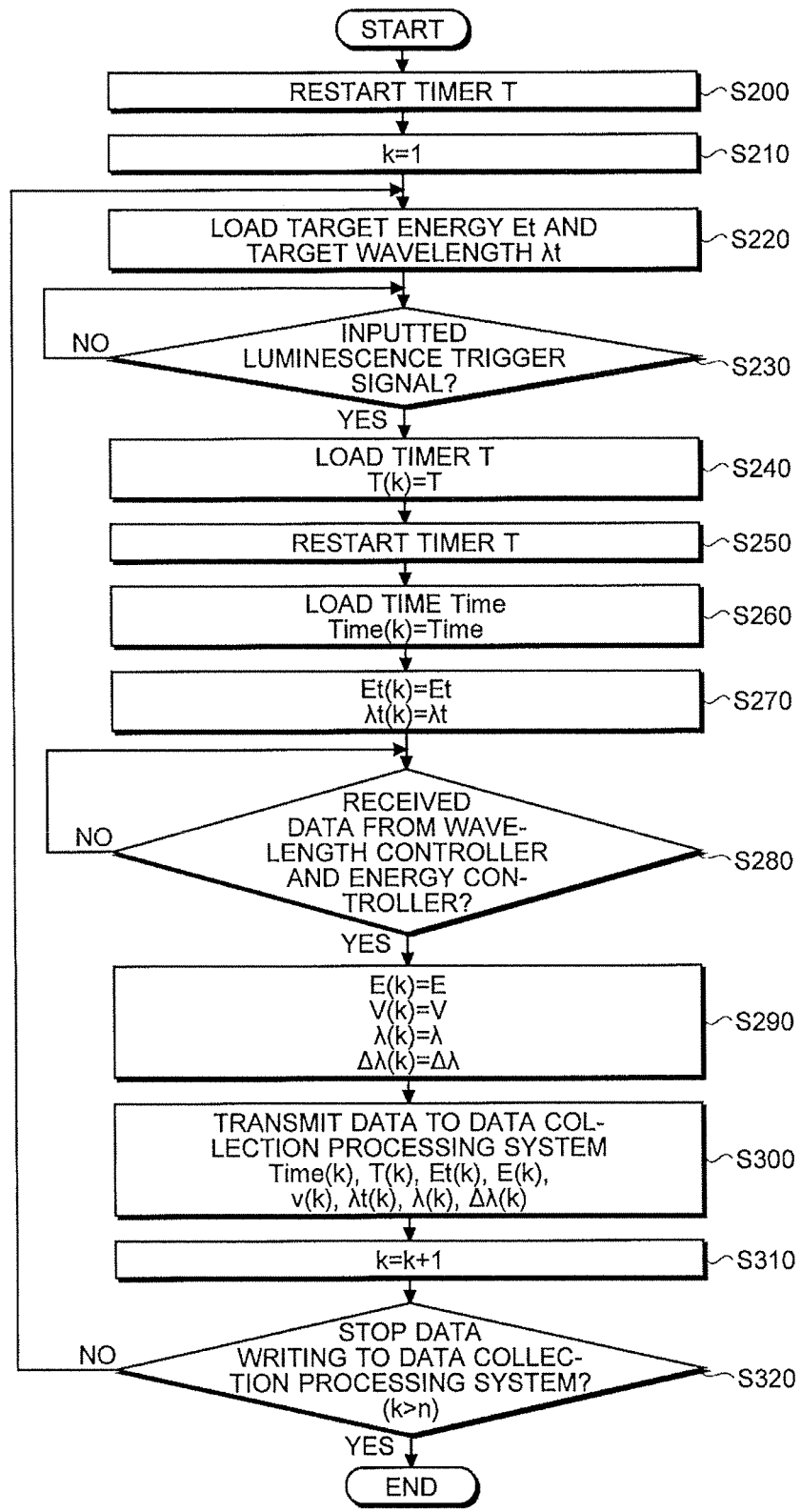
FIG. 6 is a flowchart showing an example of a flow for collecting measured data of the laser apparatus according to the embodiment of the disclosure.

FIG. 6 is a flowchart showing an example of a flow for collecting measured data of the laser apparatus 200 according to the embodiment of the disclosure. In FIG. 6, as the above-described structural elements, the same reference numbers will be applied, and the redundant explanation thereof will be omitted. The flow shown in FIG. 6 is a flow to be executed by the laser controller 120.

In step S200, the timer 123 of the laser controller 120 may be restarted. That is, a time of the timer 123 may reset as zero, and a time measurement by the timer 123 may be started. The timer 123 may measure a time by a nanosecond unit.

In step S210, a pulse number k may be set as 1.

In step S220, a target energy Et and a target wavelength $\lambda t$ transmitted from the exposure controller 310 of the exposure apparatus 300 to the laser controller 120 may be loaded.

In step S230, the laser controller 120 may determine whether a luminescence trigger signal Str is inputted from the exposure controller 310 of the exposure apparatus 300 or not, i.e., whether the laser controller 120 receives the luminescence trigger signal Str or not. In step S230, when the luminescence trigger signal Str is inputted, the laser controller 120 may progress to step S240, and when the luminescence trigger signal Str is not inputted, the laser controller 120 may wait the luminescence trigger signal Str by repeating step S230.

In step S240, a time of the timer 123 at the pulse number k=1 may be obtained.

In step S250, a value of the timer 123 may be reset. That is, the timer 123 is reset, and a new time measurement may be started.

In step S260, a time Time at the pulse number k=1 may be obtained from the clock 124. The time Time may be measured by a time unit about 0.001 to 0.1 second, for instance.

In step S270, the target energy Et and the target wavelength $\lambda t$ at the pulse number k=1 of the outputted pulse laser beam L may be stored.

In step S280, the laser controller 120 may determine whether data are received from the wavelength controller 100 and the energy controller 90 or not. In step S280, when the laser controller 120 has been received the data from the wavelength controller 100 and the energy controller 90, the laser controller 120 may progress to step S290. On the other hand, when the laser controller 120 does not receive the data, the laser controller 120 may wait the data from the wavelength controller 100 and the energy controller 90 by repeating the process of step S280.

In step S290, a measured value of pulse energy E, the charge voltage V, a measured value of oscillation wavelength $\lambda$ and a measured value of spectrum width $\Delta\lambda$ at the pulse number k=1 may be stored.

In step S300, the laser controller 120 may transmit data to the data collection processing system 130. For example, as described above, a time Time(1), a timer value T(1), a target energy Et(1), a charge voltage V(1), a target wavelength $\lambda t(1)$ and a spectrum width $\Delta\lambda(1)$ may be transmitted. These data are simple examples, and various kinds of measured values and control values of the pulse laser beam L can be transmitted.

The data collection processing system 130 may store the received measured data and the received control data in the storage 131. These data can also be stored by the processor 132.

In step S310, the pulse number k may be incremented by 1 (k=k+1). Accordingly, at this time, the pulse number k becomes 2 (=1+1).

In step S320, the laser controller 120 may determine whether entries of the data to the data collection processing system 130 should be stopped or not. This is a process of determining whether the number of pulse laser beams L outputted from the laser apparatus 200 reaches a total pulse number in a single driving of the exposure apparatus 300, and when the number of the outputted pulse laser beams L does not reach the total pulse number for stopping operation of the exposure apparatus 300, the laser controller 120 may return to step S220 of the process flow, and repeat the process flow. Then, at the pulse number k=2, the same process flow may be executed, and after that, the same process flow may be repeated till the pulse number k=n.

In step S320, if the pulse number k becomes over n (k>n), the process flow may be finished.

FIG. 7 is a diagram showing an example of a table of data stored in the data collection processing system 130. As shown in FIG. 7, with respect to the pulse number (k=#1 to #n), a time Time(k), a trigger interval T(k), pulse energy control related data Dec (target pulse energy Et(k), measured pulse energy E(k), charge voltage V(k) set in the charger), wavelength control related data D$\lambda$c (target wavelength $\lambda t(k)$, measured wavelength $\lambda(k)$, measured spectrum width $\Delta\lambda(k)$), or the like, may be stored in the storage 131 of the data collection processing system 130.

The example shown in FIG. 7 is a simple example, and various kinds of data can be stored based on a usage.

Figure 8:
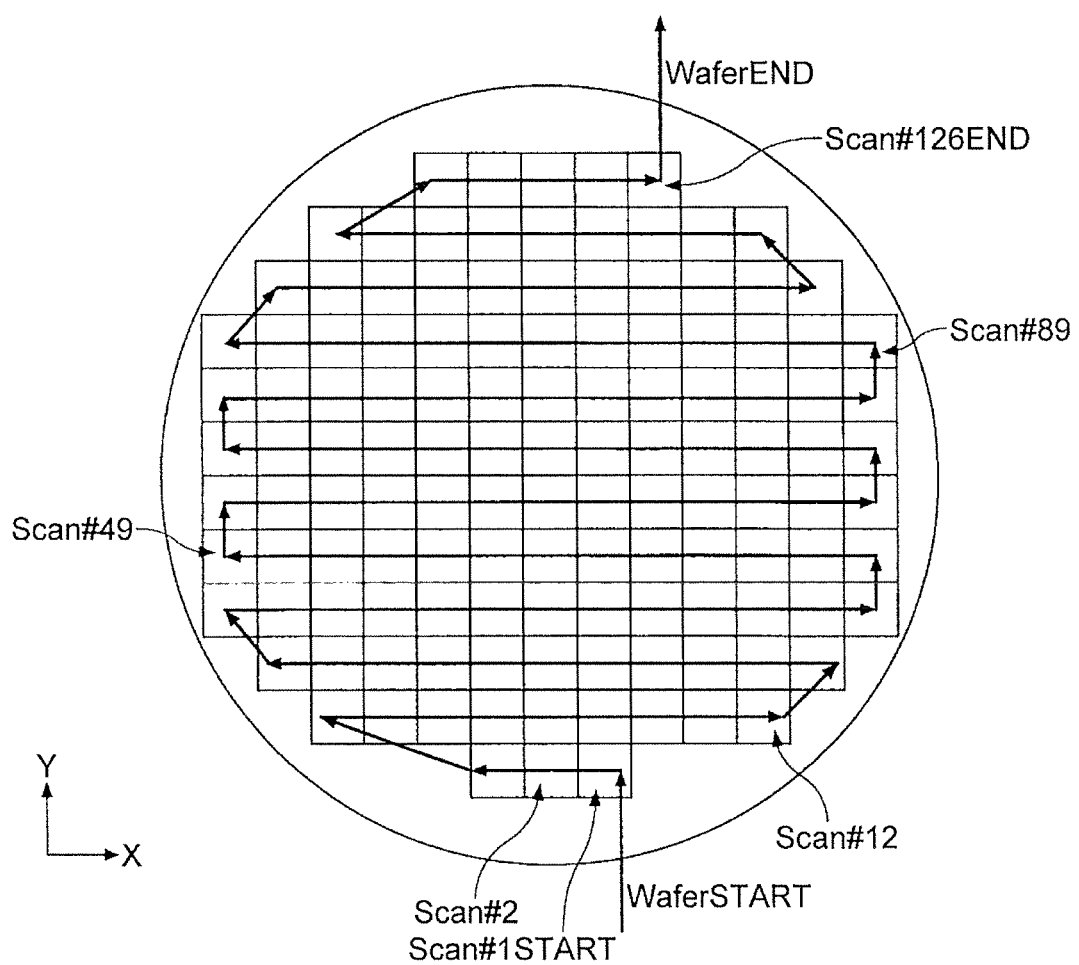
FIG. 8 is a diagram showing an example of an exposure pattern on a wafer.

4.3.2 Flow of Associating Measured Data with Recognition by Each Wafer and Each Scanning FIG. 8 is a diagram showing an example of an exposure pattern on a wafer. In FIG. 8, the entire exposure area of a wafer is divided into a plurality of small rectangular areas. Each rectangular area may be an area to which a scanning exposure is conducted by one series of continuous outputs of pulse laser beams L. That is, by scanning a specific divided rectangular area by the pulse laser beam L once, an exposure of the scanned area may be finished. Then, by moving a stage by a step and scanning a next rectangular area by a pulse laser beam L, a second scanning exposure may be finished. After the entire exposure area of the wafer is finished by repeating such scanning exposure, an exposure of the wafer may be finished.

For example, the scanning exposure and the step movement may be repeated in order of WAFER START, SCAN#1, SCAN#2, . . . SCAN#126, WAFER END as shown by arrows in FIG. 8.

Here, a range of trigger interval T of exposures for step movement of the stage between a scanning exposure and a next scanning exposure may be the following range.

Trigger interval Tx of exposure resting by step movement of wafer in direction of X axis: 0.07 second≤Tx<0.09 second Trigger interval Tx of exposure resting by step movement of wafer in direction of Y axis: 0.09 second≤Ty<0.3 second Trigger interval Tw of exposure resting based on starting or ending of exposure of a single wafer: 0.3 second≤Tw According to such examples, it is possible to recognize a starting or an ending of exposure of each wafer and pulses of each scanning exposure from the trigger interval T of exposure resting.

Here, the range of the trigger interval of exposure resting may correspond to the trigger interval shown in FIG. 2. That is, in FIG. 2, at a starting As or an ending Ae of wafer exposures WAFER# and WAFER#2, a trigger interval Tw may be longest. On the other hand, although the trigger intervals Tx and Ty of the scanning exposures SCAN#1 and SCAN#2 in the same wafer are shorter than the trigger interval Tw at the time of starting or ending of the wafer exposure, they may be longer than a trigger interval (for instance, around 166.7 microseconds) in the scanning exposure.

4.3.2.1 First Embodiment

Figure 9:
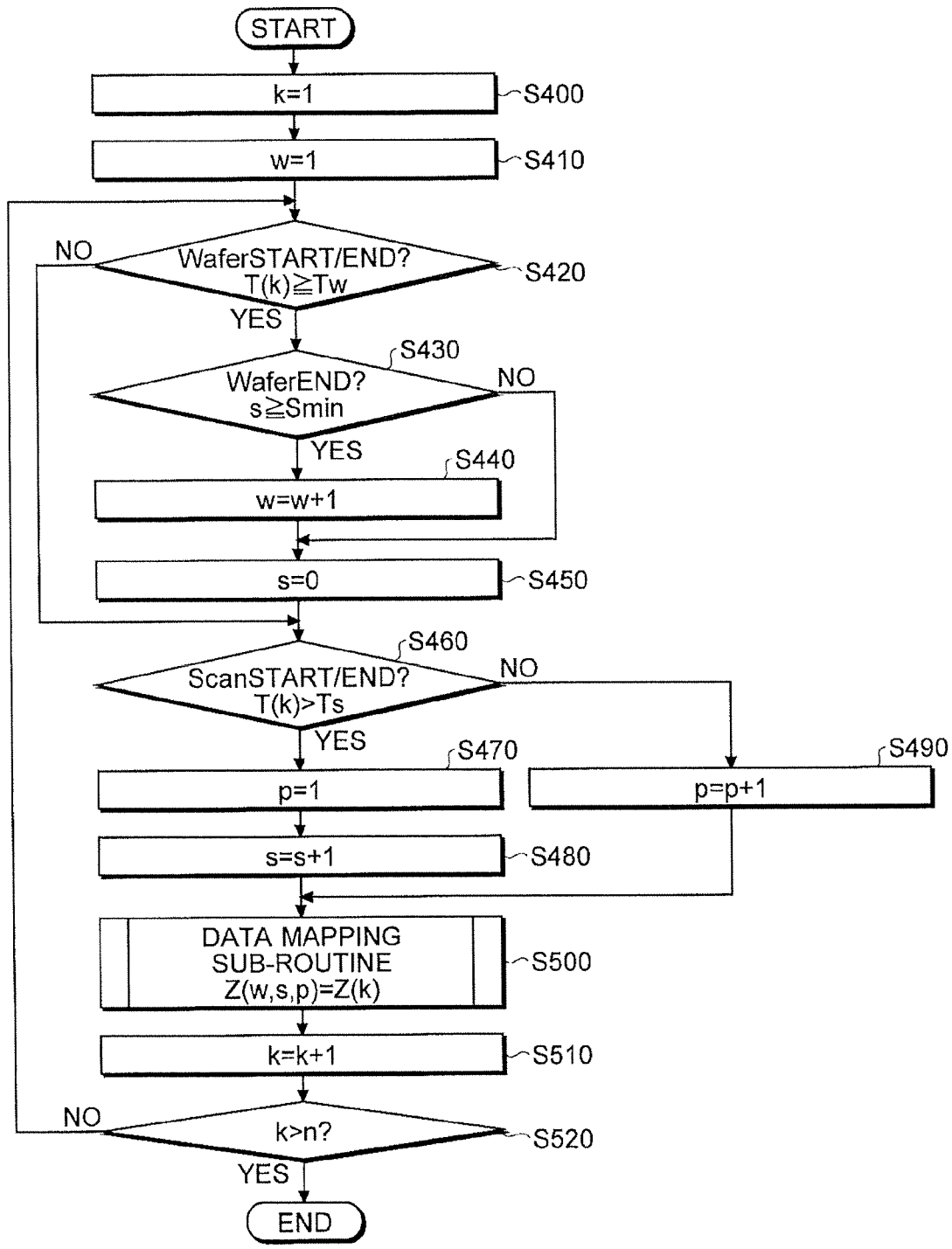
FIG. 9 is a flowchart showing an example of a mapping process of the laser apparatus and a data processing method according to a first embodiment of the disclosure.

FIG. 9 is a flowchart showing an example of a mapping process of the laser apparatus and a data processing method according to a first embodiment of the disclosure. The process flow shows a detail of the process flow shown in step S110 of FIG. 5. Furthermore, although the process flow shows a process fundamentally executed on the data collection processing system 130, the laser controller 120 can also execute the process flow because the laser controller 120 has the storage 121 and the processor 122 as the data collection processing system 130.

In step S400, the pulse number k of a pulse laser beam L being a target of the mapping process may be set as 1. Here, because the pulse number k is the same as the pulse number k explained with FIG. 6, a common character k is used. Furthermore, because each pulse is associated with a pulse laser beam L one by one, a mapping process for each pulse means a mapping process for each pulse laser beam L. In the following, a target of a mapping process may be simply referred to as a pulse instead of a pulse laser beam L.

In step S410, a number w of a wafer being a target of the mapping process (hereinafter referred to as a target wafer) may be set as 1. In the following, a number of a target wafer may be represented by w.

In step S420, the data collection processing system 130 may determine whether a pulse being a target of the mapping process (hereinafter referred to as a target pulse) is a start pulse or an end pulse (hereinafter described as a starting/ending pulse) of a wafer exposure or not. Specifically, when a threshold of resting trigger intervals at the time of starting/ending of a wafer exposure is defined as Tw, the data collection processing system 130 may determine whether T(k) is equal to or greater than Tw or not (Tw≤T(k)?).

For example, according to the above-described example, the threshold Tw may be 0.3 second. Because the trigger interval of starting/ending of a wafer exposure is different by each exposure apparatus 300, it is possible to assign the threshold Tw by measuring a trigger interval previously.

In step S420, when it is determined that the trigger interval T(k) of the pulse number k, i.e., an interval between a (k−1)-th pulse and a k-th pulse, is equal to or greater than the threshold Tw and the pulse of the pulse number k corresponds to a starting/ending pulse of a wafer exposure, the data collection processing system 130 may progress to step S430. On the other hand, when it is determined that the trigger interval T(k) of the pulse number k is smaller than the threshold Tw and the pulse of the pulse number k does not correspond to a starting/ending pulse of a wafer exposure, the data collection processing system 130 may progress to step S460.

In step S430, the data collection processing system 130 may determine whether the k-th pulse is an ending pulse of the wafer exposure or not. Specifically, when a scan number in the same wafer is defined as s and the minimum number of scanning exposures for a single wafer is defined as Smin, the data collection processing system 130 may determine whether the scan number s is equal to or greater than the minimum number Smin or not (Smin≤s?). For example, the minimum number Smin of scanning exposures may be set to around 50 to 100. It is possible to define a minimum number of scanning capable of exposing the entire exposure area of a single wafer as the minimum number Smin depending on a size of the exposure apparatus 300 or a wafer. When the condition of Smin≤s is satisfied, a k-th pulse may be an ending pulse of a wafer exposure.

In step S430, when the scan number s is equal to or greater the minimum number Smin, the data collection processing system 130 may progress to step S440, and when the scan number s is smaller than the minimum number Smin, the data collection processing system 130 may progress to step S450.

In step S440, the wafer number w may be incremented by 1 (w=w+1).

In step S450, the scan number s may be reset as 0 (S=0).

In step S460, the data collection processing system 130 may determine whether the k-th pulse is a starting/ending pulse of the scanning exposure or not. Specifically, when a threshold of a trigger interval at the time of starting/ending of the scanning exposure is defined as Ts, the data collection processing system 130 may determine whether a trigger interval T(k) of the k-th pulse satisfies a condition of T(k)>Ts or not. Here, Ts means Tx or Ty explained with FIG. 8, and when the trigger interval T(k) is greater than a smaller one of the Tx and Ty, it can be considered that the condition is satisfied. For example, according to the example shown in FIG. 8, Ts may be defined as 0.07 second (which is a minimum condition of Tx). Because the trigger interval of starting/ending of a scanning exposure is different depending on the exposure apparatus 300, it is possible to assign Ts by measuring a trigger interval between scanning exposures previously.

In step S460, when the condition of T(k)>Ts is satisfied, the data collection processing system 130 may progress to step S470, and when T(k) is equal to or smaller than Ts, the data collection processing system 130 may progress to step S490.

In step S470, when p is defined as the pulse number in the scanning exposure, p is set as 1. That is, in step S460, because the k-th pulse is determined as the starting/ending pulse of the scanning exposure, the pulse number p is defined as 1 so that the pulse number p indicates an initial pulse.

In step S480, the scan number s may be incremented by 1 (s=s+1).

On the other hand, in step S460, when the k-th pulse is determined that it is not the starting/ending pulse of the scanning exposure, the data collection processing system 130 may progress to step S490, and increment the pulse number p by 1 (p=p+1).

In step S500, a sub-routine Z(k)=Z(w,s,p) of data mapping may be executed. Specifically, data of each pulse is associated with data of each wafer, each scanning and each pulse in each scanning. That is, a total pulse number during driving of the exposure apparatus 300 may be associated with data indicating which pulse of which wafer and which scanning. Here, Z may be various kinds of parameters, and it may include the time Time, the trigger interval T, the target energy Et, the measured value of pulse energy E, the target wavelength $\lambda t$, the measured value of oscillation wavelength $\lambda$, the measured value of spectrum width $\Delta\lambda$, or the like.

In step S510, by incrementing the pulse number k by 1, a next pulse is assigned as a target of the mapping process.

In step S520, the data collection processing system 130 may determine whether the k-th pulse assigned as the target of the mapping process exceeds a total pulse number n being targets of the mapping process, i.e., n<k, or not. When the k-th pulse exceeds the total pulse number n, because the mapping process has been executed with respect the total pulse being the targets of the mapping process, the process flow may be finished. On the other hand, when the k-th pulse does not exceed the total pulse number n, because there is an actual pulse or a possible pulse being a target of the mapping process, the data collection processing system 130 may return to step S420, and repeat the process flow.

In this way, by executing the mapping process of collected data of pulse laser beams L, every data can be associated with in terms of a wafer, a scanning and a pulse in each scanning, whereby a process analysis can be executed associating with a result of an actual wafer exposure.

4.3.2.2 Second Embodiment

Figure 10:
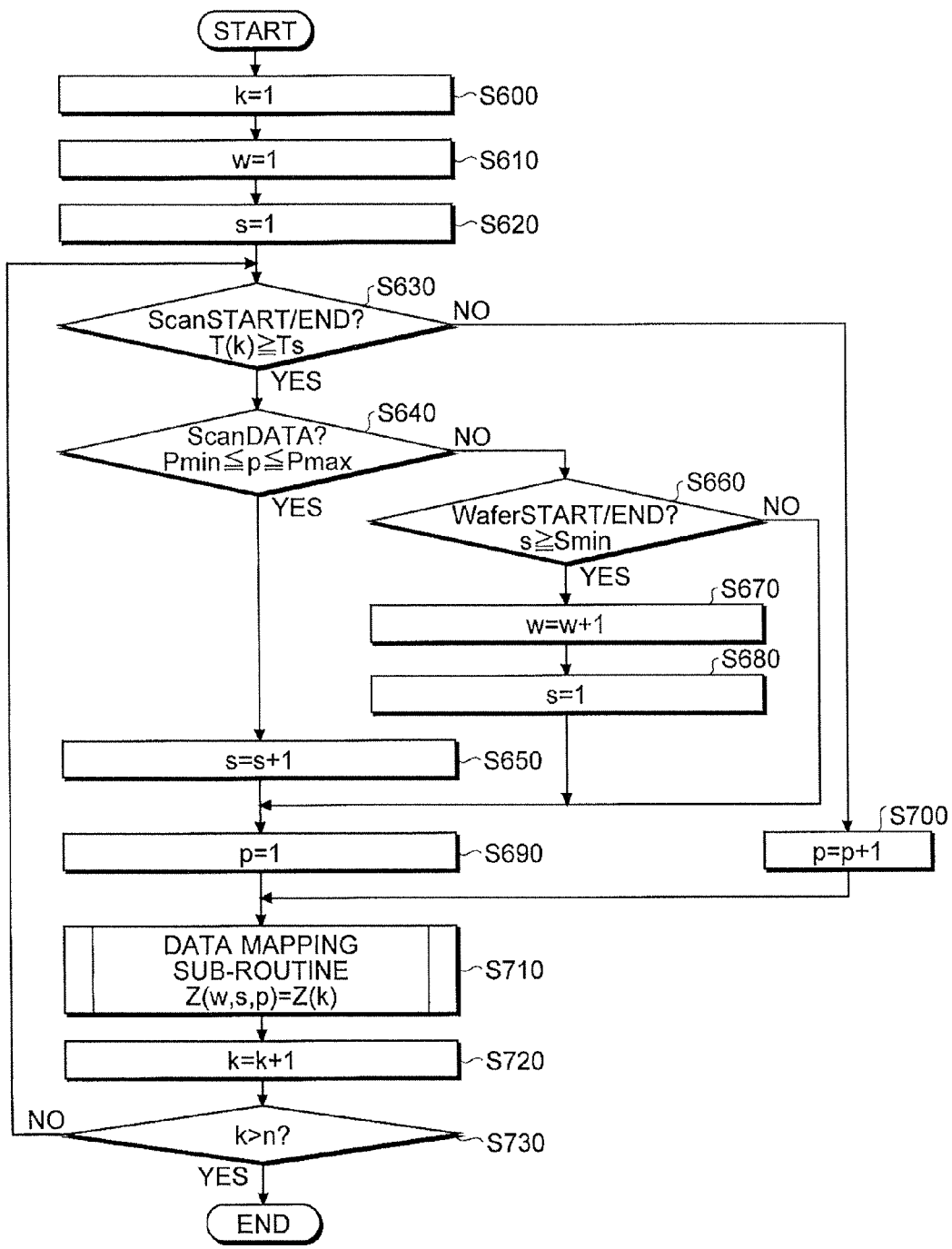
FIG. 10 is a flowchart showing an example of a mapping process of the laser apparatus and a data processing method according to a second embodiment of the disclosure.

FIG. 10 is a flowchart showing an example of a mapping process of the laser apparatus and a data processing method according to a second embodiment of the disclosure. The process flow shows, as the first embodiment, a detail of the process flow shown in step S110 of FIG. 5. Furthermore, although the process flow shows a process fundamentally executed on the data collection processing system 130, the laser controller 120 can also execute the process flow. In FIG. 5, as the above-described structural elements, functions, variables and constants, the same reference numbers will be applied, and the redundant explanation thereof will be omitted.

In the mapping process in the laser apparatus and the data processing method according to the second embodiment, as exampled in FIG. 2, a mapping process which can be applied to a case where an adjustment oscillation is conducted before an wafer exposure will be explained.

In step S600, a pulse number k of a target pulse of the mapping process may be initialized as 1 (k=1).

In step S610, a wafer number w of a target wafer of the mapping process may be initialized as 1 (w=1).

In step S620, a number s of an scanning exposure with respect to the target wafer may be initialized as 1 (s=1).

In step S630, the data collection processing system 130 may determine whether a pulse laser beam L with the pulse number k is a starting/ending pulse in the scanning exposure or not. Specifically, the data collection processing system 130 may determine whether a trigger interval T(k) with the pulse number k, i.e., a pulse interval between a (k−1)-th pulse and a k-th pulse, is equal to or greater than a threshold Ts indicating a minimum trigger interval for scanning or not (Ts≤T(k)?). Because a detail of the process in step S630 may be the same as the process of step S460 in FIG. 9 in the first embodiment, the explanations thereof will be omitted.

In step S630, when the data collection processing system 130 determines that T(k) is equal to or greater than Ts (Ts≤T(k)) and the pulse laser beam L is the starting/ending pulse in the scanning exposure, the data collection processing system 130 may progress to step S640, and when the data collection processing system 130 determines that T(k) is smaller than Ts (Ts>T(k)) and the pulse laser beam L is not the starting/ending pulse in the scanning exposure, the data collection processing system 130 may progress to step S700

In step S640, when a minimum value of the pulse number per scanning is defined as Pmin and a maximum value of the pulse number per scanning is defined as Pmax, the data collection processing system 130 may determine whether the number p of pulse data per scanning is with a range of Pmin≤p≤Pmax. Based on a result of the determination, it is possible to determine whether the scanning exposure is an exposure for a wafer or not. This is a determination whether the wafer exposure is currently conducting or not based on the pulse number because the pulse number per scanning in each wafer exposure is approximately constant.

In step S640, when the data collection processing system 130 determines that the k-th pulse is a pulse in the scanning exposure, the data collection processing system 130 may progress to step S650, and when the data collection processing system 130 determines that the k-th pulse is not the pulse in the scanning exposure, the data collection processing system 130 may progress to step S660.

In step S650, the number s of the scanning exposure may be incremented by 1.

On the other hand, in step S660, the data collection processing system 130 may determine whether the pulse laser beam L is a starting/ending pulse in the wafer exposure or a pulse for adjustment oscillation. Specifically, the data collection processing system 130 may determine whether the scanning number s is equal to or greater than the minimum scanning number Smin for exposing a single wafer or not, i.e., the condition of Smin≤s is satisfied or not.

In step S660, when the data collection processing system 130 determines that the scanning number s is equal to or greater than the minimum scanning number Smin for exposing a single wafer, the data collection processing system 130 may progress to step S670, and increment the wafer number w by 1 (w=w+1). Then, the data collection processing system 130 may progress to step S680, and reset the scanning number s as 1 (s=1).

On the other hand, when the data collection processing system 130 determines that the scanning number s is smaller than the minimum scanning number Smin in step S660, because the scanning number s is smaller than the minimum scanning number Smin necessary for exposing a single wafer, the data collection processing system 130 determines as the adjustment oscillation, and progress to step S690 without incrementing the wafer number w.

In step S690, the pulse number p may be initialized as 1 (p=1).

On the other hand, in step S630, when the data collection processing system 130 determines that the pulse laser beam L is not associated with the starting/ending pulse of the scanning exposure, the data collection processing system 130 may progress to step S700, increment the pulse number p by 1 (p=p+1), and progress to step S710.

In step S710, by executing a data mapping sub-routine, data of the pulse laser beam L may be associated with Z(k)=Z(w,s,p). Thereby, the pulse number k can be associated with the information on which pulse number, what scanning order, and which wafer number it corresponds to, by which the pulse number k can be specified. Here, because step S710 is the same as step S500 in the first embodiment shown in FIG. 9, the detailed explanation thereof will be omitted.

In step S720, the pulse number k may be incremented by 1 (k=k+1).

In step S730, the data collection processing system 130 may determine whether the pulse number k exceeds the total pulse number n obtained by driving of the exposure apparatus 300 or not. When the pulse number k is greater than the total pulse number n (n<k), because it indicates a completion of the mapping process with respect to every pulse, the data collection processing system 130 may finish the process flow. On the other hand, when the pulse number k is equal to or smaller than the total pulse number n (k≤n), because it indicates that there is an actual pulse or a possible pulse being a target of the mapping process, the data collection processing system 130 may return to step S630, and repeat the process flow.

According to the laser apparatus and the data processing method according to the second embodiment, when the adjustment oscillation is executed before an wafer exposure, it is possible to execute mapping of the pulse laser beams L based on the pulse number per scanning.

Figure 11:
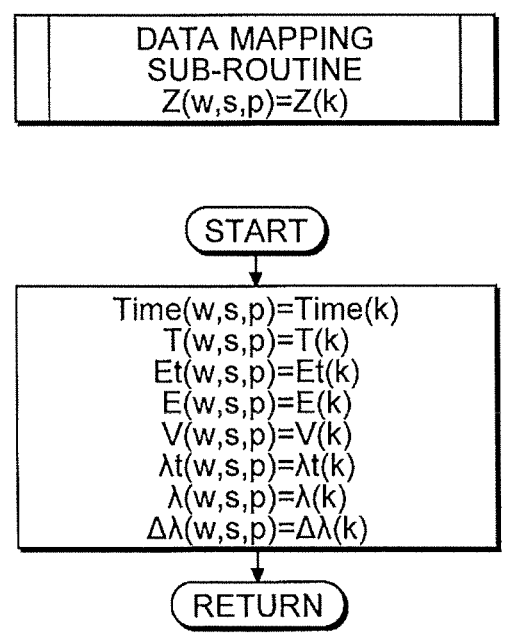
FIG. 11 is a flowchart for explaining the data mapping sub-routine in step S500 of FIG. 9 in the first embodiment and step S710 of FIG. 10 in the second embodiment.

FIG. 11 is a flowchart for explaining the data mapping sub-routine in step S500 of FIG. 9 in the first embodiment and step S710 of FIG. 10 in the second embodiment.

As shown in FIG. 11, the items of the time Time(k), the trigger interval T(k), the target pulse energy Et(k), the measured value E(k) of pulse energy, the charge voltage V(k), the target wavelength $\lambda t(k)$, the measured value $\lambda(k)$ of wavelength and measured value $\Delta\lambda(k)$ of spectrum width may be associated with the wafer number w, the scanning number s and the pulse number p in the scanning, and a time Time(w,s,p), a trigger interval T(w,s,p), a target pulse energy Et(w,s,p), a measured value E(w,s,p) of pulse energy, a charge voltage V(w,s,p), a target wavelength $\lambda t(w,s,p)$, a measured value $\lambda(w,s,p)$ of wavelength and measured value $\Delta\lambda(w,s,p)$ of spectrum width may be associated with data. In this way, in the data mapping sub-routine, the total pulse number k may be associated with the wafer number w, the scanning number s and the pulse number p in the scanning.

FIG. 12 is a diagram showing an example of data associated by the process flow of FIG. 9 in the first embodiment and the process flow of FIG. 10 in the second embodiment.

As shown in FIG. 12, it can be understood that data of the total pulse number k is replaced with data associated with a scanning number and a pulse number. In this way, by associating the data collected at the pulse number k by each wafer, each scanning and each pulse by the mapping process, the data may be ordered.

4.3.3 Data Processing Flow

Figure 13:
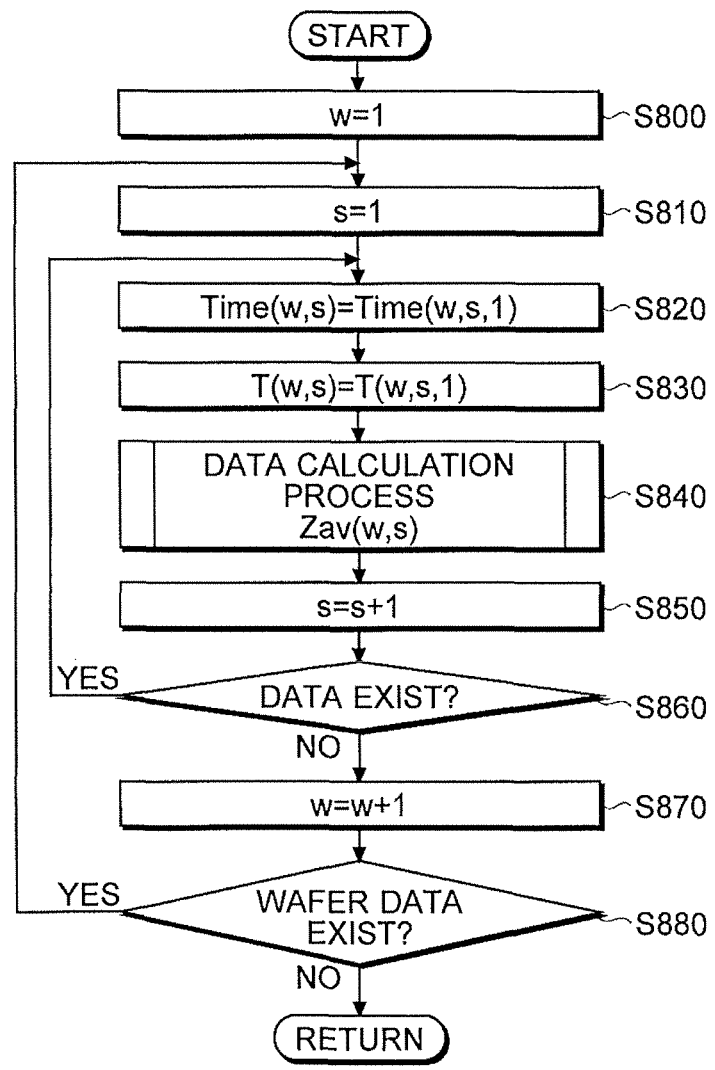
FIG. 13 is a flowchart showing an example of a data process flow for each scanning.

FIG. 13 is a flowchart showing an example of a data process flow for each scanning. The process flow shows a detail of the process of step S120 in FIG. 5.

In step S800, a wafer number w may be initialized as 1 (w=1).

In step S810, a scanning number s may be initialized as 1 (s=1).

In step S820, a time Time(w,s) in an initial pulse of a scanning may be replaced with a time Time(w,s,1) with a pulse number p=1.

In step S830, a trigger interval T(w,s) in the initial pulse of the scanning may be replaced with a trigger interval T(w,s,1) with the pulse number p=1.

In step S840, data may be calculated by each scanning. The calculation may obtain an average value, a standard deviation, a maximum value, a minimum value, or the like, for instance. Here, Zav may be various kinds of parameters. For example, Zav may be an average value Eav of energy, an average value $\lambda$av of wavelength, an average value $\Delta\lambda$av of spectrum width, a standard deviation E$\sigma$ of energy, or a standard deviation $\lambda\sigma$ of wavelength.

In step S850, the scanning number s may be incremented by 1 (s=s+1).

In step S860, the data collection processing system 130 may determine whether scanned data exists or not. In step S860, when the data collection processing system 130 determines that the scanned data exists, the data collection processing system 130 may return to step S820, and with respect to next data, repeat the processes following after step S820. On the other hand, when the data collection processing system 130 determines that the scanned data does not exist, the data collection processing system 130 may progress to step S870.

In step S870, the wafer number w may be incremented by 1 (w=w+1).

In step S880, the data collection processing system 130 may determine whether wafer data exists or not. In step S880, when the data collection processing system 130 determines that the wafer data exists, the data processing system 130 may return to step S810, and with respect to a next wafer, repeat the processes following after step S810. On the other hand, when the data collection processing system 130 determines that the wafer data does not exist, because it means a completion of the total process, the data collection processing system 130 may finish the process flow.

For example, a data processing for each scanning may be executed as above.

Figure 14:
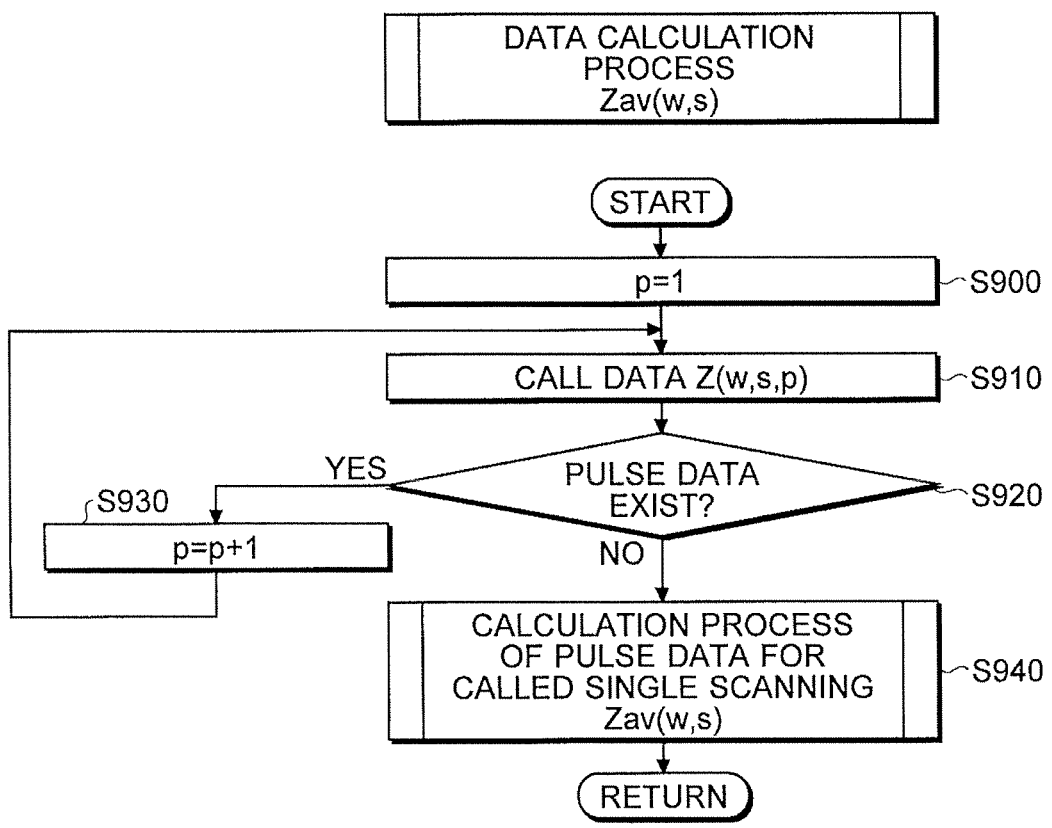
FIG. 14 is a flowchart for explaining details of the data processing for each scanning in step S840 of FIG. 13.

FIG. 14 is a flowchart for explaining details of the data processing for each scanning in step S840 of FIG. 13.

In step S900, the pulse number p may be initialized as 1 (p=1).

In step S910, entire data of ordered Z(w,s,p) may be loaded.

In step S920, the data collection processing system 130 may determine whether pulse data exists or not. When the data collection processing system 130 determines that the pulse data exists, the data collection processing system 130 may increment the pulse number by 1 (p=p+1) via step S930. On the other hand, when the data collection processing system 130 determines that the pulse data does not exist, the data collection processing system 130 may progress to step S940.

In step S940, a calculation process of the loaded pulse data per scanning may be executed. Thereby, data Zav(w,s) per scanning can be acquired.

Figure 15:
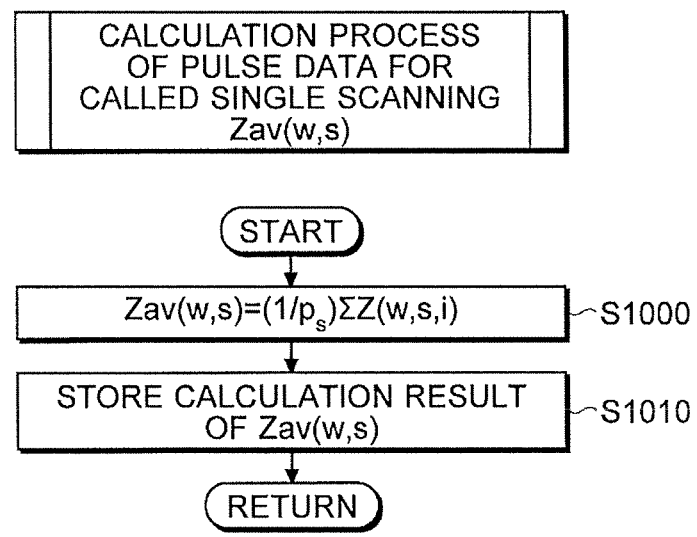
FIG. 15 is a flowchart for explaining details of the calculation process of the pulse data of a single scanning loaded in step S940 of FIG. 14.

FIG. 15 is a flowchart for explaining details of the calculation process of the pulse data of a single scanning loaded in step S940 of FIG. 14.

In step S1000, when the pulse number for each scanning is defined as Ps, the data collection processing system 130 may calculate Zav(w,s)=(1/Ps)$\Sigma$Z(w,s,i).

In step S1010, a calculation result of Zav(w,s) in step S1000 may be stored.

FIG. 16 is a diagram showing a list of process data processed according to the process flow shown in FIG. 13, ordered by each scanning number s stored in the data collection processing system, and associated with the wafer number w.

In FIG. 16, process data of a time Time, an average pulse energy Eav, a standard deviation Eσ, an average charge voltage Vav, an average wavelength λav, a standard deviation λσ of wavelength and an average spectrum width Δλav may be ordered by each scanning number s in each wafer number w. In this way, the process data may be ordered by each scanning in each wafer.

Figure 17:
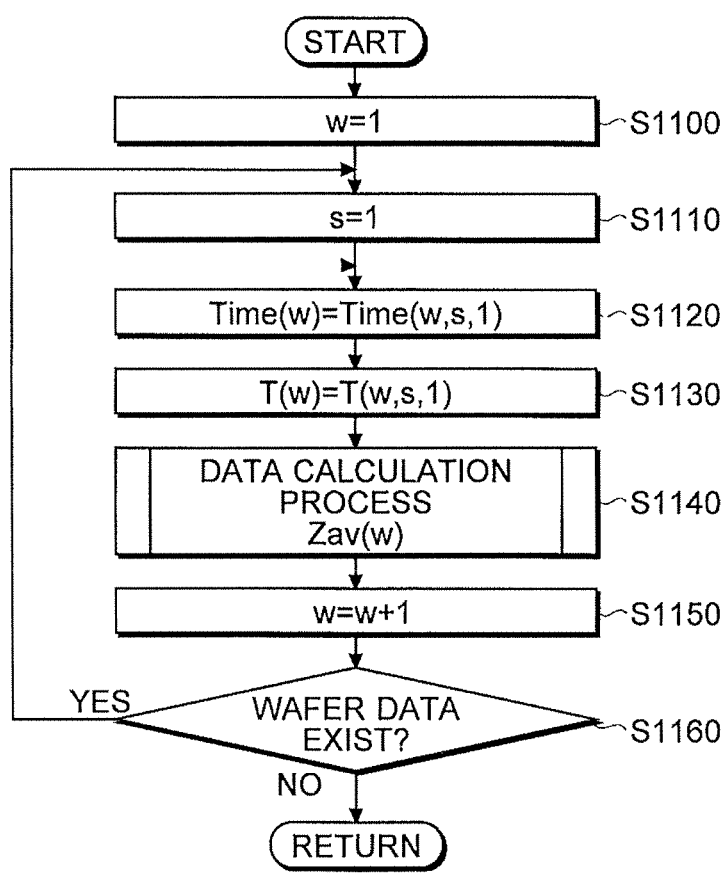
FIG. 17 is a flowchart showing an example of a data process flow for each wafer.

FIG. 17 is a flowchart showing an example of a data process flow for each wafer.

In step S1100, the wafer number w may be initialized as 1 (w=1).

In step S1110, the scanning number s may be initialized as 1 (s=1).

In step S1120, the time Time(w) of an initial pulse in a scanning may be replaced with a time Time(w,s,1) with the pulse number P=1.

In step S1130, the trigger interval T(w) of the initial pulse in the scanning may be replaced with a trigger interval T(w,s,1) with the pulse number p=1.

In step S1140, the data collection processing system 130 may calculate data by each wafer. The calculation process in step S1140 may be executed using process data Dps per scanning as shown in FIG. 16, or may be sequentially executed in order from initially collected process data per pulse, for instance. As the calculation process, a calculation process for obtaining an average value, a standard deviation, a maximum value, a minimum value, or the like, per wafer may be executed. Here, the Zav may be calculated with respect to various kinds of parameters such as an average value Eav of energy, an average value λav of wavelength, an average value Δλav of spectrum width, a standard value Eσ of energy or a standard value λσ of wavelength, for instance.

In step S1150, the wafer number w may be incremented by 1 (w=w+1).

In step S1160, the data collection processing system 130 may determine whether wafer data exists or not. When the data collection processing system 130 determines that the wafer data exists, the data collection processing system 130 may return to step S1110, and execute the process flow following after step S1110 with respect to a next wafer. On the other hand, when the data collection processing system 130 determines that the wafer data does not exist, because it indicates that there is no wafer data, the data collection processing system 130 may finish the process flow.

In this way, after the data processing for each scanning is executed, the data processing for each wafer may be executed.

Figure 18:
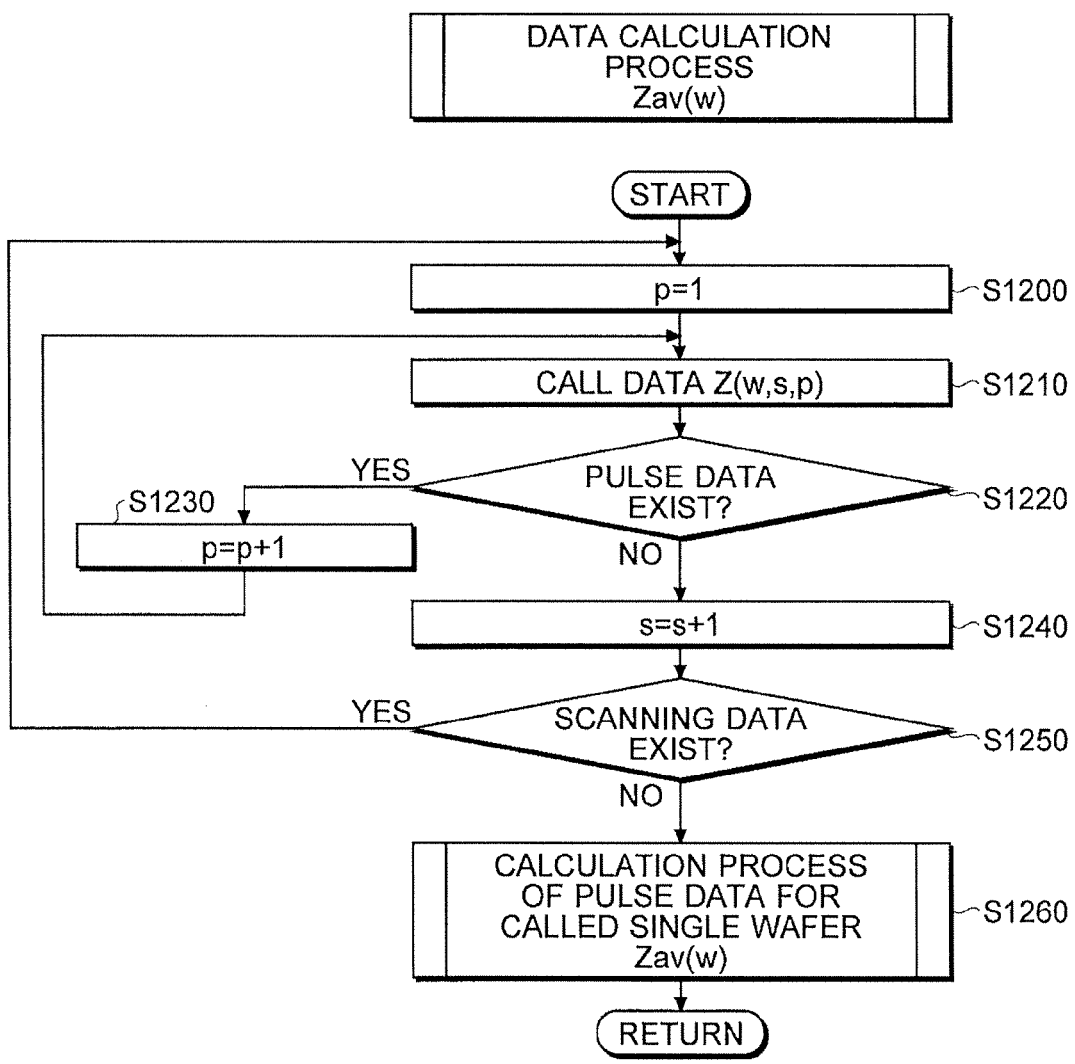
FIG. 18 is a flowchart for explaining details of the calculation process of step S1140 in FIG. 17.

FIG. 18 is a flowchart for explaining details of the calculation process of step S1140 in FIG. 17. In FIG. 18, the calculation process is executed based on the initially collected data per pulse but not based on the data per scanning as shown in FIG. 16.

In step S1200, the pulse number p may be initialized as 1 (p=1).

In step S1210, data of Z(w,s,p) for each wafer may be loaded.

In step S1220, the data collection processing system 130 may determine whether pulse data exists or not. When the data collection processing system 130 determines that the pulse data exists, the data collection processing system 130 may progress to step S1230, and the pulse number p may be incremented by 1 (p=p+1). On the other hand, when the data collection processing system 130 determines that the wafer data does not exist, the data collection processing system 130 may progress to step S1240, and the scanning number s may be incremented by 1 (s=s+1).

In step S1250, the data collection processing system 130 may determine whether the scanning data exists or not. When the data collection processing system 130 determines that the scanning data exists, the data collection processing system 130 may return to step S1200, and repeat the process flow. On the other hand, when the data collection processing system 130 determines that the scanning data does not exist, the data collection processing system 130 may progress to step S1260.

In step S1260, the data collection processing system 130 may execute a calculation process of the loaded pulse data per wafer. Thereby, a calculation result Zav(w) for each wafer may be calculated.

After the execution of step S1260, the data collection processing system 130 may progress to step S1150 in the process flow shown in FIG. 17, and with respect to a next wafer, repeat the processes following after step S1150 of the process flow shown in FIG. 17. Then, in step S1140, the process flow shown in FIG. 18 may be executed.

Figure 19:
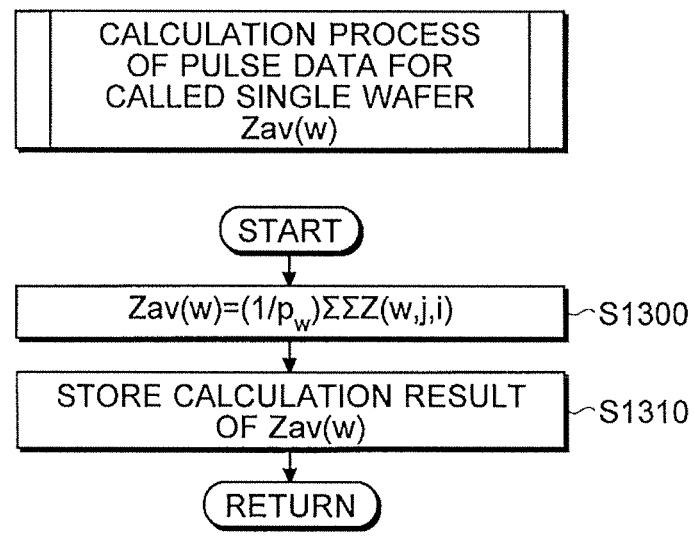
FIG. 19 is a flowchart showing details of the calculation process of the pulse data per wafer in step S1260 of FIG. 18.

FIG. 19 is a flowchart showing details of the calculation process of the pulse data per wafer in step S1260 of FIG. 18.

In step S1300, when the pulse number for each wafer is defined as Pw, the data collection processing system 130 may calculate $Zav(w)=(1/Pw)\Sigma Z(w,j,i)$. Thereby, calculation results of the total pulses for each wafer are summed up and averaged and the Zav(w) for each wafer may be calculated.

In step S1310, the calculation result of the Zav(w) may be stored in the storage 131 of the data collection processing system 130.

After the execution of step S1310, the data collection processing system 130 may return to step S1260, and as described above, further execute the processes following after step S1150 in FIG. 17.

FIG. 20 is a diagram showing a list of wafer numbers stored in the data collection processing system 130 by the execution of the process flow shown in FIG. 17 and process data for each wafer. As shown in FIG. 20, various kinds of data are ordered by each wafer number. In FIG. 20, calculation data of the time Time, the trigger interval T, the average pulse energy Eav, the standard deviation Eσ of pulse energy, the average charge voltage Vav, the average wavelength λav, and the average spectrum width Δλav are exampled.

In this way, as shown in FIG. 20, by the process flows shown in FIGS. 17 to 19, the process data Dpw for each wafer may be ordered.

Figure 21:
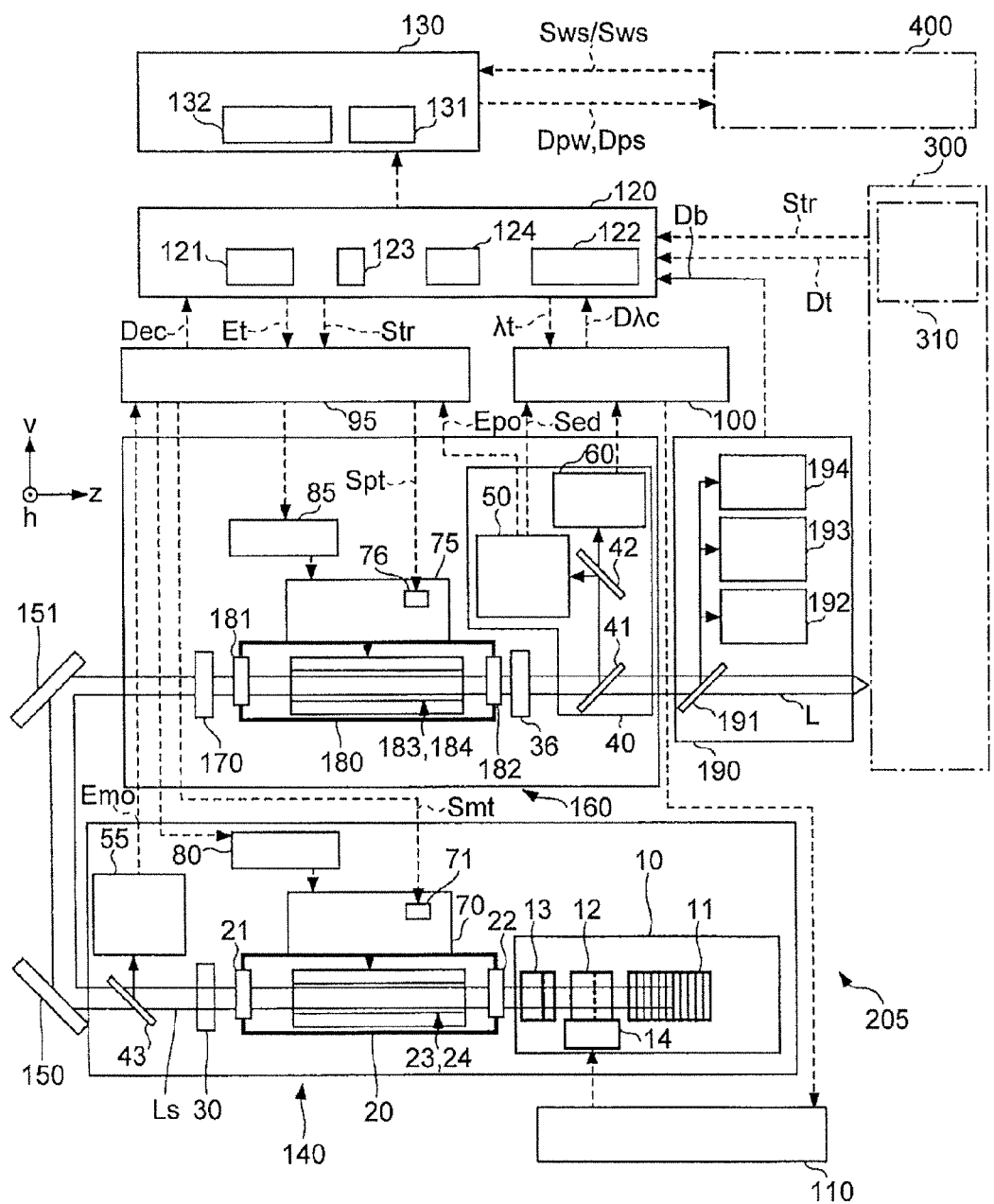
FIG. 21 is a diagram showing an example of a double chamber laser system.

5. Embodiment in Double Chamber Laser System 5.1 Double Chamber Laser System 5.1.1 Structure FIG. 21 is a diagram showing an example of a double chamber laser system. The laser apparatus 205 according to the disclosure can also be constructed by a double chamber system shown in FIG. 21.

The laser apparatus 205 with the double chamber system may include a master oscillator (MO) 140, a power oscillator (PO) 160, a high reflective mirrors 150 and 151, the laser controller 120, a beam detector 190, an energy detector 95, the wavelength controller 100 and the data collection processing system 130.

The MO 140 may be structured by the laser oscillator system shown in FIG. 4, for instance. Here, an illustration direction of a laser beam is rotated by 90 degree with respect to that in FIG. 4. In the MO 140, as the same structural elements with the laser oscillator shown in FIG. 4, the same reference numbers will be applied, and the redundant explanations will be omitted.

The MO 140 may include the LNM 10, the grating 11, the prisms 12 and 13, the rotary stage 14, the MO chamber 20, the windows 21 and 22, the electrodes 23 and 24, the OC 30, the MO-PPM 70, the switch 71, the MO charger 80, a beam splitter 43 and a MO pulse energy detector 55.

Because the LNM 10, the grating 11, the prisms 12 and 13, the rotary stage 14, the MO chamber 20, the windows 21 and 22, the electrodes 23 and 24, the OC 30, the MO-PPM 70, the switch 71 and the MO charger 80 are the same as the structural elements shown in FIG. 4, the same reference numbers are applied, and the redundant explanations will be omitted.

The MO pulse energy detector 55 may be a detector for measuring pulse energy of a pulse laser beam L oscillated in the MO 140 and reflected by the beam splitter 43. As described above, at an output side of the OC 40 of the MO 140, the pulse energy detector 55 for the MO 140 can be arranged. The beam splitter 43 may be a structure for introducing the reflected light of the pulse laser beam L having been outputted from the MO chamber 30 and passed through the OC 30. A transmitted light passing through the OC 43 may enter the high reflective mirror 150.

In order to introduce the pulse laser beam L reflected by the high reflective mirror 150 to the PO 160, the high reflective mirror 151 may be further arranged.

The PO 160 may include a PO chamber 180, a PO-PPM 75, a partial reflective mirror (PR) 170, an OC (PO-OC) 36 and a PO charger 85.

In order to detect the pulse laser beam L outputted from the PO chamber 180, the monitor module 40 may be disposed at an output side of the PO chamber 180 and an downstream side with respect to the OC 36.

In order to detect laser data of the pulse laser beam L outputted from the PO chamber 180, the beam detector 190 may be disposed at an further downstream side with respect to the monitor module 40.

The monitor module 40 may include the beam splitters 41 and 42, the PO pulse energy detector 50 and the spectrum detector 60. Because the monitor module 40 and the structural elements thereof as the same with these in FIG. 4, the same reference numbers are applied thereto, and the redundant explanations will be omitted.

The beam detector 190 may be a detector for measuring a characteristic of a pulse laser beam L directly before entering the exposure apparatus 300, which is a final output of the laser apparatus 205. The beam detector 190 may include a beam splitter 191, a beam profiler 192, a beam pointing detector 193 and a polarization detector 194.

The energy controller 95 may differ from the energy controller 90 in control of the two oscillators of the MO 140 and the PO 160, and in control of energy, have the same structures and functions with the energy controller 90 explained with FIG. 4.

Because the wavelength controller 100, the laser controller 120, the data collection processing system 130, the exposure apparatus 300 and the FDC system 400 have the same structures and functions with these explained with FIG. 4, the same reference numbers in FIG. 4 are applied thereto.

5.1.2 Operation

The exposure apparatus 300 may cause the exposure controller 310 to transmit a target pulse energy Et and a target wavelength λt to the laser controller 120, and receive luminescence trigger signals Str. The laser controller 120 may transmit the target pulse energy Et and the target wavelength λt to the energy controller 95 and the wavelength controller 100, respectively.

The energy controller 95 may control energy of pulse laser beams L to be outputted. The energy controller 95 may set charge voltages Vhvmo and Vhvpo to the MO charger 80 and the PO charger 85, respectively, so that energy of pulse laser beams L to be outputted becomes the target energy Et.

When the laser controller 120 receives the luminescence trigger signal Str from the exposure apparatus 310, the laser controller 120 may transmit the luminescence trigger signal Str to the energy controller 95. Furthermore, when the laser controller 120 receives the luminescence trigger signal Str from the exposure controller 310, the laser controller 120 may transmit a luminescence trigger interval T measured by the timer 123 and a current time measured by the clock 124 to the data collection processing system 130, and cause the data collection processing system 130 to store them.

The energy controller 95 may be synchronized with the received luminescence trigger signal Str, and the narrowed pulse laser beam Ls outputted from the MO 140 may enter the partial reflective mirror 170 via the high reflective mirrors 150 and 151. A part of the pulse laser beam Ls having been passed through the partial reflective mirror 170 may pass through a discharge space of the PO chamber 180. At this time, trigger signals Smt and Spt may be transmitted to the switches 71 and 76 of the MO-PPM 70 and the PO-PPM 75 so that discharge occurs between the electrodes 183 and 184 in the PO chamber 180. The switches 17 and 76 may be semiconductor switches.

In the MO 140, when the trigger signal Smt enters the semiconductor switch 71 of the MO-PPM 70 from the energy controller 95, discharge may occur between the electrodes 23 and 24 of the MO chamber 20 in synchronization with the trigger signal Smt.

When the discharge occurs in the excimer laser gas, the excimer laser gas may be excited, a laser oscillation may occur between the OC 30 and the LNM 10, and the pulse laser beam Ls with a narrowed spectrum width may be outputted from the OC 30. Pulse energy Emo of reflected light of the pulse laser beam Ls by the beam splitter 43 may be measured by the MO pulse energy detector 55, and a measurement result may be transmitted to the energy controller 95.

A laser beam being the narrowed seed beam Ls may enter the partial reflective mirror 170 via the high reflective mirrors 150 and 151.

A part of the seed beam Ls may penetrate the partial reflective mirror 170 and pass through a discharge space of the PO chamber 180. At this time, discharge may occur between the electrodes 183 and 184 of the PO chamber 180, and the laser gas may be excited. Also in the PO 160, similarly to the MO chamber 140, when the trigger signal Spt is inputted to the semiconductor switch 76 of the PO-PPM 75 from the energy controller 95, discharge may occur between the electrodes 183 and 184 of the PO chamber 180 in synchronization with the trigger signal Spt. As a result, light may resonate between the partial reflective mirror 170 and the OC 36, and when the light passes through the PO chamber 180, the light may be amplified. Pulse energy Epo of reflected light of the pulse laser beam L outputted from the OC 36 and reflected by the beam splitters 41 and 42 may be measured by the PO pulse energy detector 50, and a measurement result may be transmitted to the energy controller 95.

In the MO 140, the charge voltage Vhvmo may be feedback-controlled based on pulse energy Emot measured by the MO pulse energy detector 55 so that pulse energy of the laser beam becomes specific pulse energy Emot (pulse energy capable of being amplified by the PO 160).

Also, in the PO 160, the charge voltage Vhvpo may be feedback-controlled based on pulse energy Epo measured by the PO pulse energy detector 50 so that pulse energy of the laser beam becomes the target pulse energy Et requested by the exposure apparatus 300.

Here, the energy controller 95 may transmit pulse energy control related data Dec such as the measured pulse energies (Emo, Epo), the charge voltages (Vhvmo, Vhvpo), or the like, to the data collection processing system 130 via the laser controller 120.

The wavelength controller 100 may execute a feedback-control of the wavelength $\lambda$ via the wavelength adjuster 110 based on a difference $\delta\lambda$ between the target wavelength $\lambda t$ received from the laser controller 120 and the wavelength $\lambda$ measured by the spectrum detector. Here, the wavelength controller 100 may transmit wavelength control related data D$\lambda$c such as the measured wavelength ($\lambda$), the spectrum width ($\Delta\lambda$), or the like, to the data collection processing system 130 via the laser controller 120.

Here, data packing the data Dec of the energy control related parameters and the data D$\lambda$c of the wavelength control related parameters may be called as a control data set.

The beam detector 190 may measure a laser beam outputted from the PO 160, and transmit beam related data Db such as a beam profile, a beam divergence, a beam pointing, a polarization ratio, or the like, to the data collection processing system 130 via the laser controller 120.

The beam related data Db including these various kinds of items may be called as a laser beam data set.

For every input of the luminescence trigger signal Str to the laser controller 120 from the exposure apparatus 300, the above-described operation may be executed. The laser controller 120 may cause the data collection processing system 130 to store values of measurement parameters which will be described with FIG. 22 and values calculated from the measurement parameters in the storage 131 for every reception of the luminescence trigger signal Str.

The data collection processing system 130 may recognize the data Dpw and Dps for every wafer and every scanning based on the trigger interval T of the luminescence trigger signals Str, replace the data Dpw and Dps, process the data Dpw and Dps, and transmit the data Dpw and Dps to the FDC system 400. This operation may be executed by the laser controller 120.

Also, in the double chamber system with such structures and functions, it is possible to order the energy control parameters, the wavelength control parameters and the beam measurement parameters as the data Dpw and Dps by each wafer and/or each scanning, and transmit the data Dpw and Dps to the FDC system 400.

5.1.3 Example of Parameter for Data Collection Process in Double Chamber Laser System FIG. 22 is a diagram showing an example of parameters capable of being transmitted to the FDC system 400 from the laser apparatus 205 with the double chamber system.

In FIG. 22, the energy control related data Dec, the wavelength control related data D$\lambda$c and the beam related data Db are listed as main items of parameters.

As an example of the energy control related data Dec, the target energy Et, the pulse energy Epo, an exposure amount error De, a maximum value Demax of the exposure amount error, a minimum value Demin of the exposure amount error and an average value Deav of the exposure amount error are listed as parameter items. A unit of such data processing may be defined by a pulse basis, a scanning basis and a wafer basis, and it may be a unit adapted to each item.

Likewise, as an example of the wavelength control related data D$\lambda$c, the target wavelength $\lambda t$, the wavelength $\lambda$, a wavelength error $\lambda e$, an average wavelength $\lambda av$, a FWHM of spectrum $\Delta\lambda$_FWHM and a 95% width of spectrum $\Delta\lambda$_E95 are listed as items, and a unit of data processing is defined by a pulse basis, a scanning basis and a wafer basis. As an example of the beam related data Db, a center position of beam (Bcv in a vertical direction and Bch in a horizontal direction Bch), a beam size (Bsv in the vertical direction and Bsh in the horizontal direction), a beam divergence (Bdv in the vertical direction and Bdh in the horizontal direction), a beam pointing (Bpv in the vertical direction and Bph in the horizontal direction), a polarization ratio P and an average Pav of the polarization ratio are listed as items. A unit of data processing thereof may be defined by a pulse basis, a scanning basis and a wafer basis, and it may be a unit adapted to each item.

In this way, it is possible to execute data processing and data ordering of the various kinds of parameters with a unit appropriate for data processing of each parameter, and by transmitting the data to the FDC system 400, it is possible to execute an accurate analysis on the FDC system 400.

5.2 Meter of Laser Beam

5.2.1 Beam Profiler and Beam Pointing Detector

FIG. 23 is a diagram showing detail structures of the beam profiler 192 and the beam pointing detector 193 in the beam detector 190 of the double chamber system shown in FIG. 21.

The beam profiler 192 may include a transfer optics 1921 and an image sensor 1922. The image sensor 1922 may be a two-dimensional CCD. The transfer optics 1921 may include a lens. For example, the transfer optics 1921 may be disposed so that an image of a beam at the beam splitter 191 is focused on the image sensor 1922.

The beam pointing detector 193 may include a collector optics 1931 and an image sensor 1932. The image sensor 1932 may be located on a focal position of the collector optics 1931.

A beam profile may be measured by the image sensor 1922. A beam pointing and a beam divergence may be measured by the image sensor 1932.

The image sensors 1922 and 1932 may be two-dimensional sensors, and they may measure a beam profile and a beam pointing in a vertical direction v and a horizontal direction of a laser beam. Generally, because a shape of a beam profile of an excimer laser is a rectangle, the beam profile and the beam pointing may be evaluated in a longer (v-axis) direction and a shorter (h-axis) direction.

5.2.2 Polarization Detector

Figure 24:
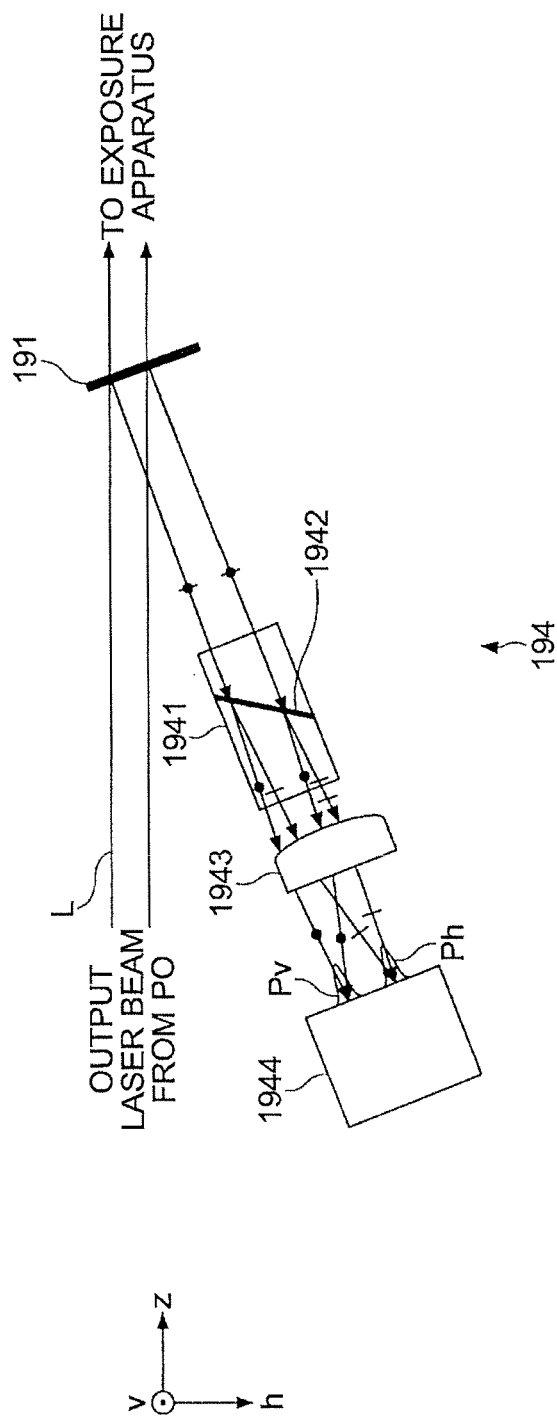
FIG. 24 is a diagram showing detail structures of a polarization detector.

FIG. 24 is a diagram showing detail structures of the polarization detector 194 in the beam detector 190 of the double chamber system shown in FIG. 21.

The polarization detector 194 may include a beam splitter 191, a Rochon prism 1941, a collector lens 1943 and an image sensor 1944. The beam splitter 191 may be disposed on a light path between the PO 160 and the exposure apparatus 300, and be arranged so that an incident angle thereto becomes 5 to 20 degree. On a light path of a reflected light, the Rochon prism 1941, the collector lens 1943 and the image sensor 1944 may be disposed in this order. The image sensor 1944 may be disposed on a focal position of the collector lens 1943.

In order that a polarization direction of a laser beam becomes an angle requested by the exposure apparatus 300, an inclined plane 1942 of the Rochon prism 1941 may be arranged with an arrangement angle by which a polarization of the laser beam becomes a p-polarization with respect the h-direction.

The pulse laser beam L outputted from the PO 160 may be reflected by the beam splitter 191 so that a reflection ratio of a polarization component Pv perpendicular to a plane of the paper and a reflection ratio of a polarization component Ph parallel to the plane of the paper are the same. The light with the polarization component Pv perpendicular to the plane of the paper in the pulse laser beam L may be rounded by refraction when the light passes through the Rochon prism 1941, and the light with the polarization component Ph parallel to the plane of the paper in the pulse laser beam L may penetrate the Rochon prism 1941 without refraction.

The pulse laser beam L having been passed through the Rochon prism 1941 may penetrate the collector lens 1943, and be focused while being separated into a polarization component parallel to the plane of the paper and a polarization component perpendicular to the plane of the paper. These two focused lights Ph and Pv may be detected by the image sensor 1944.

The image sensor 1944 may measure the energies Pv and Ph by integrating intensity distributions of the light of the polarization components, respectively. The polarization ratio P may be obtained by the following formula.

$$P=Ph/(Pv+Ph)$$

Here, Ph is energy in a polarization direction requested by the exposure apparatus 300, and Pv is energy in a polarization direction perpendicular to the direction of the Pv.

In this way, it is possible to measure the polarization of the pulse laser beam L.

5.3 Transmission to FDC

As described above, according to the laser apparatuses 200 and 205 according to the disclosure, it is possible to order the data Dpw and Dps by each wafer and/or each scanning using the data collection processing system 130, and it is possible to transmit the ordered data Dpw and Dps to the FDC system 400, and use these data Dpw and Dps for data analysis in the FDC system 400. With such laser apparatuses 200 and 205, in further development, it is possible that the laser apparatus 200 or 205 obtains a wafer ID from the FDC system 400, verifies the data Dpw ordered by each wafer number to the wafer ID, and transmits the verified data to the FDC system 400. In the following, a process in a case where the wafer ID used by the FC system 400 and the wafer number used by the laser apparatus 200 or 205 are transmitted to the FDC system 400 after the wafer ID and the wafer number are verified will be explained.

Figure 25:
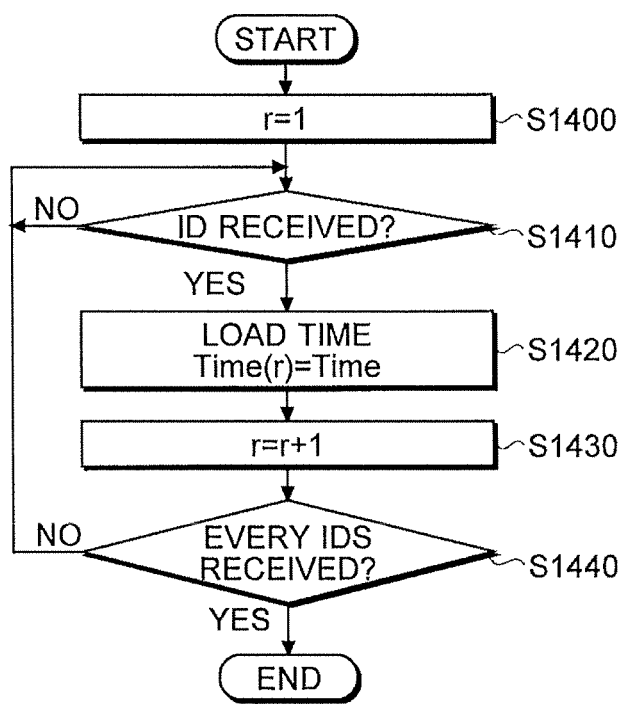
FIG. 25 is a flowchart showing an example of a process flow in a case where data is transmitted to the FDC system from the laser apparatus according to the disclosure.

FIG. 25 is a flowchart showing an example of a process flow in a case where data is transmitted to the FDC system 400 from the laser apparatus 200 or 205 according to the disclosure. The process flow may show details of step S130 in FIG. 5. In FIG. 25, a case where a reception number of data received from the FDC system 400 is defined as r is explained.

In step S1400, the reception number r may be initialized as 1 (r=1).

In step S1410, the data collection processing system 130 may determine whether the laser apparatus 200 or 205 receives a wafer ID or not. When the data collection processing system 130 determines that the laser apparatus 200 or 205 receives the wafer ID, the data collection processing system 130 may progress to step S1420, and when the data collection processing system 130 determines that the laser apparatus 200 or 205 does not receive the wafer ID, the data collection processing system 130 may wait a reception of the wafer ID. Here, the wafer ID may be a numeric character, a symbol, or the like, for identifying each wafer by the FDC system 400.

In step S1420, a time Time(r) at the reception number r may be loaded and stored.

In step S1430, the reception number r may be incremented by 1 (r=r+1).

In step S1440, the data collection processing system 130 may determine whether every wafer ID has been received from the FDC system 400. When the data collection processing system 130 determines that every wafer ID has not been received, the data collection processing system 130 may return to step S1410, and repeat the process flow following after step S1410. On the other hand, when the data collection processing system 130 determines that every wafer IDs has been received, the data collection processing system 130 may finish the process flow for every process has been finished.

FIG. 26 is a diagram showing an example of the stored verification result. In FIG. 26, the reception number r, the time Time(r) at the reception number r, and a reception ID RecvID(r) are stored. By using such data, the wafer ID and the wafer number may be verified.

Figure 27:
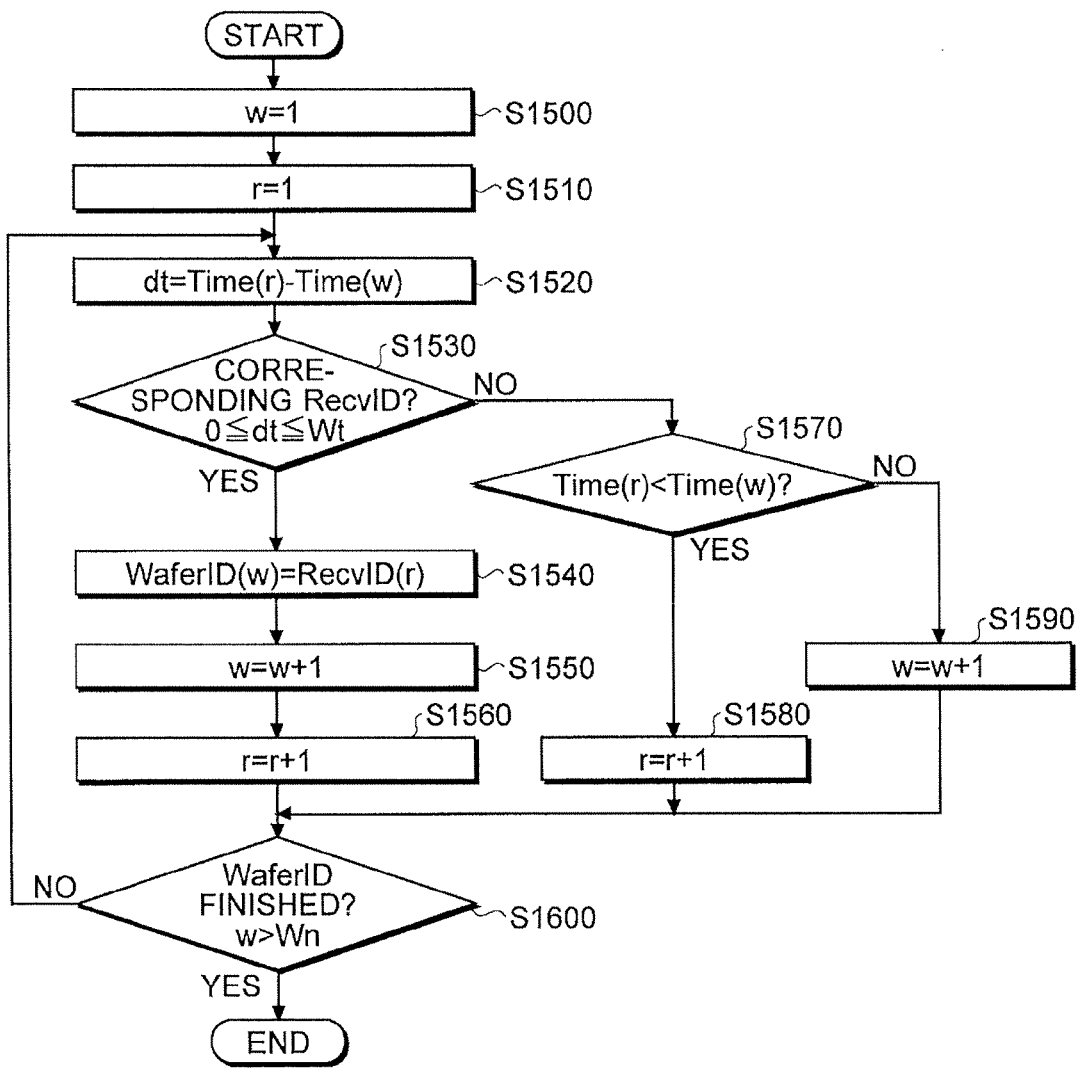
FIG. 27 is a diagram showing an example of a process flow for replacing a wafer number with a wafer ID.

FIG. 27 is a flowchart showing an example of a process flow for replacing the wafer number with the wafer ID.

In step S1500, the wafer number w may be initialized as 1 (W=1).

In step S1510, the reception number r may be initialized as 1 (r=1).

In step S1520, a difference dt between the time Time(r) at the time of reception of the wafer ID from the FDC system 400 and a time Time(w) of the wafer number w in data stored in the data collection processing system 130 as data per wafer may be calculated. Specifically, the data collection processing system 130 may calculate a formula of dt=Time(r)−Time(w). The data stored in the data collection processing system 130 as data per wafer may be data of a latest exposed wafer.

In step S1530, the data collection processing system 130 may determine whether the wafer ID corresponds to the received reception ID RecvID or not. Specifically, the data collection processing system 130 may determine whether the time difference dt between the wafer number and the wafer ID is equal to or greater than 0 and equal to or smaller than Wt or not. Here, Wt is a maximum delay of a timing of transmission of the wafer ID from the FDC system 400, and it may be about a period of several seconds. Specifically, the data collection processing system 130 may determine whether the time difference dt satisfies a formula of 0≤dt≤Wt of not.

In step S1530, when the data collection processing system 130 determines that the wafer ID and the reception ID RecvID correspond to each other, the data collection processing system 130 may progress to step S1540. On the other hand, when the data collection processing system 130 determines that the wafer ID and the reception ID RecvID do not correspond to each other, the data collection processing system 130 may progress to step S1570.

In step S1540, the wafer ID may be replaced with the reception ID RecvID received from the FDC system 400.

In step S1550, the wafer number w may be incremented by 1 (w=w+1).

In step S1560, the reception number r may be incremented by 1 (r=r+1).

On the other hand, when the data collection processing system 130 determines that the time difference dt is equal to or greater than Wt, the data collection processing system 130 may progress to step S1570. In step S1570, the data collection processing system 130 may determine whether the time Time(w) of the wafer number w in the data collection processing system 130 is posterior to the time Time(r) at the time of reception of the wafer ID from the FDC system 400 or not (i.e., Time(r)<Time(w)?). When the data collection processing system 130 determines that the time Time(w) is posterior to the time Time(r), the data collection processing system 130 may progress to step S1580, and the reception number r may be incremented by 1 (r=r+1). On the other hand, when the data collection processing system 130 determines that the time Time(w) is not posterior to the time Time(r), the data collection processing system 130 may progress to step S1590, and the wafer number w may be incremented by 1 (w=w+1).

In step S1600, the data collection processing system 130 may determine whether the wafer data is finished or not. Specifically, the data collection processing system 130 may determine whether the wafer number w exceeds a maximum wafer number Wn or not (i.e., Wn<w?).

In step S1600, when the data collection processing system 130 determines that the wafer number w does not exceed the maximum wafer number Wn, the data collection processing system 130 may return to step S1520, and repeat the process flow. On the other hand, when the data collection processing system 130 determines that the wafer number w exceeds the maximum wafer number Wn, the data collection processing system 130 may finish the process flow.

FIG. 28 is a diagram showing an example of data Dpw ordered by verifying the wafer number and the wafer ID. As shown in FIG. 28, because the wafer number w corresponds to the number of the wafer ID, by transmitting the data Dpw to the FDC system 400, the FDc system 400 can use the data Dpw to data analysis easily.

In this way, by receiving the wafer ID from the FDC system 400 and transmitting the data Dpw which has been verified with the wafer number to the FDC system 400, it is possible to provide further easily analyzable data to the FDC system 400.

6. Double Chamber Laser Apparatus with Beam Detector System

6.1 Structure

Figure 29:
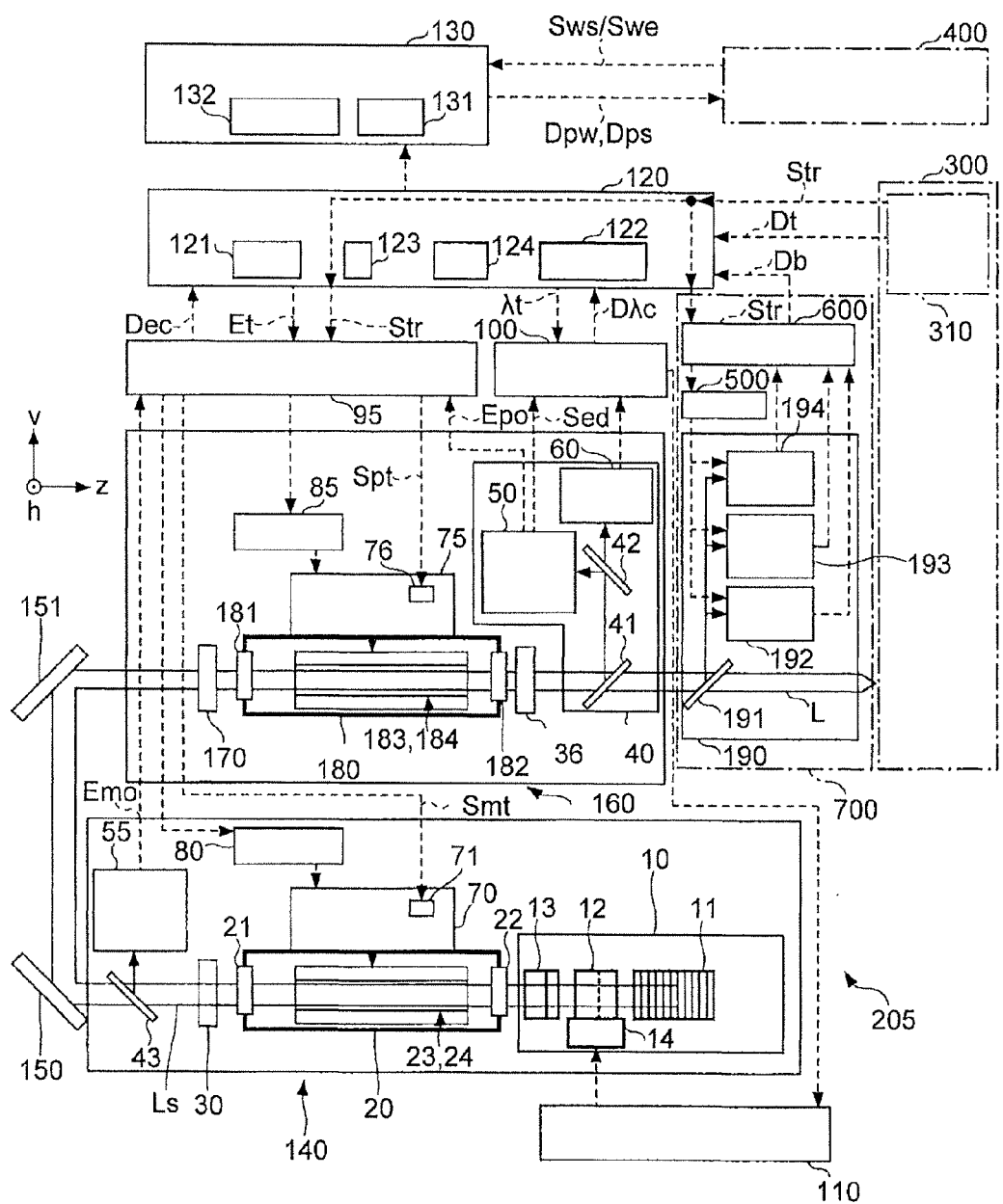
FIG. 29 is a diagram showing an example of a laser apparatus with a double chamber system including a beam detector system.

FIG. 29 is a diagram showing an example of a laser apparatus with a double chamber system including a beam detector system. Although the laser apparatus shown in FIG. 29 is structured as the double chamber system laser apparatus with the same as the laser apparatus shown in FIG. 21, regarding detection means of a laser beam, whereas the laser apparatus shown in FIG. 21 has the beam detector 190, the laser apparatus shown in FIG. 29 has a beam detector system 700 including a control circuit 500 and a bean detection controller 600 in addition to the beam detector 190.

Because the other structural elements are the same with the laser apparatus shown in FIG. 21, the same reference numbers will be applied to the same structural elements, and the redundant explanations thereof will be omitted.

As described above, the beam detector system 700 may include the beam detector 190, the control circuit 500 and the beam detection controller 600. The beam detector 190 may include, as the laser apparatus shown in FIG. 21, the beam splitter 191, the beam profiler 192, the beam pointing detector 193 and the polarization detector 194. Also, as the laser apparatus shown in FIG. 21, the beam detector 190 can be disposed on the light path of the pulse laser beam L outputted from the PO 160.

The control circuit 500 may be connected to each of the beam profiler 192, the beam pointing detector 193 and the polarization detector 914 in the beam detector 190. The beam detection controller 600 may be connected to the control circuit 500 and the laser apparatus 120, respectively.

6.2 Operation

The beam detection controller 600 may measure a beam performance of the pulse laser beam L outputted from the PO 160 in synchronization with the luminescence trigger signal Str. The beam detection controller 600 may transmit the beam related parameters such as the beam profile, the beam divergence, the beam pointing, the polarization degree, or the like, to the data collection processing system 130 via the laser controller 120.

Details of the control circuit 500 will be described later on. Because operations of the other structures are the same as those explained with FIG. 21, the explanations thereof will be omitted.

6.3 Effect

A beam profile, a beam divergence, a beam pointing and a polarization degree can be measured in synchronization with the luminescence trigger signal Str which causes burst driving for scanning exposure to start. As a result, it is possible to collect data about a beam performance.

7. Beam Detector System

7.1 Structure

Figure 30:
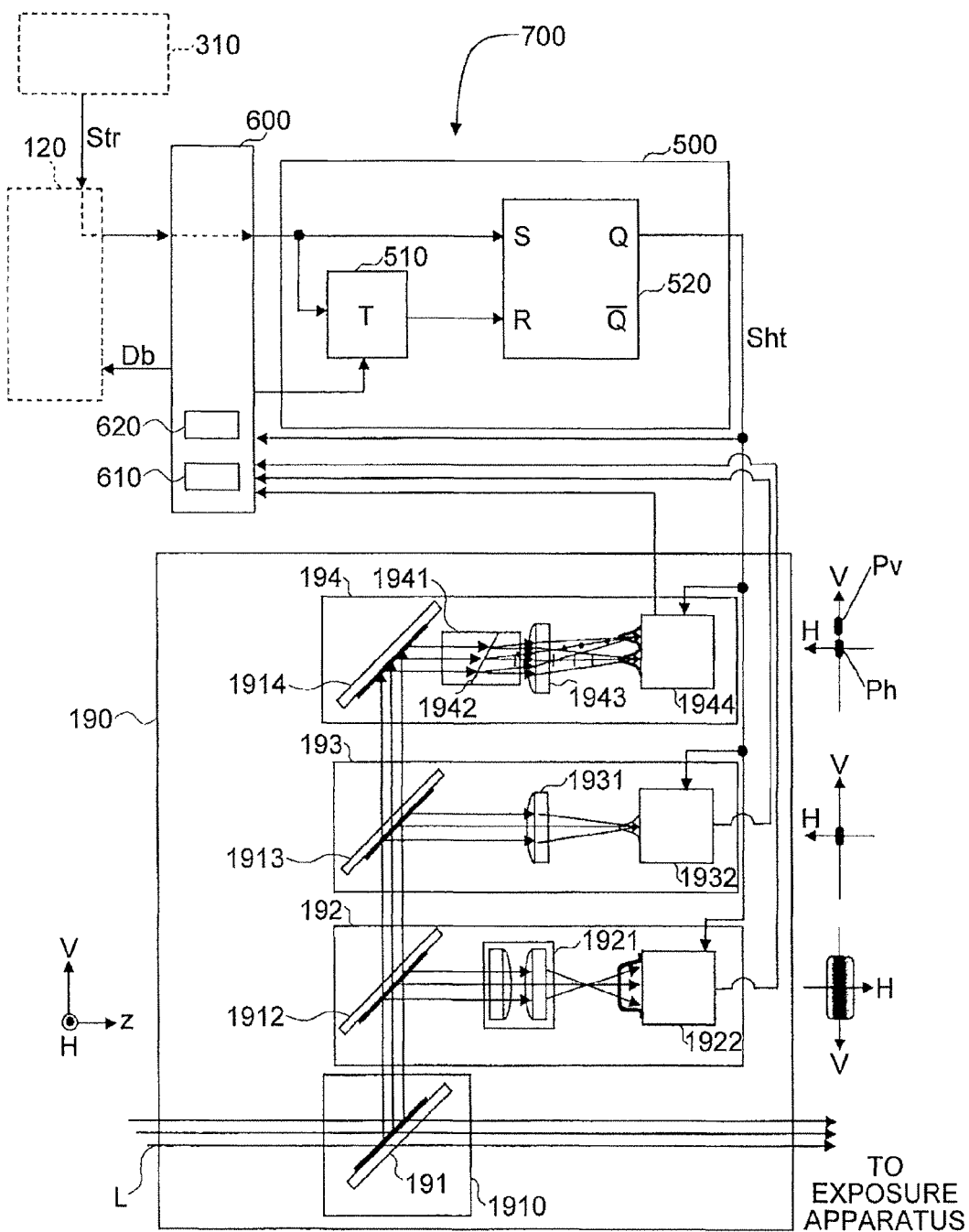
FIG. 30 is a diagram showing an example of a total structure of the beam detector system.

FIG. 30 is a diagram showing an example of a total structure of the beam detector system 700. The beam detector system 700 may have the beam detection controller 600, the control circuit 500 and the beam detector 190. In FIG. 30, the laser controller 120 and the exposure controller 310 are shown as related structural elements.

In the beam detector 190, as explained with FIGS. 23 and 24, the beam profiler 192 may have the image sensor 1922, the pointing detector 193 may have the image sensor 1932, and the polarization detector 194 may have the image sensor 1944.

The control circuit 500 may control imaging operations of the image sensors 1922, 1932 and 1944 using electrical shutters. The control circuit 500 may have a timer circuit 510 and a flip-flop circuit 520.

The exposure controller 310 may be connected to an input terminal of the timer circuit 510 and a set (S) terminal of the flip-flop circuit 520 via the laser controller 120 and the beam detection controller 600. An output of the timer 510 may be connected to a reset (R) terminal of the flip-flop circuit 520. A specific time Tr of the trigger interval for determining a burst stoppage may be set to the timer circuit 510 from the beam detection controller 600. For example, the specific time Tr of the luminescence trigger may be set as 0.007 second. The output Q of the flip-flop circuit 520 may be connected to the image sensors 1922, 1932 and 1944.

The beam detector 190 may include a beam sampler 1910, the beam profiler 192, the beam pointing detector 192 and the polarization detector 193.

The beam sampler 1910 may include the beam splitter 191, and be disposed on the light path of the pulse laser beam L. A surface of the beam splitter 191 may be coated with a multilayer film of which reflection ratios with respect to P polarization and S polarization are even. The other surface of the beam splitter 191 may be coated with an anti-reflective (AR) coat.

The beam profiler 192 may include a beam splitter 1912, the transfer optics 1921 and the image sensor 1922. The beam splitter 1912 may be disposed on a light path of light reflected by the beam splitter 191. As the beam splitter 191, a surface of the beam splitter 1912 may be coated with a multilayer film of which reflection ratios with respect to P polarization and S polarization are even. Also, as the beam splitter 191, the other surface of the beam splitter 1912 may be coated with an anti-reflective (AR) coat. The transfer optics 1921 may include a plurality of lenses, and be disposed on a light path of light reflected by the beam splitter 1912. Any means for imaging a beam profile of a beam focused on an imaging plane can be applied as the image sensor 1922. For example, the image sensor 1922 may be a camera including two-dimensional-arrayed CCD elements, and be disposed so that the plurality of the CCD elements are located at a position of an image of the laser beam transferred by the transfer optics 1921.

The pointing detector 193 may include a beam splitter 1913, the collector optics 1931 and the image sensor 1932. The beam splitter 1913 may be disposed on a light path of light having been passed through the beam splitter 1912. A surface of the beam splitter 1913 may be coated with a multilayer film of which reflection ratios with respect to P polarization and S polarization are even, and the other surface of the beam splitter 1913 may be coated with an anti-reflective film. The collector optics 1931 may include a lens, and be disposed on a light path of light having been passed through the beam splitter 1913. As the image sensor 1931, the image sensor 1932 may be a camera including two-dimensional-arrayed CCD elements. The CCD elements may be disposed on a focal position of the collector optics 1931, and it is also possible that the collector optics 1931 is disposed so that the focal position thereof is located on an imaging surface of the CCD elements.

The polarization detector 194 may include a high reflective mirror 1914, the Rochon prism 1941, a collector optics 1943 and the image sensor 1944. The high reflective mirror 1914 may be disposed on a light path of light having been passed through the beam splitter 1913. A surface of the high reflective mirror 1914 may be coated with a multilayer film of which reflection ratios with respect to P polarization and S polarization are even. The Rochon prism 1931 may be constructed from an MgF crystal, and be disposed on a light path of light reflected by the high reflective mirror 1914. An arrangement angle of the inclined plane 1942 of the Rochon prism 1941 may be designed so that a linear polarization component in a V direction is separated. As the image sensors 1931 and 1932, the image sensor 1944 may be a camera including two-dimensional-arrayed CCD elements. The CCD elements may be disposed at a focal position of the collector optics 1943, and be arranged so that a polarization component in an H direction and the polarization component in the V direction are focused on the CCD elements.

The beam detection controller 600 may include a storage 610 and a processor 620. The storage 610 may store image data imaged by the image sensors 1922, 1932 and 1944. The processor 620 may calculate beam related data for every burst using the image data stored in the storage 610.

7.2 Operation

When the luminescence trigger signal Str is outputted from the exposure apparatus 310, the luminescence trigger signal Str may be inputted into the control circuit 500 via the laser controller 120 and the beam controller 600. The pulse laser beams L may be outputted based on the luminescence trigger signals Str.

Figure 31A:
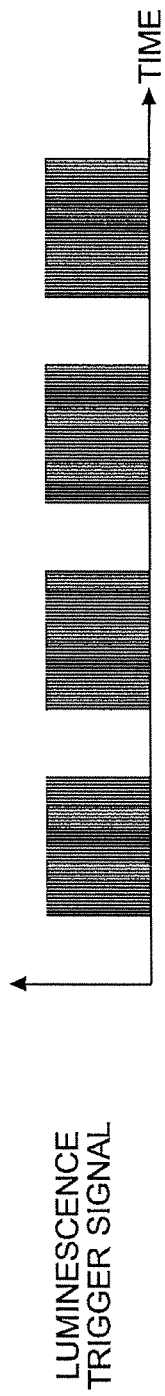
FIG. 31A is a timing chart of luminescence trigger signals.
Figure 31B:
FIG. 31B is a timing chart of pulse laser beams.
Figure 31C:
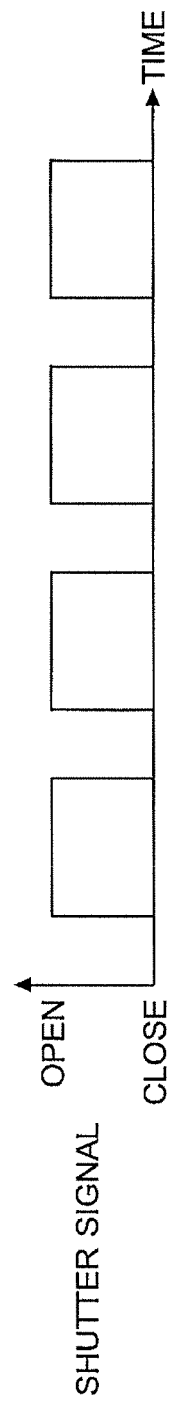
FIG. 31C is a timing chart of shutter signals.

FIGS. 31A to 31C are timing charts of the luminescence trigger signals, the pulse laser beams and shutter signals. FIG. 31A is a timing chart of the luminescence trigger signals, and the FIG. 31B is a timing chart of the pulse laser beams. FIG. 31C is a timing chart of the shutter signals.

FIGS. 31A and 31B illustrate that pulses of the pulse laser beams L are synchronous with the luminescence trigger signals Str. That is, the pulse laser beams L are outputted based on the luminescence trigger signals Str.

As shown in FIG. 30, when the luminescence trigger signal Str is outputted from the exposure controller 310, because an ON signal is inputted into the set terminal S of the flip-flop circuit 520 in the control circuit 500, a shutter signal (ON signal) Sht is outputted from the output terminal. As shown in FIG. 31C, because the ON signal of the shutter signal Sht is an OPEN signal, the OPEN signal may be inputted into an electrical shutter of each of the image sensors 1922, 1932 and 1944. Thereby, the electrical shutter of each of the image sensors 1922, 1932 and 1944 may maintain an open state, and an image of an inputted laser beam can be obtained.

As shown in FIG. 30, because the OPEN signal of the shutter signal Sht is also inputted to the beam detection controller 600, the beam detection controller 600 can also recognize that the electrical shutters of the image sensors 1922, 1932 and 1944 are CLOSE states.

On the other hand, when a time interval of the luminescence trigger signals Str inputted into the timer circuit 510 exceeds the specific trigger interval Tr (0.07 second, for instance), a pulse signal may be outputted from the timer circuit 510.

When the pulse signal is inputted into the reset terminal R of the flip-flop circuit 520, an OFF signal of the shutter signal Sht may be outputted from the output terminal Q of the flip-flop circuit 520, and as shown in FIG. 31C, the shutter signal may be switched from OPEN to CLOSE. As a result, the electrical shutters of the image sensors 1922, 1932 and 1944 may become close states, and imaging of the laser beam may be stopped. The OFF signal of the shutter signal Sht may be inputted into the beam detection controller 600.

The beam detection controller 600 may obtain beam images from the image sensors 1922, 1932 and 1944 at the timing when the electrical shutters are closed. Then, the beam detection controller 600 may obtain the beam related data from the beam images of the image sensors 1922, 1932 and 1944. Specifically, the beam detection controller 600 may obtain a width and a center position of the beam from the image data of the image sensor 1922. Furthermore, the beam detection controller 600 may obtain a beam divergence and a beam pointing from the image data of the image sensor 1932. Moreover, the beam detection controller 600 may obtain a polarization degree P of the beam from the image data of the image sensor 1944.

The beam detection controller 600 may transmit the calculated beam related data Db to the laser controller 120. The laser controller 120 may transmit the beam related data Db to the data collection processing system 130 as described above, and the data collection processing system 130 may order the beam related data Db by wafer basis and scanning basis, and transmit the ordered beam related data Db to the FDC system 400.

7.3 Effect

As described above, when the interval of the luminescence trigger signals Str is equal to or smaller than the specific interval Tr, the beam detection controller 600 may determine that burst oscillation is being executed, and cause the electrical shutters of the image sensors 1922, 1932 and 1944 to open. On the other hand, when the interval of the luminescence trigger signals Str is greater than the specific interval Tr, the beam detection controller 600 may determine that burst oscillation is being stopped, and cause the electrical shutters to close. Thereby, it is possible to measure image data of beam for every burst. Then, the beam detection controller 600 may calculate the beam related data Db from the image data for every burst, and output the beam related data Db to an external device via the laser controller 120.

In the embodiment, although the Rochon prism 1941 for separating the H direction polarization component and the V direction polarization component is used for the polarization detector 194, various kinds of polarizers capable of separating the H direction polarization component and the V direction polarization component with a specific angle can be used instead of the Rochon prism 1941. For example, an air-gap Wollaston prism can be used for the polarization detector 194.

7.4 Process Flow

Figure 32:
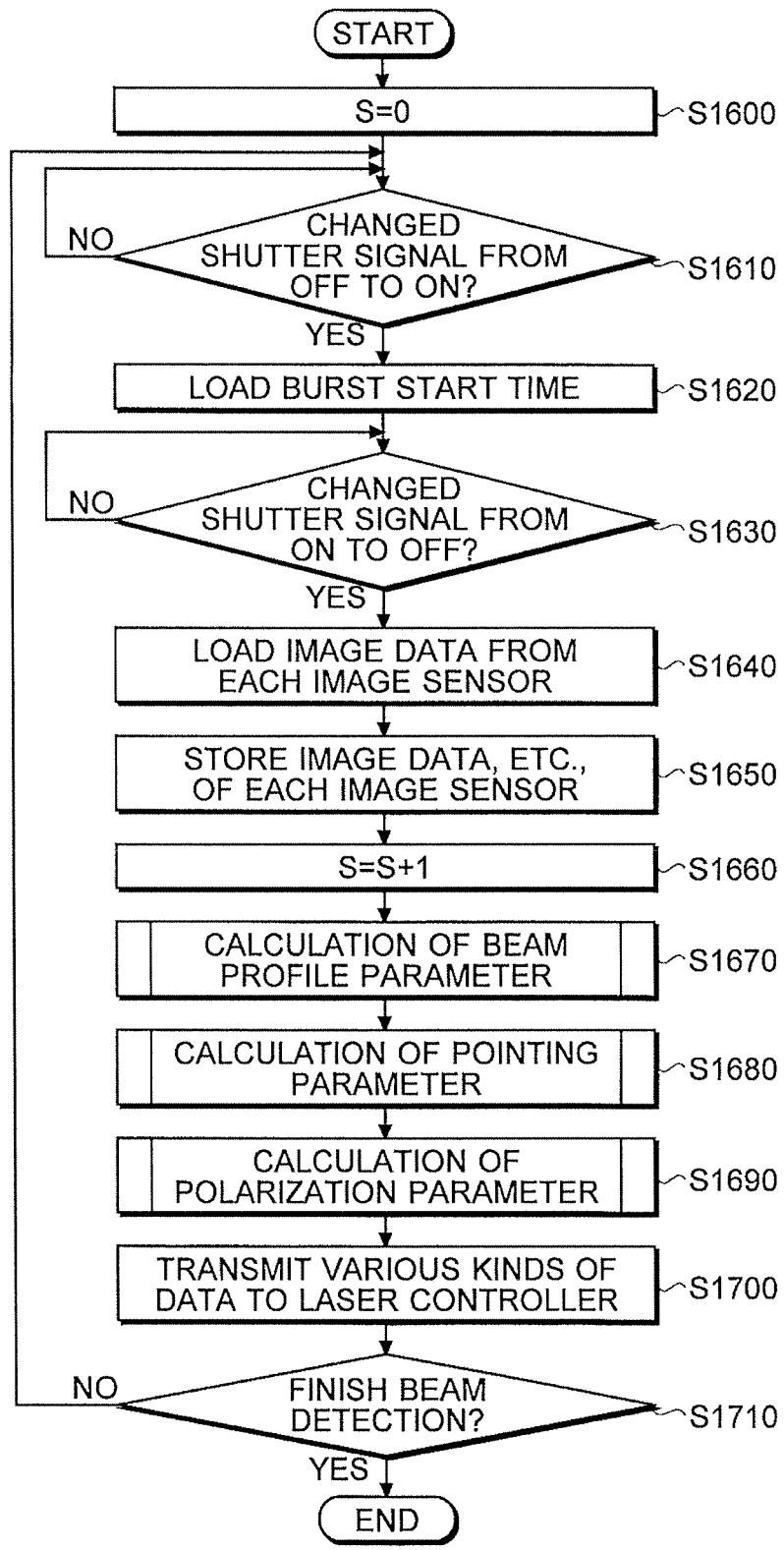
FIG. 32 is a flowchart showing an example of a beam detection method executed by the laser apparatus according to the embodiment.

Next, with reference to FIG. 32, a process flow of a beam detection method in the laser apparatus including the beam detection system according to the embodiment will be described. FIG. 32 is a flowchart showing an example of a beam detection method executed by the laser apparatus according to the embodiment.

Firstly, in step S1600, the beam detection controller 600 may set a burst number S as zero (S=0). The burst number S may indicate an order of a burst term in a burst driving, and it may be an ordinal number that begins with zero. Before starting the burst driving, the burst number S may be set as an initial value of zero.

Then, in step S1610, the beam detection controller 600 may determine whether the shutter signal Sht changes from OFF to ON or not. When the shutter signal Sht changes from OFF to ON, the beam detection controller 600 may progress to step S1620. When the shutter signal Sht does not change from OFF to ON, the beam detection controller 600 may repeat step S1610.

Then, in step S1620, the beam detection controller 600 may load a burst start time.

Then, in step S1630, the beam detection controller 600 may determine whether the shutter signal Sht changes from ON to OFF or not. When the shutter signal Sht changes from ON to OFF, the beam detection controller 600 may progress to step S1640. When the shutter signal Sht does not change from ON to OFF, the beam detection controller 600 may repeat step S1630.

Then, in step S1640, the beam detection controller 600 may obtain image data from the image sensor 1922 in the beam profiler 192, the image sensor 1932 in the beam pointing detector 193, and the image sensor 1944 in the polarization detector 194.

Then, in step S1650, the beam detection controller 600 may store the image data obtained from the image sensors 1922, 1932 and 1944 in the storage 610. At this time, the data detection controller 600 may also store the burst start time loaded in step S1620.

Then, in step S1660, the beam detection controller 600 may set a new burst number S by incrementing the current burst number S by 1 (S=S+1).

Then, in step S1670, the beam detection controller 600 may calculate beam profile parameters. Specifically, the beam detection controller 600 may execute a sub-routine for calculating the beam profiler parameters which will be described later on.

Then, in step S1680, the beam detection controller 600 may calculate pointing parameters. Specifically, the beam detection controller 600 may execute a sub-routine for calculating the pointing parameters which will be described later on.

Then, in step S1690, the beam detection controller 600 may calculate polarization parameters. Specifically, the beam detection controller 600 may execute a sub-routine for calculating the polarization parameters which will be described later on.

Then, in step S1700, the beam detection controller 600 may transmit various kinds of data, i.e., the burst start time, the burst number S, the calculated beam profile parameters, pointing parameters and polarization parameters, or the like, to the laser controller 120.

Then, in step S1710, the beam detection controller 600 may determine whether the detection of the laser beam should be finished or not. When the detection of the laser beam should not be finished, the data detection controller 600 may progress to step S1610. When the detection of the laser beam should be finished, the data detection controller 600 may finish the process flow.

In this way, it is possible that the laser apparatus with the laser detection system according to the embodiment executes the detection of the laser beam.

Figure 33:
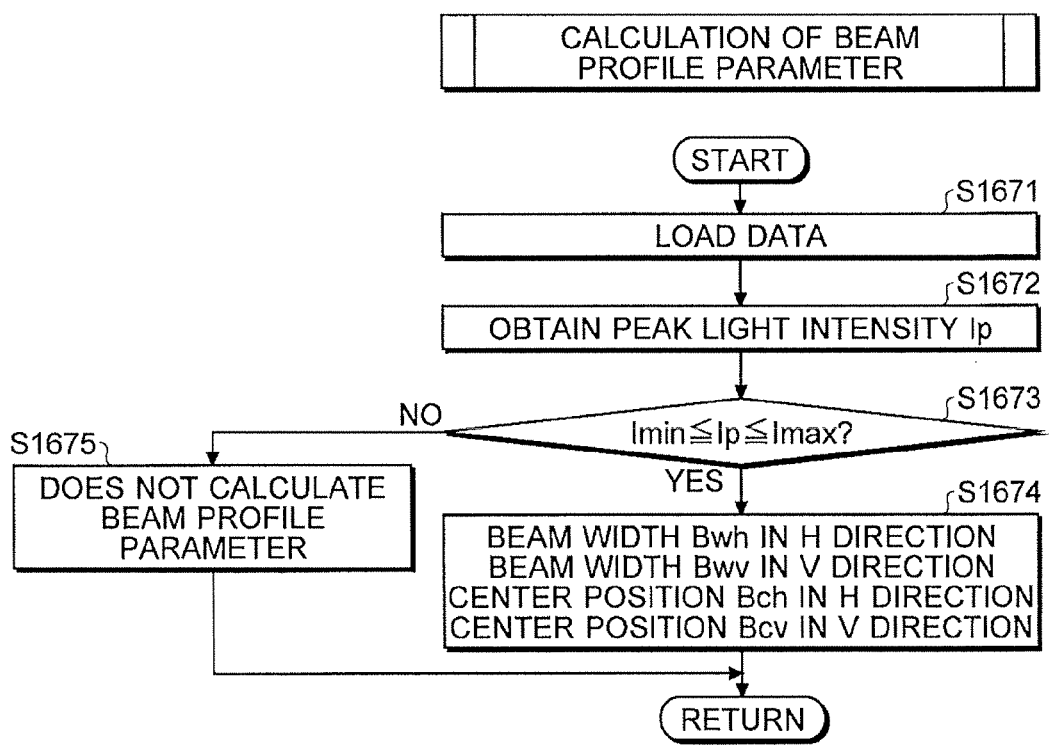
FIG. 33 is a flowchart showing an example of a sub-routine for calculating beam profile parameters.

Then, with reference to FIG. 33, a sub-routine for calculating the beam profiler parameters in step S1670 of FIG. 32 will be explained. FIG. 33 is a flowchart showing an example of the sub-routine for calculating the beam profile parameters.

Firstly, in step S1671, the beam detection controller 600 may load, to the processor 620, the image data detected by the image sensor 1922 of the beam profiler 192, which is stored in the storage 610 in the beam detection controller 600, or the like.

In step S1672, the beam detection controller 600 may obtain a peak light intensity Ip from the loaded image data. The beam detection controller 600 may detect a maximum light intensity of the loaded image data, and define the maximum light intensity as the peak light intensity Ip.

In step S1673, the beam detection controller 600 may determine whether the peak light intensity Ip is between a specific minimum acceptable light intensity Imin and a specific maximum acceptable light intensity Imax or not.

The minimum acceptable light intensity Imin and the maximum acceptable light intensity Imax can be associated with a minimum light intensity and a maximum light intensity which are capable of obtaining a linearity of the image sensor 1922.

Thereby, because parameters with an adequate light intensity are calculated, it is possible to improve calculation accuracy. When the light intensity is not within an adequate range, because the light intensity can be recorded as out-of-adequate-range (NG), it is possible to improve reliability of the calculation result.

In step S1673, when the peak light intensity Ip is not within the specific range equal to or greater than the acceptable minimum light intensity Imin and equal to or smaller than the acceptable maximum light intensity Imax, the beam detection controller 600 may progress to step S1675, and finish the sub-routine without calculation of the beam profile parameters. Then, the beam detection controller 600 may return to step S1670 of the process flow shown in FIG. 32, and progress to step S1680. On the other hand, when the peak light intensity Ip is within the specific range equal to or greater than the acceptable minimum light intensity Imin and equal to or smaller than the acceptable maximum light intensity Imax, the beam detection controller 600 may progress to step S1674 in the sub-routine.

In step S1674, the beam detection controller 600 may calculate the beam profile parameters. Specifically, the beam detection controller 600 may calculate a beam width Bwh in the H direction, a center position Bch in the H direction, and a center position Bcv in the V direction.

Figure 34:
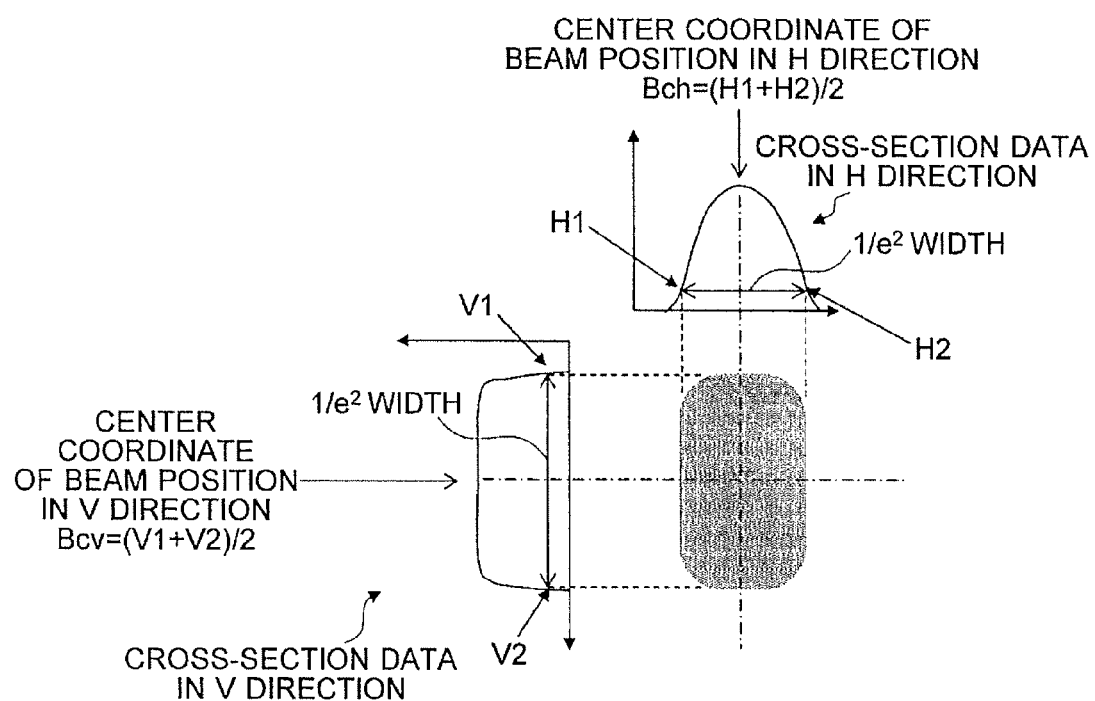
FIG. 34 is a diagram for explaining a calculation method of each beam profile parameter executed in step S1674 of FIG. 33.

FIG. 34 is a diagram for explaining a calculation method of each beam profile parameter executed in step S1674 of FIG. 33. FIG. 34 shows a beam profile of a pulse laser beam L detected by the image sensor 1922 in the beam profiler 192. When coordinates of both edges in the V direction, on which light intensities become $1/e^2$ with respect to the peak intensity of the pulse laser beam L, are defined as V1 and V2, respectively, a center coordinate Bcv of the pulse laser beam L in the V direction may be calculated using the following formula (1).

$$Bcv=(V1+V2)/2 \quad (1)$$

When coordinates of both edges in the H direction, on which light intensities become $1/e^2$ with respect to the peak intensity of the pulse laser beam L, are defined as H1 and H2, respectively, a center coordinate Bch of the pulse laser beam L in the H direction may be calculated using the following formula (2).

$$Bch=(H1+H2)/2 \quad (2)$$

The center positions (Bcv, Bch) of the beam profile can also be obtained by calculating a barycentric position of the beam profile based on the image data detected by the image sensor 1922 in the beam profiler 192. The beam widths (Bwv, Bwh) in the H direction and the V direction may be calculated as widths of a region of which light intensity is equal to or greater than a specific percentage (e.g. 5% to 10%) of the peak light intensity.

The explanation returns to FIG. 33. In step S1674, after each beam profile is calculated as explained with FIG. 34, the beam detection controller 600 may finish the sub-routine. Then, the beam detection controller 60 may progress to step S1680 from step S1670 in FIG. 32.

In the sub-routine, when the Ip is not equal to or greater than the Imin and equal to or smaller than the Imax (Imin≤Ip≤Imax) in step S1673, the beam profile parameters will be not calculated in the process of step S1675. However, in a case where the process of step S1675 is to calculate the beam related data in all cases, a flag indicating that the calculated beam related data is false may be set in the process of step S1675. In such case, a process for setting the flag indicating that the calculated beam related data is false may be executed in step S1675, and then, step S1674 is executed before the sub-routine is finished.

Figure 35:
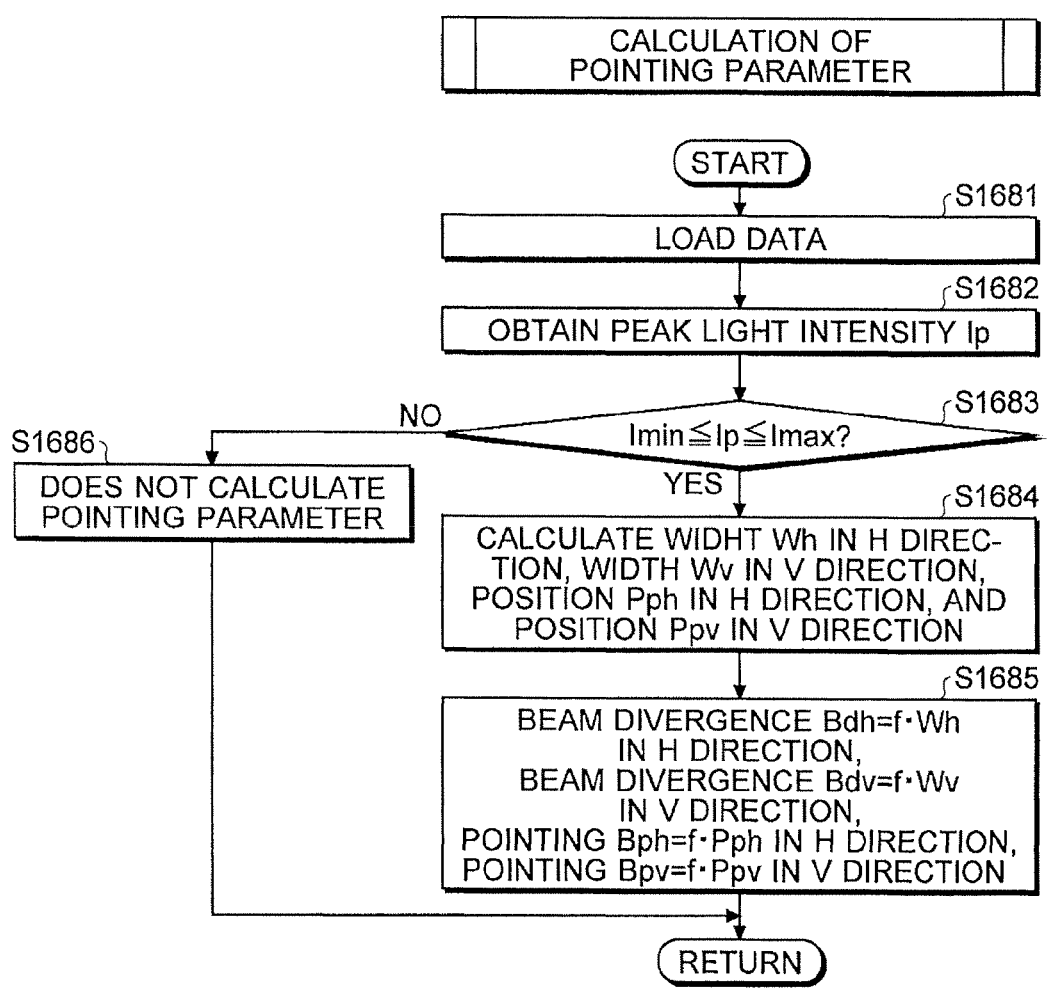
FIG. 35 is a flowchart for explaining the sub-routine in step S1680 of FIG. 32.

FIG. 35 is a flowchart for explaining the sub-routine in step S1680 of FIG. 32.

Firstly, in step S1681, the beam detector controller 600 may load the image data stored in the storage 610, which is detected by the image sensor 1932, to the processor 620.

In step S1682, the processor 620 of the beam detection controller 600 may calculate the peak light intensity Ip from the loaded image data. The peak light intensity Ip can be obtained by calculating a peak value in the loaded image data.

In step S1683, the beam detection controller 600 may determine whether the peak light intensity Ip is between the specific acceptable minimum light intensity Imin and the specific acceptable maximum light intensity Imax or not. The minimum acceptable light intensity Imin and the maximum acceptable light intensity Imax can be associated with a minimum light intensity and a maximum light intensity which are capable of obtaining a linearity of the image sensor 1932.

In step S1683, when the peak light intensity Ip is not within the specific range equal to or greater than the acceptable minimum light intensity Imin and equal to or smaller than the acceptable maximum light intensity Imax, the beam detection controller 600 may progress to step S1675, and finish the sub-routine without calculation of the beam profile parameters. Then, the beam detection controller 600 may return to step S1680 of the process flow shown in FIG. 32, and progress to step S1690. On the other hand, when the peak light intensity Ip is within the specific range equal to or greater than the acceptable minimum light intensity Imin and equal to or smaller than the acceptable maximum light intensity Imax, the beam detection controller 600 may progress to step S1684.

In step S1684, the beam detection controller 600 may calculate a beam width Wh in the H direction, a beam width Wv in the V direction, a center position Pph in the H direction, and a center position Ppv in the V direction. Specifically, the beam detection controller 600 may calculate the beam width Wh in the H direction, the beam width Wv in the V direction, the center position Pph in the H direction, and the center position Ppv in the V direction from the image data detected by the image sensor 1932.

Figure 36:
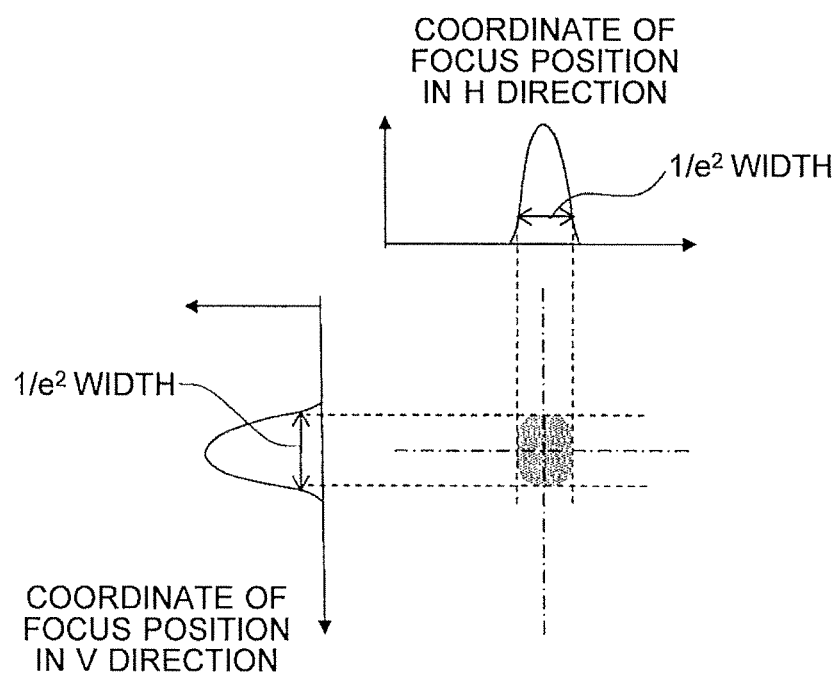
FIG. 36 is a diagram showing an example of image data of a collected beam detected by an image sensor.

FIG. 36 is a diagram showing an example of the image data of the collected beam detected by the image sensor 1932.

Pointings in the H direction and the V direction (Bph, Bpv) may be obtained by calculating a barycentric position based on the image data detected by the image sensor 1932 in the beam pointing detector 193. Divergences in the H direction and the V direction (Bdh, Bdv) may be calculated as widths of a region of which light intensity is equal to or greater than a specific percentage (e.g. $1/e^2$ or 5% to 10%).

The explanation returns to FIG. 35. In step S1685, the processor 610 of the beam detection controller 600 may calculate the beam divergence in the H direction Bdh=f*Wh and the beam divergence in the V direction Bdv=f*Wv based on the widths Wh and Wv calculated in step S1684. The processor 610 may calculate the pointing in the H direction Bph=f*Pph and the pointing in the V direction Bpv=f*Ppv based on the positions Pph and Ppv. Here, f is a focal length of the collector optics 1931. After that, the beam detection controller 600 may return to step S1680, and progress to step S1690.

In addition, as the explanation for step S1675 of FIG. 33, in step S1686 of FIG. 35, a process for setting the flag indicating that the calculated beam related data is false can be executed instead of the process without calculation of the pointing parameters.

Figure 37:
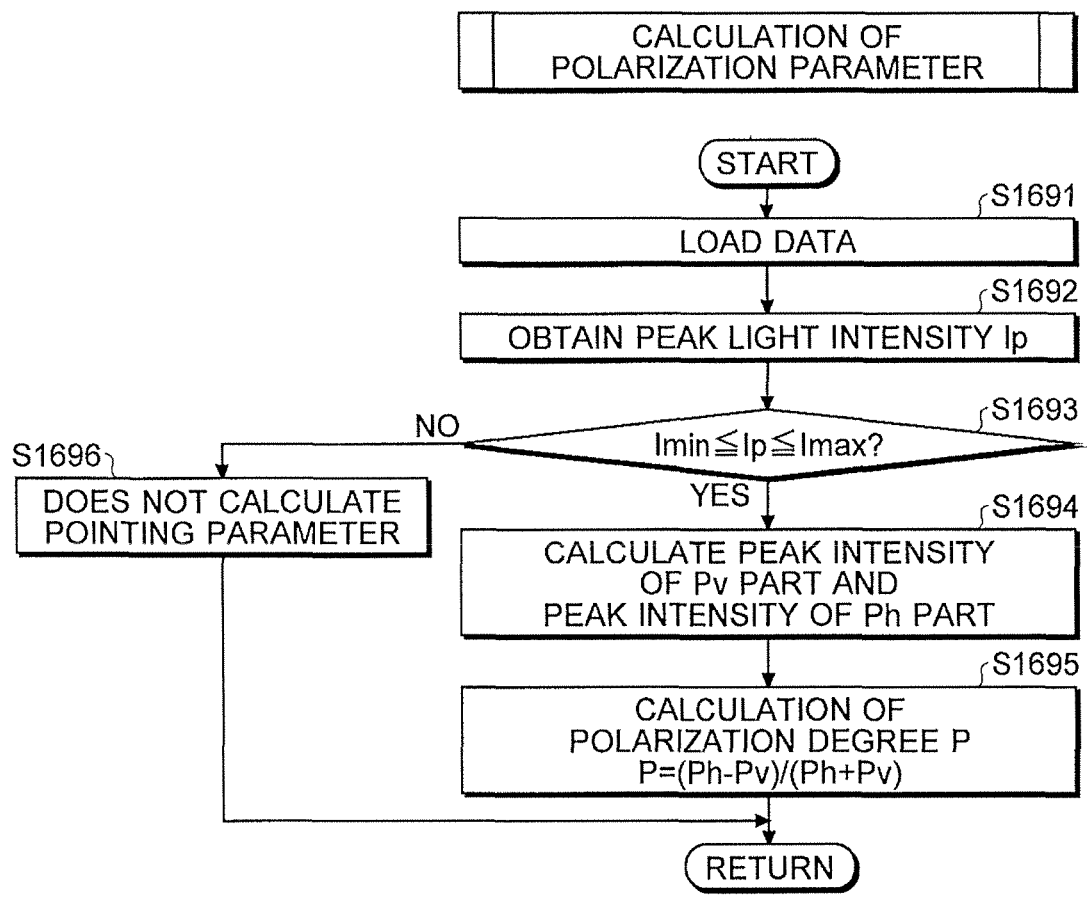
FIG. 37 is a flowchart showing an example of a sub-routine for calculating polarization parameters.

Next, with reference to FIG. 37, the sub-routine for calculating the polarization parameters in step S1690 of FIG. 30 will be explained. FIG. 37 is a flowchart showing an example of the sub-routine for calculating the polarization parameters.

Firstly, in step S1691, the beam detection controller 600 may load, to the processor 620, the image data detected by the image sensor 1944 of the polarization detector 194, which is stored in the storage 610 of the beam detection controller 600.

In step S1692, the processor 620 of the beam detection controller 60 may obtain a peak light intensity Ip from the loaded image data. The peak light intensity Ip can be obtained by calculating a peak value of the loaded image data.

In step S1693, the beam detection controller 600 may determine whether the peak light intensity Ip is between a specific minimum acceptable light intensity Imin and a specific maximum acceptable light intensity Imax or not. The minimum acceptable light intensity Imin and the maximum acceptable light intensity Imax can be associated with a minimum light intensity and a maximum light intensity which are capable of obtaining a linearity of the image sensor 1944.

In step S1693, when the peak light intensity Ip is not within the specific range equal to or greater than the acceptable minimum light intensity Imin and equal to or smaller than the acceptable maximum light intensity Imax, the beam detection controller 600 may progress to step S1696, and finish the sub-routine without calculation of the beam profile parameters. Then, the beam detection controller 600 may return to step S1690 of the process flow shown in FIG. 32, and progress to step S1700. On the other hand, when the peak light intensity Ip is within the specific range equal to or greater than the acceptable minimum light intensity Imin and equal to or smaller than the acceptable maximum light intensity Imax, the beam detection controller 600 may progress to step S1694 in the sub-routine.

Then, in step S1694, the processor 620 of the beam detection controller 600 may calculate a peak light intensity Pv of a S polarization component and a peak light intensity Ph of a P polarization component for calculating a polarization degree. Specifically, the processor 620 may calculate the peak light intensity Pv of the S polarization component and the peak light intensity Ph of the P polarization component from the image data detected by the image sensor 1944 of the polarization detector 194.

Figure 38:
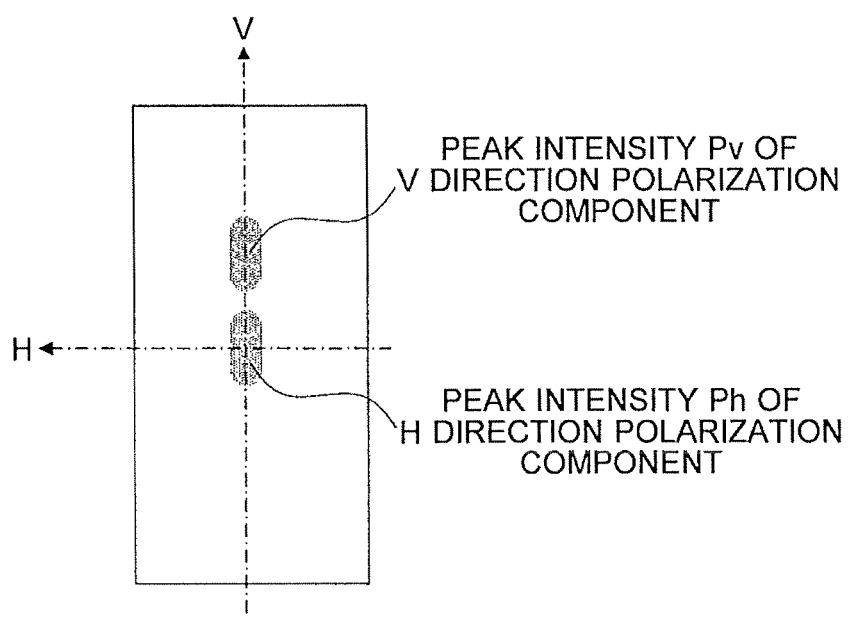
FIG. 38 is a diagram showing an example of image data of a pulse laser beam for calculating a polarization degree.

FIG. 38 is a diagram showing an example of the image data of the pulse laser beam for calculating a polarization degree. As shown in FIG. 38, the image sensor 1944 can detect the peak light intensity Pv of the V direction polarization component and the peak light intensity Ph of the H direction polarization component. Based on these light intensities, the polarization degree P can be calculated using the following formula (3).

$$P=(Ph-Pv)/(Ph+Pv) \qquad (3)$$

Here, in addition to the method of calculating the polarization degree P based on the peak light intensities Pv and Ph, a method in which the peak light intensity Pv is replaced with an integration value of the V direction polarization component and the peak light intensity Ph is replaced with an integration value of the H direction polarization component may be used in calculating the polarization degree P.

The explanation returns to FIG. 37. In step S1695, the polarization degree P may be calculated by the processor 610 of the beam detection controller 600. Specifically, the processor 610 may calculate the polarization degree P based on the peak light intensity Pv of the S polarization component and the peak light intensity Ph of the P polarization component Ph, which are calculated in step S1694, using the following formula (3). Then, the operation may return to the main routine shown in FIG. 32. Specifically, the processor 620 may return to step S1690 in FIG. 32, and progress to step S1700.

8. Alternative of Beam Detector System 8.1 First Alternative

Figure 39:
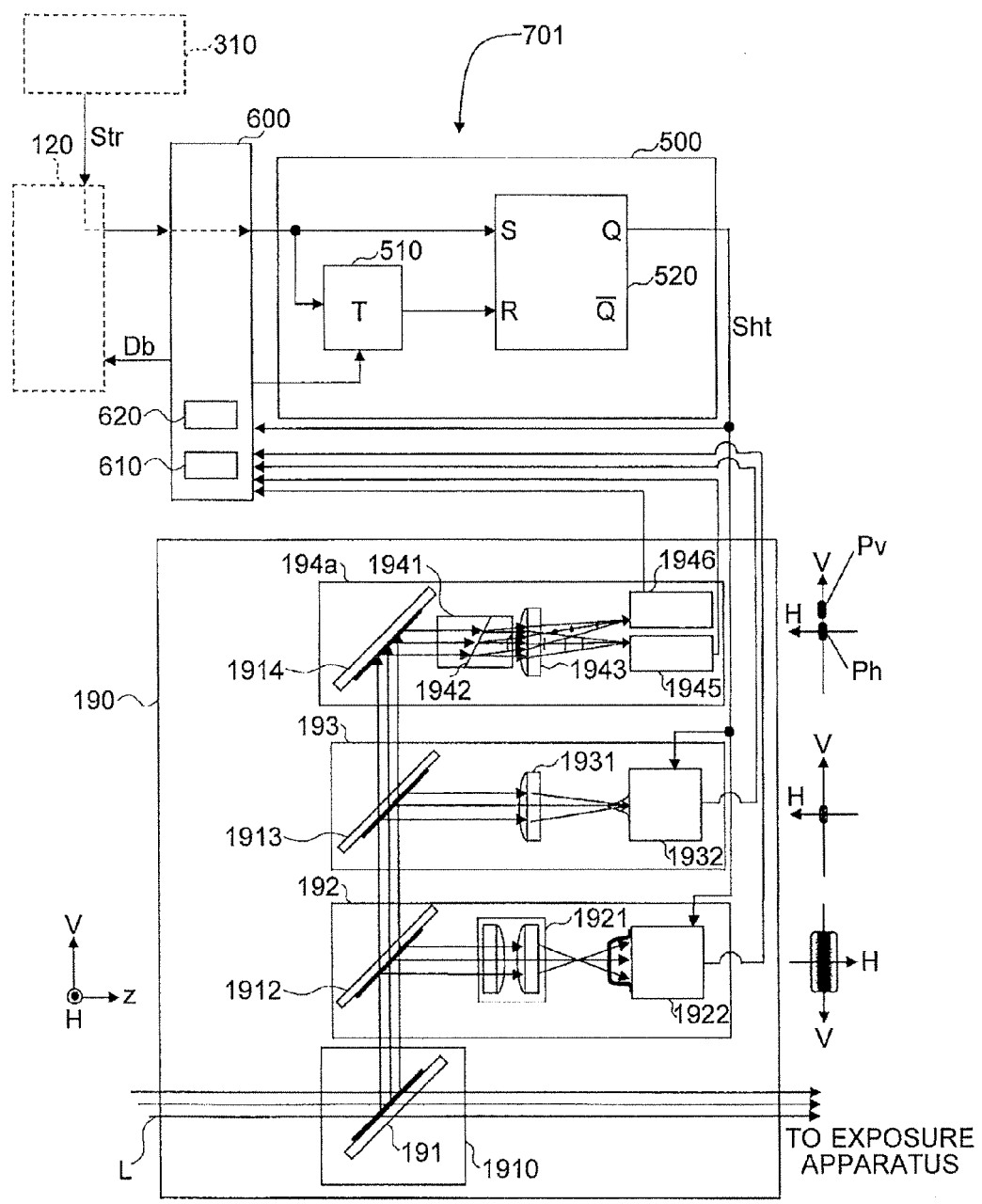
FIG. 39 is a diagram showing another example of the beam detection system of the laser apparatus according to the embodiment.

FIG. 39 is a diagram showing another example of the beam detection system of the laser apparatus according to the embodiment. The beam detection system 701 of the laser apparatus shown in FIG. 39 may differ from the beam detection controller 700 shown in FIG. 30 in the way that a polarization detector 194a in the beam detector 190 has energy sensors 1945 and 1946 instead of the image sensor 1944. Because the other structural elements are the same as those of the beam detection system 700 shown in FIG. 30, the same reference numbers are applied thereto, and the redundant explanations will be omitted.

Although the polarization detector 194a and the polarization detector 194 shown in FIG. 30 are similar in the way that both have the high reflective mirror 1914, the Rochon prism 1941 with the reflective surface 1942 and the collector optics 1943, the polarization detector 194a is different from the polarization detector 194 in the way that the polarization detector 194a has the energy sensors 1945 and 1946 instead of the image sensor 1944. The energy sensors 1945 and 1946 may be arranged so that they can receive light of the H direction polarization component and light of the V direction polarization component, respectively. Thereby, it is possible to detect energies of the light of the H direction polarization component and the light of the V direction polarization component. Here, because the energy sensors 1945 and 1946 do not have an electrical shutter, they are not connected to the flip-flop circuit 500 of the control circuit 500, but they are connected to the beam detection controller 600, respectively. Therefore, data of detection values of the energy sensors 1945 and 1946 may be transmittable to the beam detection controller 600.

Next, an operation of the laser apparatus with the beam detection system 701 shown in FIG. 39 will be explained.

When the luminescence trigger signal Str is inputted into the laser apparatus 120, the pulse laser beam L may be outputted, and a part of the pulse laser beam L may enter the Rochon prism 1941 via the beam splitter 191, 1912, 1913 and the high reflective mirror 1914.

The light of the V direction polarization component may be refracted by the Rochon prism 1941, be collected by the collector optics 1943, and enter light receiving elements of the energy sensor 1946. On the other hand, the light of the H direction polarization component may go straight through the collector optics 1943 while being collected by the collector optics 1943, and enter light receiving elements of the energy sensor 1945.

Energy data (Pv, Ph) detected by the energy sensors 1945 and 1946 may be inputted into the beam detection controller 600. The beam detection controller 600 may integrate values (Pvsum, Pvsum) of the energy data Pv and the Ph during the burst driving. When the burst driving is stopped, the beam detection controller 600 may obtain the polarization degree P using the following formula (4).

$$P=(Phsum-Pvsum)/(Phsum+Pvsum) \quad (4)$$

The beam detection controller 120 may transmit the obtained data of the polarization degree P to the laser controller 120.

As described above, it is also possible to obtain the polarization degree P by detecting the energies of the lights of the H direction polarization component and the V direction polarization component, which are separated by the Rochon prism 1941, by the individual energy sensors 1945 and 1946, respectively.

Figure 40:
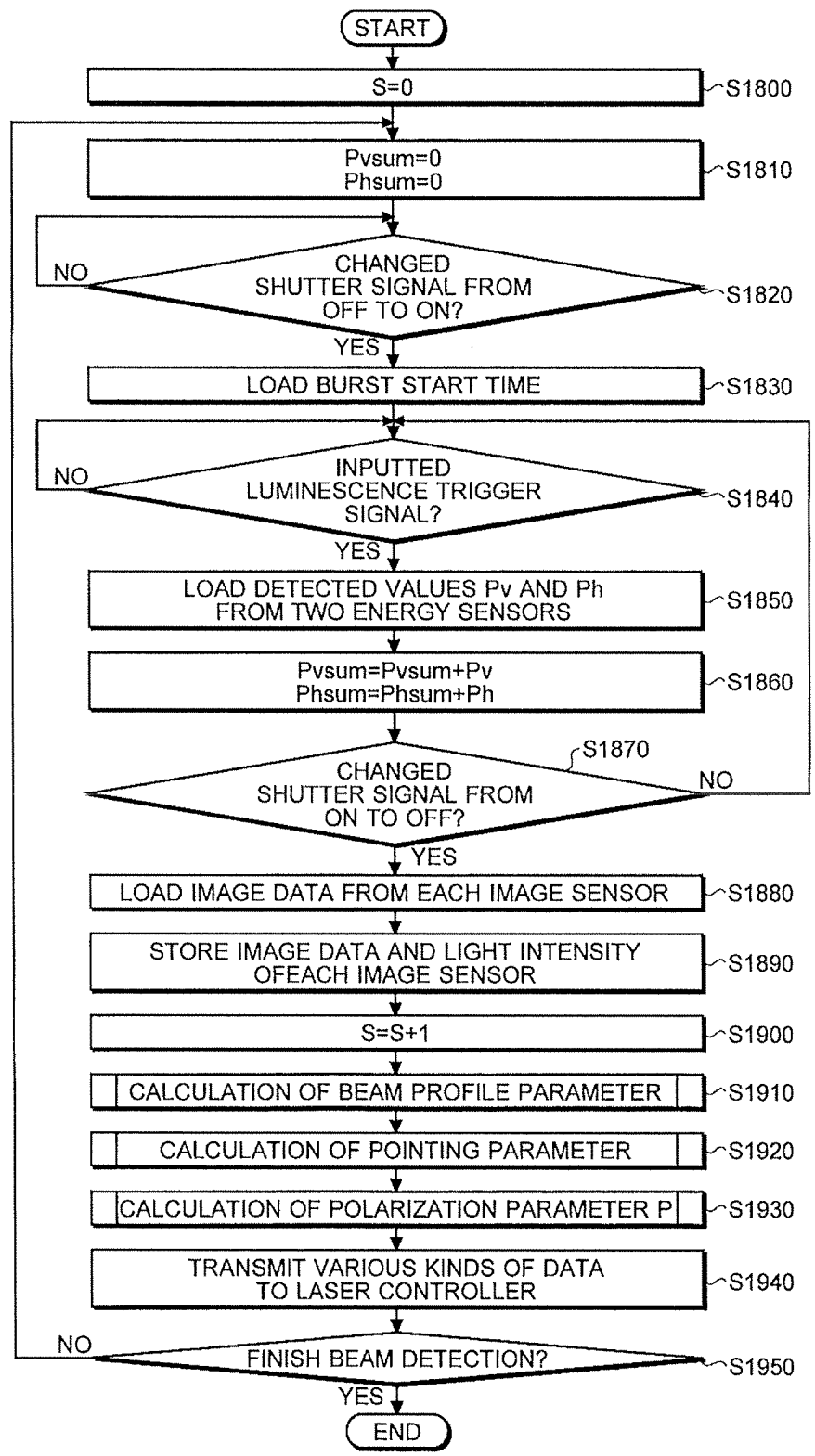
FIG. 40 is a flowchart showing an example of a beam detection method using the beam detection system shown in FIG. 39.

FIG. 40 is a flowchart showing an example of a beam detection method using the beam detection system 701 shown in FIG. 39.

Firstly, in step S1800, the beam detection controller 600 may set the burst number S as zero (S=0).

Then, in step S1810, the beam detection controller 600 may set the light intensity integration values Pvsum and Phsum in the V direction and the H direction as zero (Pvsum=0, Phsum=o), respectively. The light intensity integration value Pvsum may be an integration value of the light intensities Pv in the V direction detected by the second energy sensor 1946, and the light intensity integration value Phsum may be an integration value of the light intensities Ph in the H direction detected by the first energy sensor 1945.

Then, in step S1820, the beam detection controller 600 may determine whether the shutter signal Sht changes from OFF to ON or not. When the shutter signal Sht changes from OFF to ON, the beam detection controller 600 may progress to step S1830. When the shutter signal Sht does not change from OFF to ON, the beam detection controller 600 may repeat step S1820.

Then, in step S1830, the beam detection controller 600 may load the burst start time.

Then, in step S1840, the beam detection controller 600 may determine whether the luminescence trigger signal Str is inputted or not. When the beam detection controller 600 determines that the luminescence trigger signal Str is inputted, the beam detection controller 600 may progress to step S1850. When the beam detection controller 600 determines that the luminescence trigger signal Str is not inputted, the beam detection controller 600 may repeat step S1840.

Then, in step S1850, the beam detection controller 600 may load a light intensity Pv of pulse energy detected by the second energy sensor 1946 and a light intensity Ph of pulse energy detected by the first energy sensor 1945.

Then, in step S1860, the processor 620 in the beam detection controller 600 may obtain a new light intensity integration value Pvsum by adding the light intensity Pv of the pulse energy loaded in step S1850 to the current light intensity integration value Pvsum. Likewise, in step S1860, the processor 620 may obtain a new light intensity integration value Phsum by adding the light intensity Ph loaded in step S1850 to the current light intensity integration value Phsum.

Then, in step S1870, the beam detection controller 600 may determine whether the shutter signal Sht changes from ON to OFF or not. When the beam detection controller 600 determines that the shutter signal Sht changes from ON to OFF, the beam detection controller 600 may progress to step S1880. When the beam detection controller 600 determines that the shutter signal Sht does not change from ON to OFF, the beam detection controller 600 may return to step S1840.

Then, in step S1880, the beam detection controller 600 may obtain image data from the image sensor 1922 in the beam profiler 192 and the image sensor 1932 in the beam pointing detector 193.

Then, in step S1890, the beam detection controller 600 may store the light intensity integration values Pvsum and Phsum and the image data obtained by the image sensors 1922 and 1932 in the storage 610. At this time, the beam detection controller 600 may also store the burst start time loaded in step S1830 in the storage 610.

Then, in step S1900, the beam detection controller 600 may set a new burst number S by increment the current burst number S by 1 (S=S+1).

Then, in step S1910, the beam detection controller 600 may calculate the beam profile parameters. Specifically, the beam detection controller 600 may execute the sub-routine for calculating the beam profile parameters shown in FIG. 33.

Then, in step S1920, the beam detection controller 600 may calculate the pointing parameters. Specifically, the beam detection controller 600 may execute the sub-routine for calculating the pointing parameters shown in FIG. 35.

Then, in step S1930, the beam detection controller 600 may calculate the polarization degree P. Specifically, the beam detection controller 600 may execute a sub-routine for calculating the polarization degree P which will be described later on.

Then, in step S1940, the beam detection controller 600 may transmit the various kinds of data, i.e., the burst start time, the burst number S, the calculated beam profile parameters, the pointing parameters, the polarization parameters, or the like, to the laser controller 120.

Then, in step S1950, the beam detection controller 600 may determine whether the detection of the light beam should be finished or not. When the detection of the light beam should not be finished, the data detection controller 600 may progress to step S1810. When the detection of the light beam should be finished, the data detection controller 600 may finish the process flow.

In this way, it is possible to execute the beam detection using the beam detection system according to the embodiment shown in FIG. 39.

Figure 41:
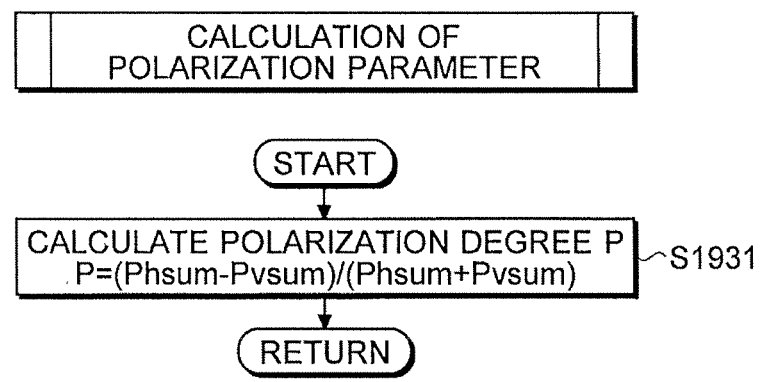
FIG. 41 is a flowchart showing an example of a sub-routine for calculating the polarization degree P in step S1930 of FIG. 40.

FIG. 41 is a flowchart showing an example of the sub-routine for calculating the polarization degree P in step S1930 of FIG. 40. Although FIG. 41 shows only step S1931, in step S1931, the polarization degree P may be calculated using the above-described formula (4).

As described above, by obtaining the Pvsum and the Phsum, it is possible to calculate the polarization degree P easily.

8.2 Second Alternative

Figure 42:
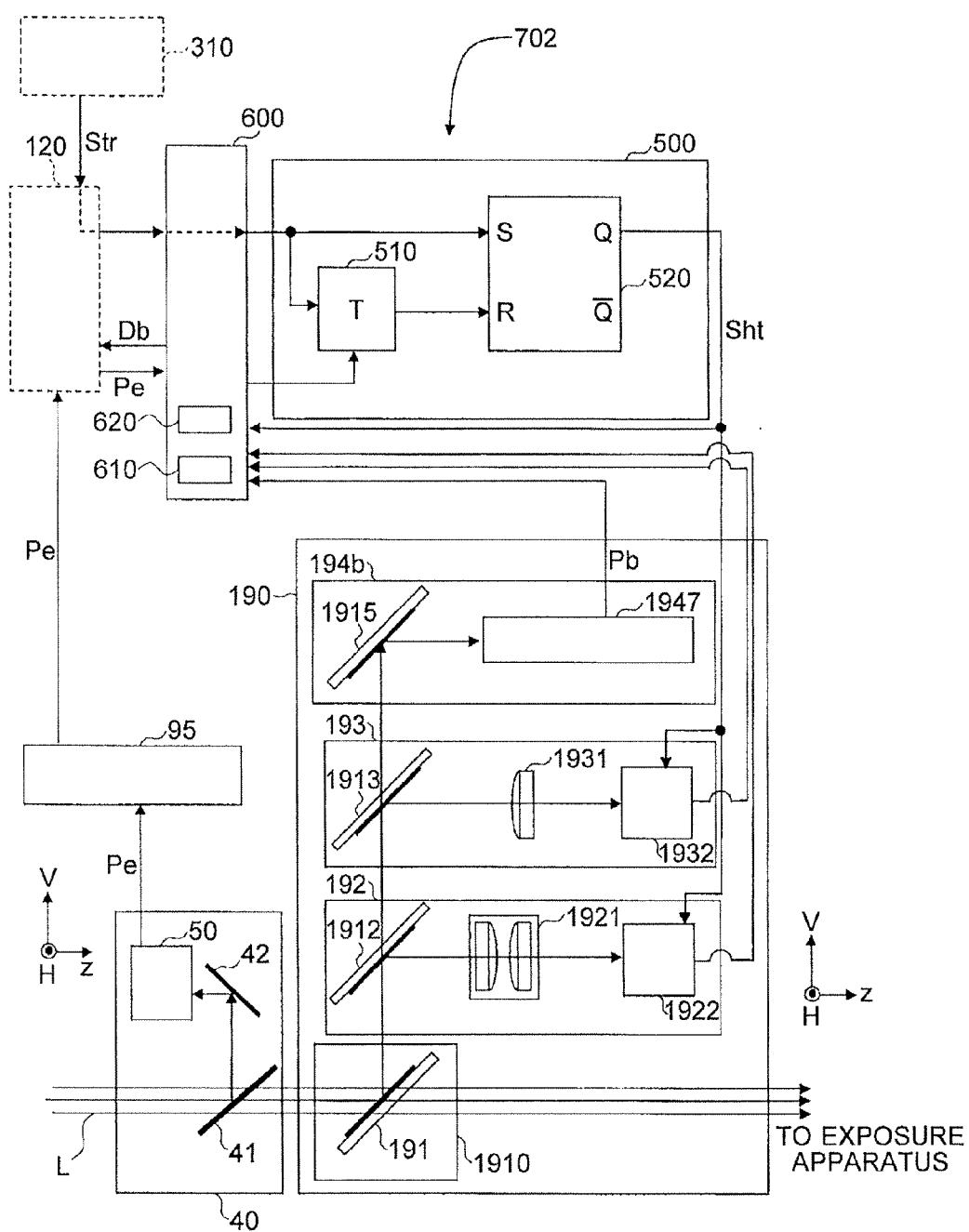
FIG. 42 is a diagram showing an example of a laser apparatus including a beam detection system different from the beam detection systems shown in FIGS. 30 and 39 according to the disclosure.

FIG. 42 is a diagram showing an example of a laser apparatus including a beam detection system different from the beam detection systems shown in FIGS. 30 and 39 according to the disclosure.

The beam detection system 702 shown in FIG. 42 is a system using a detection value Pe of the pulse energy detector 50 installed in the monitor module 40 shown in FIGS. 21 and 29.

The beam detection system 702 shown in FIG. 42 may differ from the beam detection system 701 shown in FIG. 39 in the way that a partial reflective mirror 1915 highlytransmitting the H direction polarization component and reflecting the V direction polarization component is installed in a polarization detector 194b instead of the high reflective mirror 1914 of the polarization detector 194a shown in FIG. 39. Furthermore, the beam detection system 702 may differ from the beam detection system 701 in the way that the Rochon prism 1941 and the collector optics 1943 are omitted and the light reflected by the partial reflective mirror 1915 enters an energy sensor 1947. The partial reflective mirror 1915 may be a naked substrate constructed from $CaF_2$. The partial reflector mirror 1915 may be arranged in the Brewster's angle.

The energy sensor 1947 may be the same as the second energy sensor 1946 for receiving the light of the V direction polarization component shown in FIG. 39. The energy sensor 1947 may be connected to the beam detection controller 600, and a detection value Pb of the energy sensor 1947 may be inputted into the beam detection controller 600.

A detection value Pe of the pulse energy detector 50 of the monitor module 40 may be inputted into the beam detection controller 600 via the energy controller 95 and the laser controller 120.

According to such structure, because the beam detection controller 600 directly receives the detection value Pb of the energy sensor 1947 from the energy sensor 1947 and receives the detection value Pe of the pulse energy detector 50 from the laser controller 120, it is possible to calculate the polarization degree P.

As described above, by using the detection value Pe of the pulse energy detected by the monitor module 50, it is possible to structure the polarization detector 194b without the Rochon prism and the collector optics, and thereby, it is possible to simplify the polarization detector 194b.

Figure 43:
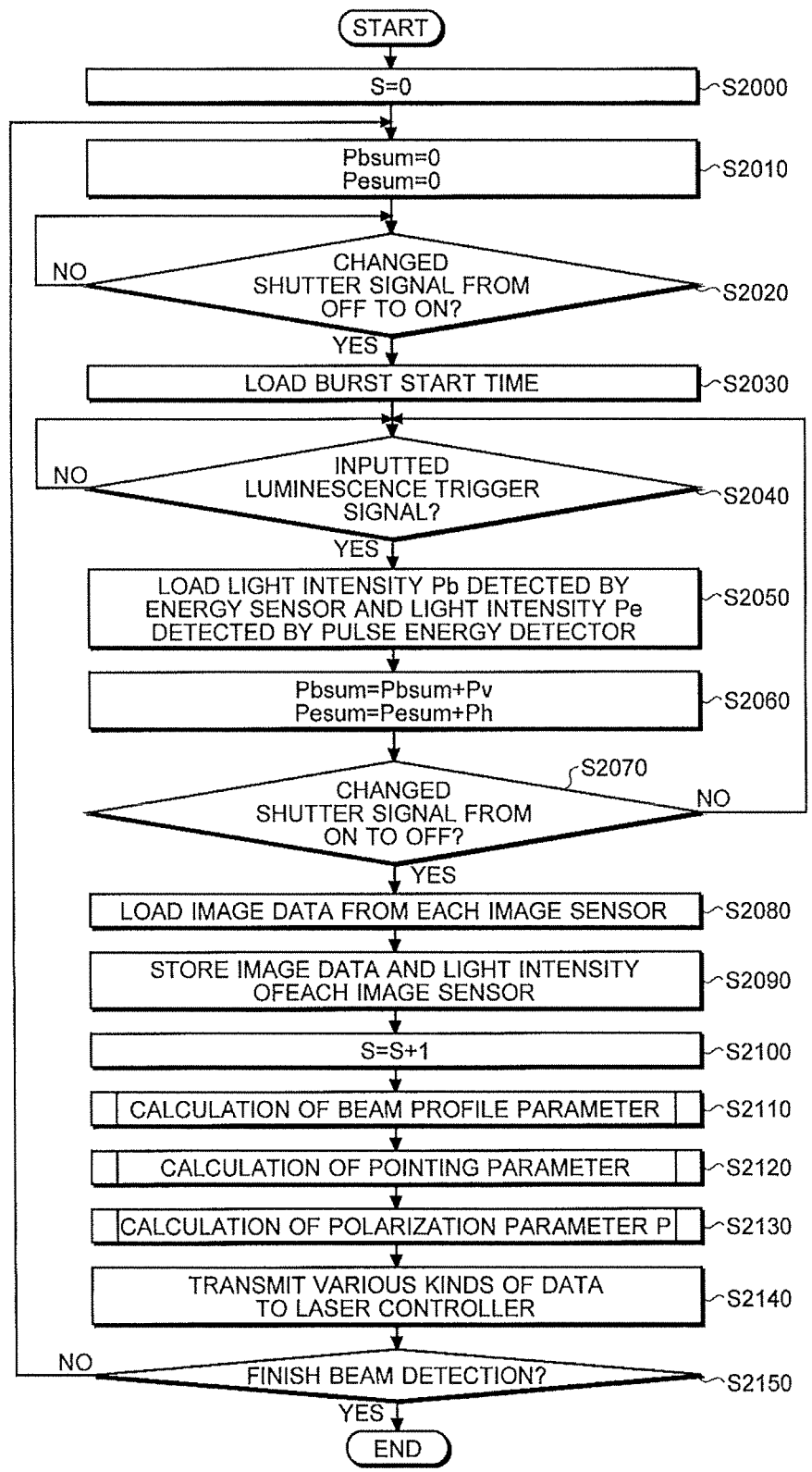
FIG. 43 is a flowchart showing an example of a beam detection method of the beam detection system shown in FIG. 42.

FIG. 43 is a flowchart showing an example of the beam detection method of the beam detection system 702 shown in FIG. 42.

Firstly, in step S2000, the beam detection controller 600 may set the burst number S as 0 (S=0).

Then, in step S2010, the beam detection controller 600 may set light intensity integrated values Pbsum and Pesum in the V direction and the H direction as 0, respectively (Pbsum=0, Pesum=0). The light intensity integration value Pbsum may be an integration value of the light intensity Pv in the V direction detected by the energy sensor 1947, and the light intensity integration value Pesum is an integration value of the light intensity Ph in the H direction detected by the pulse energy detector 50.

Then, in step S2020, the beam detection controller 600 may determine whether the shutter signal Sht changes from OFF to ON or not. When the shutter signal Sht changes from OFF to ON, the beam detection controller 600 may progress to step S2030. When the shutter signal Sht does not change from OFF to ON, the beam detection controller 600 may repeat step S2020.

Then, in step S2030, the beam detection controller 600 may load the burst start time.

Then, in step S2040, the beam detection controller 600 may determine whether the luminescence trigger signal Str is inputted or not. When the beam detection controller 600 determines that the luminescence trigger signal Str is inputted, the beam detection controller 600 may progress to step S2050. When the beam detection controller 600 determines that the luminescence trigger signal Str is not inputted, the beam detection controller 600 may repeat step S2040.

Then, in step S2050, the beam detection controller 600 may load the light intensity Pb of the pulse energy detected by the energy sensor 1947 and the light intensity Pe of the pulse energy detected by the pulse energy sensor 50.

Then, in step S2060, the processor 620 of the beam detection controller 600 may obtain a new light intensity integration value Pbsum by adding the light intensity Pb loaded in step S2050 to the current light intensity integration value Pbsum. Likewise, the processor 620 may obtain a new light intensity integration value Pesum by adding the light intensity Pe loaded in step S2050 to the current light intensity integration value Pesum.

Then, in step S2070, the beam detection controller 600 may determine whether the shutter signal Sht changes from ON to OFF or not. When the beam detection controller 600 determines that the shutter signal Sht changes from ON to OFF, the data detection controller 600 may progress to step S2080. When the beam detection controller 600 determines that the shutter signal Sht does not change from ON to OFF, the data detection controller 600 may return to step S2040.

Then, in step S2080, the beam detection controller 600 may acquire image data from the image sensor 1922 in the beam profiler 192 and the image sensor 1932 in the beam pointing detector 193.

Then, in step S2090, the beam detection controller 600 may store the light intensity integration values Pbsum and Pesum and the image data acquired from the image sensors 1922 and 1932 in the storage 610. At this time, the beam detection controller 600 may also store the burst start time loaded in step S2030, or the like, in the storage 610.

Then, in step S2100, the beam detection controller 600 may set a new burst number S by incrementing the current burst number S by 1 (S=S+1).

Then, in step S2110, the beam detection controller 600 may calculate the beam profile parameters. Specifically, the beam detection controller 600 may execute the sub-routine for calculating the beam profile parameters shown in FIG. 33.

Then, in step S2120, the beam detection controller 600 may calculate the pointing parameters. Specifically, the beam detection controller 600 may execute the sub-routine for calculating the pointing parameters shown in FIG. 35.

Then, in step S2130, the beam detection controller 600 may calculate the polarization degree P. Specifically, the beam detection controller 600 may execute a sub-routine which will be described later on.

Then, in step S2140, the beam detection controller 600 may transmit the various kinds of data, i.e., the burst start time, the burst number S, the calculated beam profile parameters, pointing parameters and polarization parameters, or the like, to the laser controller 120.

Then, in step S2150, the beam detection controller 600 may determine whether the detection of the laser beam should be finished or not. When the detection of the laser beam should not be finished, the data detection controller 600 may progress to step S2010. When the detection of the laser beam should be finished, the data detection controller 600 may finish the process flow.

Figure 44:
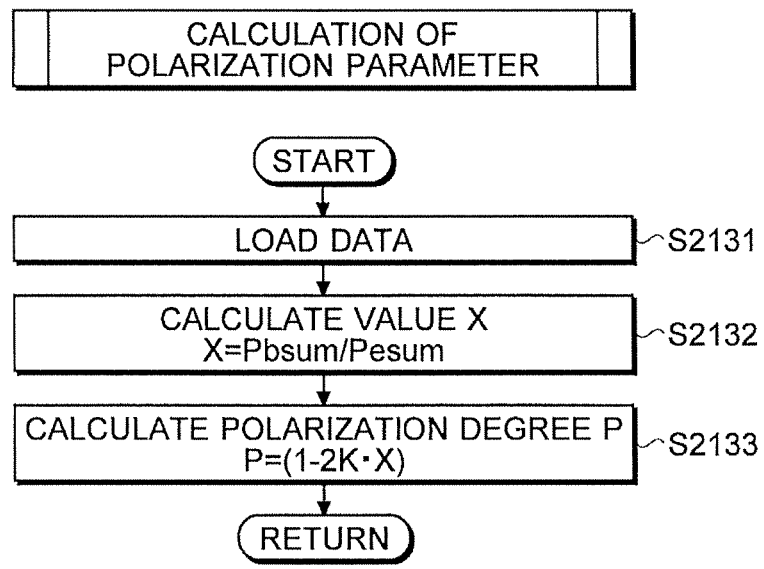
FIG. 44 is a flowchart showing an example of a sub-routine for calculating the polarization degree P in step S2130 of the process flow shown in FIG. 43.

FIG. 44 is a flowchart showing an example of the sub-routine in step S2130 of the process flow shown in FIG. 43.

Firstly, in step S2131, the beam detection controller 600 may load, to the processor 620, the light intensity integration value Pbsum of the energy sensor 1947 and the light intensity integration value Pesum in the pulse energy detector 50, which are stored in the storage 610.

Then, in step S2132, the processor 620 of the beam detection controller 600 may calculate a value of X for calculating the polarization degree P from the light intensity integration values Pbsum and Pesum. Specifically, the value of X may be calculated by X=Pbsum/Pesum.

Then, in step S2133, the processor 620 of the beam detection controller 600 may calculate the polarization degree P based on the value of X calculated in step S2132.

Figure 45:
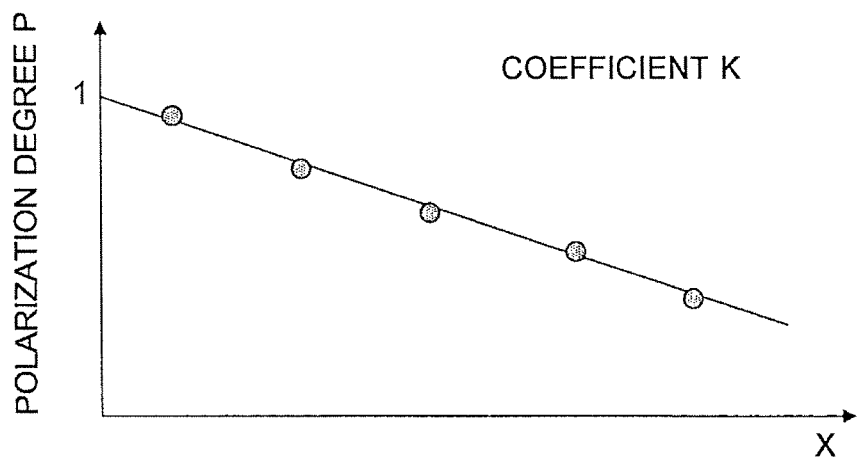
FIG. 45 is a diagram showing a measurement result of a relationship between a value of X and the polarization degree P.

FIG. 45 is a diagram showing a measurement result of a relationship between the value of X and the polarization degree P. Specifically, the polarization degree P may be calculated based on a relational formula P=(1−2K×X) shown in FIG. 45. Here, K is a coefficient indicating a gradient of the relational formula P=(1−2K×X). After execution of step S2133, the processor 620 may return to the process flow of the main routine shown in FIG. 43.

9. Alternative of Control Circuit

Figure 46:
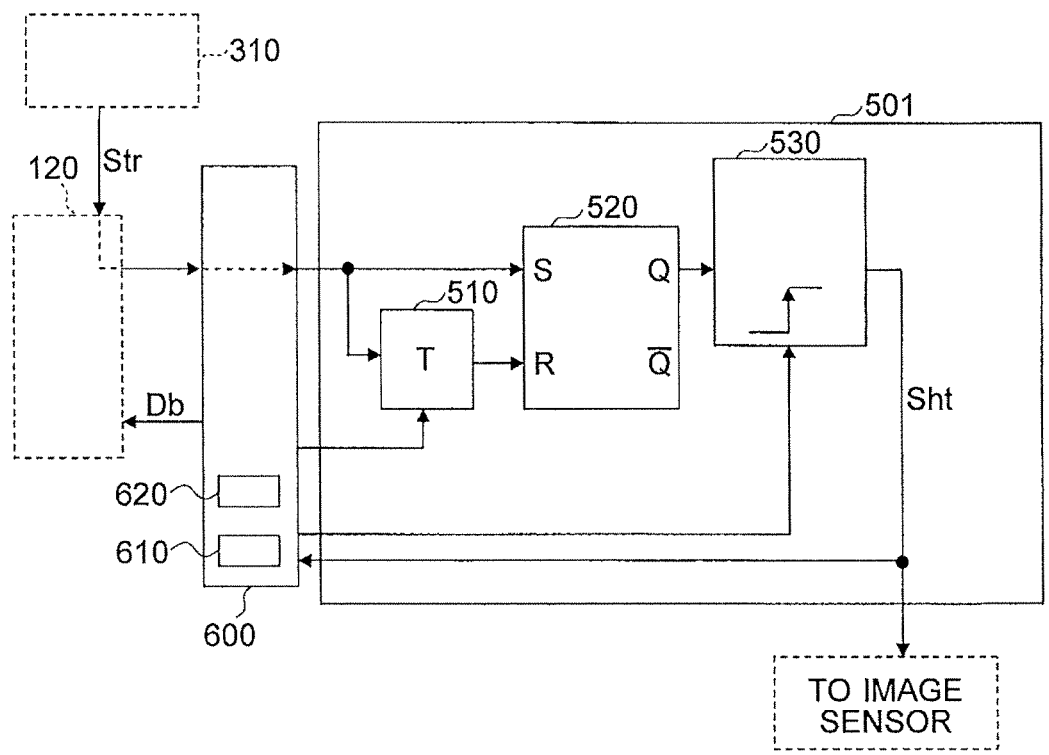
FIG. 46 is a diagram showing an alternative of a control circuit of the beam detection system shown in FIG. 30.

FIG. 46 is a diagram showing an alternative of the control circuit of the beam detection system shown in FIG. 30.

A control circuit 501 shown in FIG. 46 may have the same structure as the control circuit 500 shown in FIG. 30, and further have an one-shot circuit 530. The control circuit 501 may be the same as the control circuit 500 in the way that the timer circuit 510 and the flip-flop circuit 520 are installed.

The one-shot circuit 530 may be disposed between the output terminal Q of the flip-flop circuit 520 and the image sensors 1922, 1932 and 1944. The beam detection controller 600 and the one-shot circuit 530 may be structured so that the beam detection controller 600 can set an imaging time of the image sensors 1922, 1932 and 1944.

When a burst start signal is inputted from the flip-flop circuit 520, the one-shot circuit 530 can close electrical shutters of the image sensors 1922, 1932 and 1944 during the imaging time from rising edges of the image sensors 1922, 1932 and 1944, respectively.

By using the control circuit 501 shown in FIG. 46, it is possible to certainly obtain data around an initial pulse of the burst. Even when a time length of each burst is different, because it is possible to image with the constant imaging time, it is possible to stabilize light volumes of the image sensors 1922, 1932 and 1944. That is, regardless of the time lengths of the bursts, it is possible to constantly obtain data for the specific period of time from the start of burst, and thereby, it is possible to obtain the image data stably.

Even when the energy sensors 1945 to 1947 are used for the polarization detectors 194, 194a or 194b, the control circuit 501 can be applied to the image sensors 1922 and 1932, and therefore, the control circuit 501 can be applied to the beam detection systems 701 and 702 shown in FIGS. 39 and 42.

Figure 47:
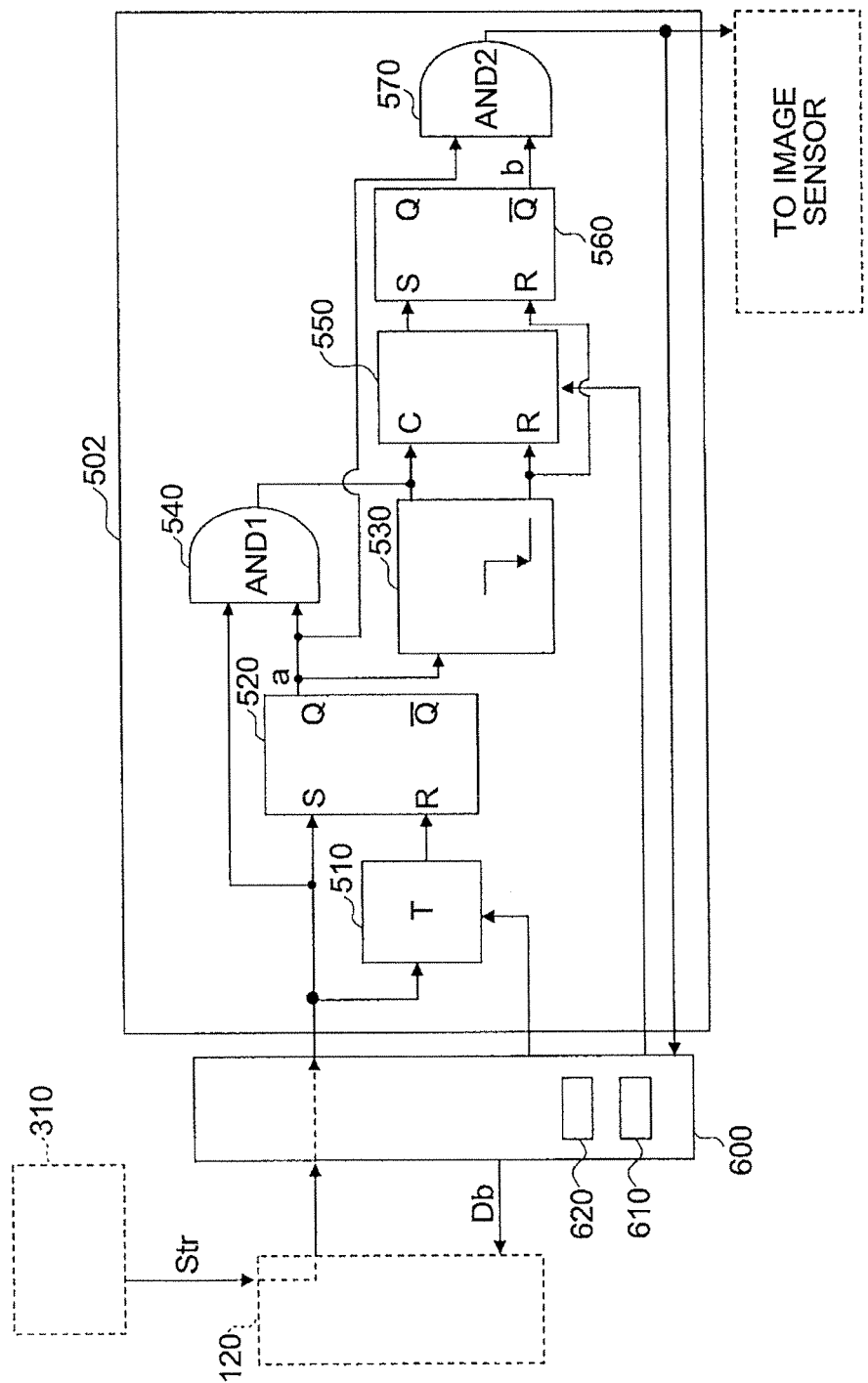
FIG. 47 is a diagram showing an alternative of the control circuit different from that shown in FIG. 46.

FIG. 47 is a diagram showing an alternative of the control circuit different from that shown in FIG. 46. A control circuit 502 shown in FIG. 47 may have a first AND circuit 540, a counter circuit 550, a second flip-flop circuit 560 and a second AND circuit 570 in addition to the timer circuit 510, the flip-flop circuit 520 and the one-shot circuit 530. In order to distinguish from the second flip-flop circuit 560, the flip-flop circuit 520 may be called as a first flip-flop circuit.

The control circuit 502 shown in FIG. 47 may structure a logical circuit in which the electrical shutters are closed till the pulse number of the pulse laser beams reaches a specific pulse number. That is, till the pulse number of the pulse laser beams from an initial pulse of a burst reaches the specific pulse number, the electrical shutters of the image sensors 1922, 1932 and 1944 may be closed.

By using such control circuit 502, it is possible to obtain data of the specific number of pulses from the initial pulse of the burst certainly. Furthermore, because it is possible to expose till the pulse number from the initial pulse of each burst reaches the specific pulse number, it is possible to stabilize the light volumes of the image sensors 1922, 1932 and 1944.

Here, as the control circuit 501 shown in FIG. 46, the control circuit 502 can be applied to the beam detection systems 701 and 702 with the image sensors 1922 and 1932 shown in FIGS. 39 and 42.

Figure 48:
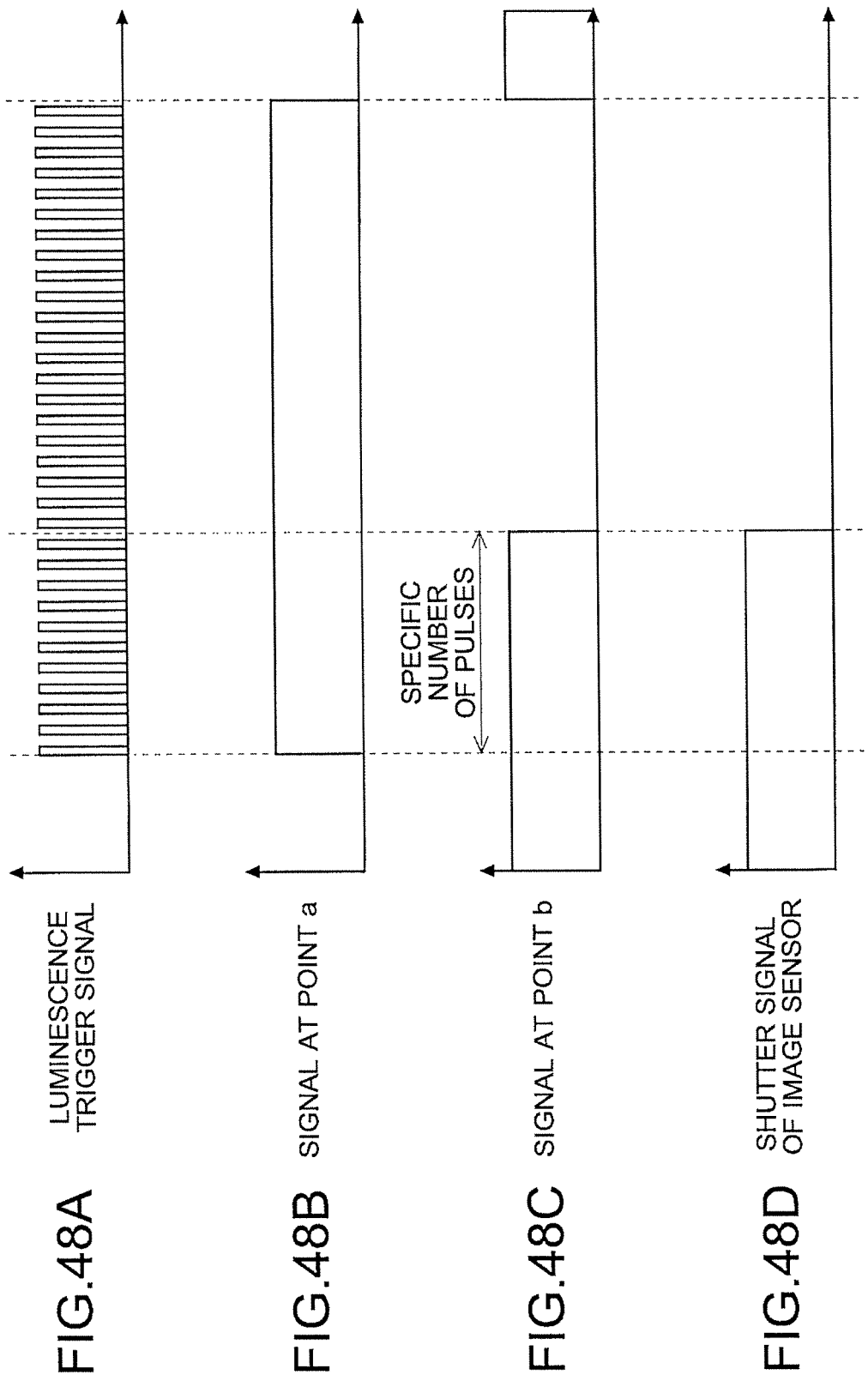
FIG. 48A is a timing chart showing an example of luminescence trigger signals.
FIG. 48B is a timing chart showing an example of output signals at point a of the control circuit shown in FIG. 47.
FIG. 48C is a timing chart showing an example of output signals at point b of the control circuit shown in FIG. 47.
FIG. 48D is a timing chart showing an example of electrical shutter signals to be inputted into image sensors.

FIG. 48 is a timing chart of electrical shutter signals of the control circuit shown in FIG. 47. FIG. 48A is a timing chart showing an example of the luminescence trigger signals Str, and FIG. 48B is a timing chart showing an example of output signals at a point a of the control circuit 502 shown in FIG. 47. FIG. 48C is a timing chart showing an example of output signals at a point b of the control circuit 502 shown in FIG. 47, and FIG. 48D is a timing chart showing an example of the electrical shutter signals to be inputted into the image sensors.

An output at the point a in FIG. 47 may be the same as an output signal of the control circuit 500 shown in FIG. 30, and as shown in FIG. 48B, the output at the point a may be turned on during a burst term of the luminescence trigger signals Str.

On the other hand, as shown in FIG. 48C, a signal at the point b may show a signal to be inputted to one input terminal of the second AND circuit 570, and a logical circuit which turns OFF from ON when the pulse number reaches the specific pulse number may be installed.

Because the point a is connected to the other input terminal of the second AND circuit 570, a signal at the point a may be inputted into the second AND circuit 570, and a logical product of the signals at the points a and b may be an output of the second AND circuit 570. Therefore, a logical product of signals shown in FIGS. 48B and 48C may become a final output signal shown in FIG. 48D. Thereby, the control circuit 502 can output the shutter signal Sht with a waveform of Open till the pulse number from the start of burst reaches the specific pulse number.

As described above, by appropriately installing the logical circuits, it is possible to execute a control of opening the electrical shutters till the pulse number from the start of burst reaches the specific pulse number

10. Data Processing System of EUV Generator Apparatus

Figure 49:
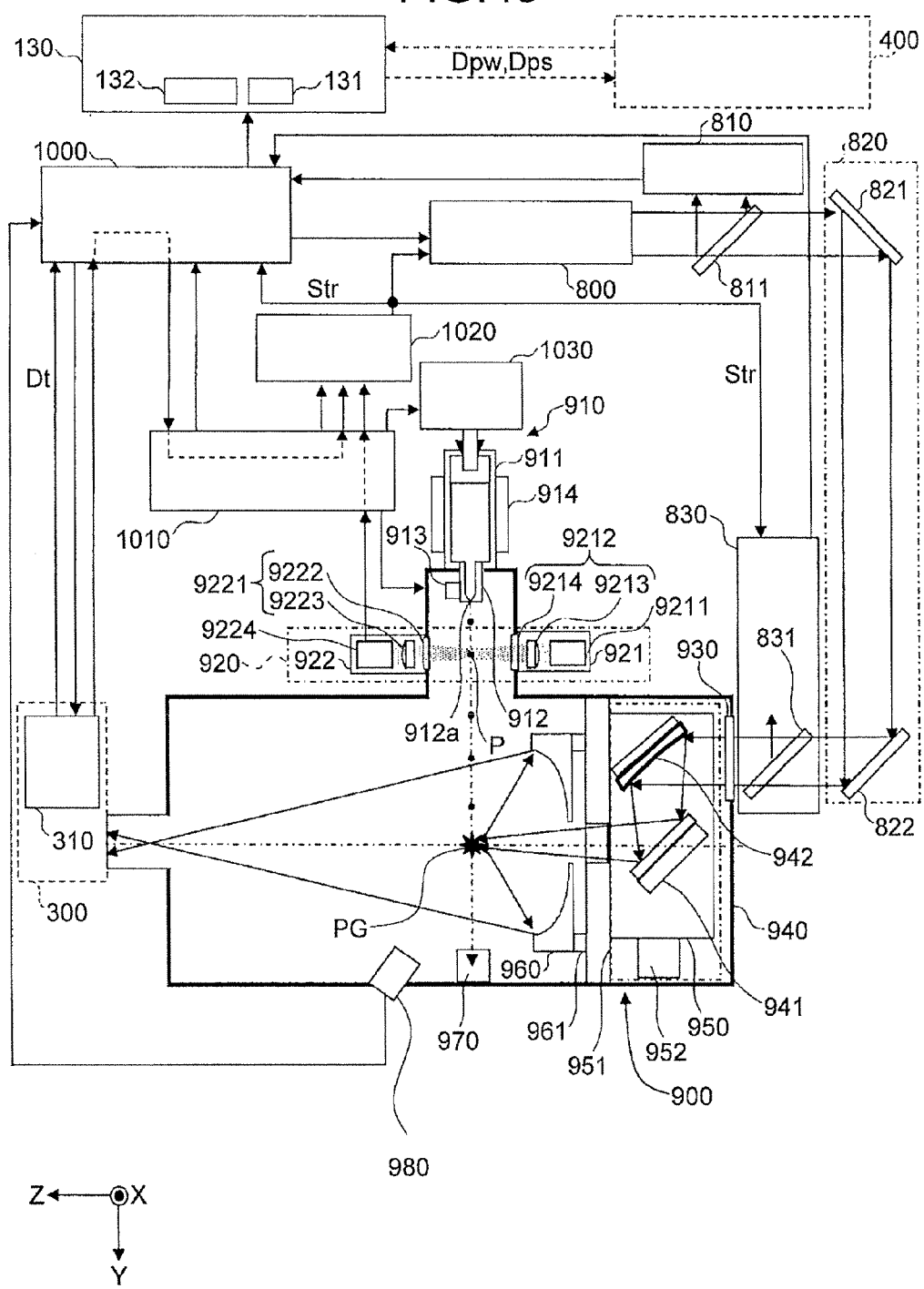
FIG. 49 is a diagram showing an example of a data processing system of an EUV light generation apparatus.

FIG. 49 is a diagram showing an example of the data processing system of the EUV light generation apparatus. In the above description, although the examples where the data processing system according to the disclosure is applied to the laser apparatus are explained, the data processing system according to the disclosure can be applied to the entirely of the light source apparatus capable of outputting a pulse laser beam.

In the embodiment, an example in that the data processing system according to the disclosure is applied to the EUV light source apparatus will be explained. Firstly, a structure of the EUV light source apparatus will be explained.

The EUV light generation apparatus may include a laser apparatus 800, a laser pulse energy sensor 810, a beam delivery system 820, a beam detection system 830, an EUV chamber 900, an EUV light generation controller 1000, a controller 1010 and a control circuit 1020.

The EUV chamber 900 may include a target supply 910, a droplet detector 920, a window 930, a laser collector optics 940, plates 950 and 951, an EUV collector mirror holder

961, an EUV collector mirror 960, a target receiver 970 and an EUV light pulse energy sensor 980.

The target supply 910 may include a tank 911 storing a target material (liquid Sn), a nozzle 912 including a nozzle hole 912a, a piezoelectric element 913 disposed on the nozzle 912, and a heater 914 disposed on the tank 911.

The droplet detector 920 may include a light source unit 921 and a photo receiver unit 922. The light source unit 921 may include a light source 9211 and an illumination optics 9212, and be disposed for illuminating a droplet at a specific position P on a trajectory of the droplet between the nozzle 912 of the target supply 910 and a plasma generation region. The illumination optics 9212 may include a collector lens 9213 and a window 9214. The photo receiver unit 922 may include a receiving optics 9221 and a light sensor 9224, and be disposed for receiving illumination light outputted from the light source unit 921. The receiving optics 9221 may include a window 9222 and a collector lens 9223. A signal outputted from the light sensor 9224 may be inputted into the control circuit 1020 directly or via the controller 1010.

An output signal from the control circuit 1020 may be inputted into the laser apparatus 800 and the EUV light generation controller 1000, respectively, as the luminescence trigger signal Str. The control circuit 1020 may include an AND circuit and a delay circuit. Details of an internal structure of the control circuit 1020 will be described later on. A delay time of the delay circuit may be set so that a pulse laser beam outputted from the laser apparatus 800 into which the luminescence trigger signal Str is inputted enters a droplet at the time when the droplet reaches the plasma generation region via the specific position P.

A high reflective off-axis paraboloidal mirror 942 and a high reflective plain mirror 941 may be disposed so that a focal position of the laser collector optics 940 corresponds to the plasma generation region.

The burst signal may be inputted into the control circuit 1020 from the exposure apparatus 310 via the EUV light generation controller 1000 and the controller 1010. That is, in the case of the EUV light generation apparatus, the control circuit 1020 may receive the burst signal, but not the luminescence trigger signal Str, from the exposure apparatus 300.

As the beam detection system 830, the beam detection systems 700, 701 and 702 shown in FIGS. 30, 39 and 42 can be applied.

Next, an operation of the EUV light generation apparatus will be explained.

When the EUV light generation controller 1000 receives a preparation command of an EUV light generation from the exposure controller 310, the EUV light generation controller 1000 may transmit a droplet generation signal to the controller 1010.

When the controller 1010 receives the droplet generation signal from the EUV light generation controller 1000, the controller 1010 may execute a temperature control by heating Sn to a specific temperature which is within a range from 250° C. to 290° C. being equal to or greater than the melting point (232° C.). The controller 1010 may control a pressure regulator 1030 so that a pressure in the tank 911 becomes a pressure for outputting a jet of the target material (liquid Sn) at a specific speed from the nozzle hole 912a.

Then, the controller 1010 may transmit signals for supplying a voltage with a specific waveform to the piezoelectric element 913 so that periodical droplets are generated. As a result, because specific vibrations are applied to the jet outputted from the nozzle hole, the droplets will be generated periodically. This is a generation method based on a continuous jet method.

The illumination light to the droplet outputted from the light source unit 921 may be received by the photo receiver unit 922. Because the illumination light is shaded by the droplets in synchronization with the droplets passing through the specific position P on the track of the droplets, light intensity detected by the photo receiver unit 922 may be reduced. The photo sensor 9224 may detect variations of the light intensity, and input the detection result to the controller 1010 as timing signals indicating times of passages of the droplets.

Then, when the control circuit 1020 receives the burst signal transmitted from the exposure controller 310, the AND circuit may generate burst passage timing signals. The controller 1020 may output the luminescence trigger signals Str each of which is delayed from respective passage timing signals to the laser apparatus 800.

When the luminescence trigger signal Str is inputted into the laser apparatus 800, a pulse laser beam may be outputted from the laser apparatus 800. The outputted pulse laser beam may enter the beam detection system 830 via the beam delivery system 820.

In the beam detection system 830, a part of the pulse laser beam may be sampled, and a beam profile, a beam position, a beam divergence, a beam pointing and a polarization degree may be detected. These beam detection data may be transmitted to the EUV light generation controller 1000 by each burst.

A pulse laser beam having been passed through the beam detection system 830 may enter the EUV chamber 900 via the window 930. The pulse laser beam may be focused on a droplet reaching the plasma generation region PG by the laser collector optics 940.

As a result, a plasma may be generated, and EUV light may be emitted from the plasma. Pulse energy of the EUV light may be detected by an EUV light pulse energy sensor 980, and a detection data thereof may be transmitted to the EUV light generation controller 1000.

The EUV light generation controller 1000 may receive a trigger interval of the luminescence trigger signals Str from the control circuit 1020, a pulse order, the beam detection data from the beam detection system 830, pulse energy data of a laser beam from the laser energy sensor 810, pulse energy data of EUV light from the EUV light pulse energy sensor 980, and transmit the data to the data collection processing system 130.

The data collection processing system 130 may order the data by wafer basis and scanning basis based on the data and signals from the FDC system 400, and transmit the ordered data to the FDC system 400.

As described above, in the EUV light generation apparatus according to the disclosure, the burst luminescence trigger signals Str may be generated based on the burst signal from the exposure controller 310 and the droplet passage timing signals, and by measuring a time interval of the burst luminescence trigger signals Str, the data may be ordered by wafer basis and scanning basis, and then, the ordered data may be transmitted to the FDC system 400.

Figure 50:
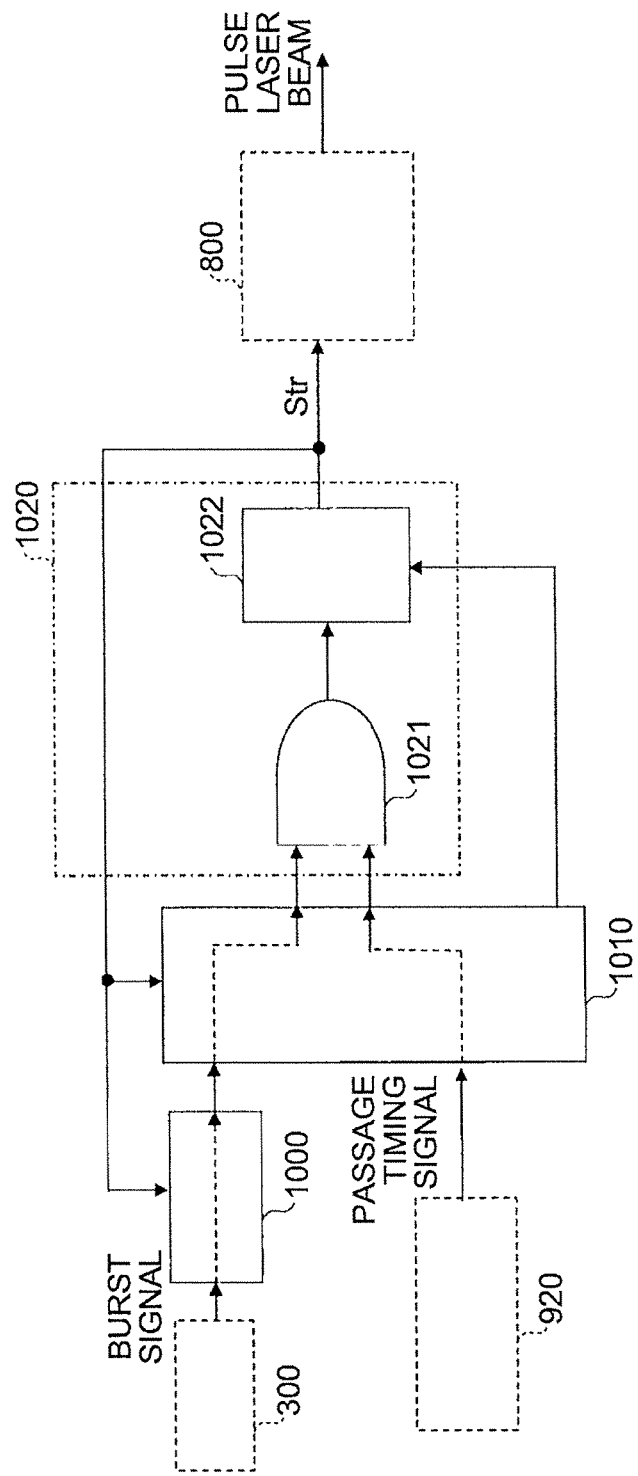
FIG. 50 is a diagram showing an example of a control system of the EUV light generation apparatus according to the disclosure shown in FIG. 49.

FIG. 50 is a diagram showing an example of a control system of the EUV light generation apparatus according to the disclosure shown in FIG. 49. In FIG. 50, the exposure apparatus 300 related to control of the EUV light generation apparatus, the EUV light generation controller 1000, the droplet detector 920, the control circuit 1020 and the laser apparatus 800 are shown.

The control circuit 1020 may include an AND circuit 1021 and a delay circuit 1022. The AND circuit 1021 and the delay circuit 1022 may be connected to each other so that an output of the AND circuit 1021 is inputted into the delay circuit 1022.

The controller 1010 may be connected to the AND circuit 1021 of the control circuit 1020, and the burst signal and the droplet passage timing signals may be inputted into the AND circuit 1021 from the controller 1010. An output of the delay circuit 1022 may be connected to an input of the laser apparatus 800, the controller 1010 and the EUV light generation controller 1000. The controller 1010 may be connected to an input for setting the delay time of the delay circuit 1022.

Next, an operation of such control system will be explained.

The controller 1010 may transmit data about a specific delay time to the delay circuit 1022. The specific delay time may be defined as a difference between a time Dt1 after a droplet passes through a droplet passage timing detection position P and before the droplet reaches the plasma generation region PG and a time a after a luminescence trigger signal Str is inputted into the laser apparatus 800 and before a laser beam reaches the plasma generation region P.

FIGS. 51A to 51C are timing charts of the specific signals of the control system shown in FIG. 50. FIG. 51A is a timing chart of the burst signals, and FIG. 51B is a timing chart of the droplet passage timing signals. FIG. 51C is a timing chart of the luminescence trigger signals. In the following, with reference to FIGS. 50 and 51A to 51C, an operation of the control system will be explained.

In a case where the burst signal (see FIG. 51A) from the exposure apparatus 300 and the passage timing signals (see FIG. 51B) from the droplet detector are inputted into the AND circuit 1021 via the controller 1010, when both the burst signal and the droplet passage timing signal become high, an output signal of the AND circuit 1021 may become high. Therefore, a signal in synchronization with the droplet passage timing signal may be generated at the time when the burst signal is high, and thereby, the burst pulse beams may be outputted.

The output signal from the AND circuit may be delayed by the specific delay time a by the delay circuit 1022. The delayed signal may be transmitted to the laser apparatus 800 as the luminescence trigger signal Str (see FIG. 51C) of the laser apparatus. When the laser apparatus 800 receives the luminescence trigger signal Str, the laser apparatus 800 may output a pulse laser beam. The pulse laser beam may pass through the beam delivery system 820 and the window 830, be collected by the laser collector optics 940, and enter a droplet reaching the plasma generation region PG. As a result, the droplet may be ionized, and EUV light may be generated.

FIG. 52 is a diagram showing an example of data collection in a case where data collection of a light source apparatus constructed from the EUV light generation apparatus is executed.

The data collection may be divided into three main classes of laser pulse energy related data of the laser apparatus 800, laser beam related data of the laser apparatus 800 and EUV light related data. Because the EUV light generation apparatus takes in the laser apparatus 800 for generating EUV light, data at a stage of irradiation of a droplet with a pulse laser beam and data for actually outputted EUV light should be collected. Also, in FIG. 52, both the data for the laser apparatus 800 and the data for the EUV light are collected. The collected data may be transmitted to the data collection processing system 130.

The data collection processing system 130 may order the data collected by pulse basis, scanning basis and wafer basis based on kinds of data, and if necessary, transmit the ordered data to the FDC system 400. Because this is the same with the above-described explanations, the redundant explanations thereof will be omitted.

Items of data shown in FIG. 52 are just random examples, and it is possible to select various kinds of items of data depending on the intended use.

11. Epilegomenon

11.1 Controller

Next, with reference to FIG. 53, each controller of the light source apparatus according to the disclosure will be explained.

Figure 53:
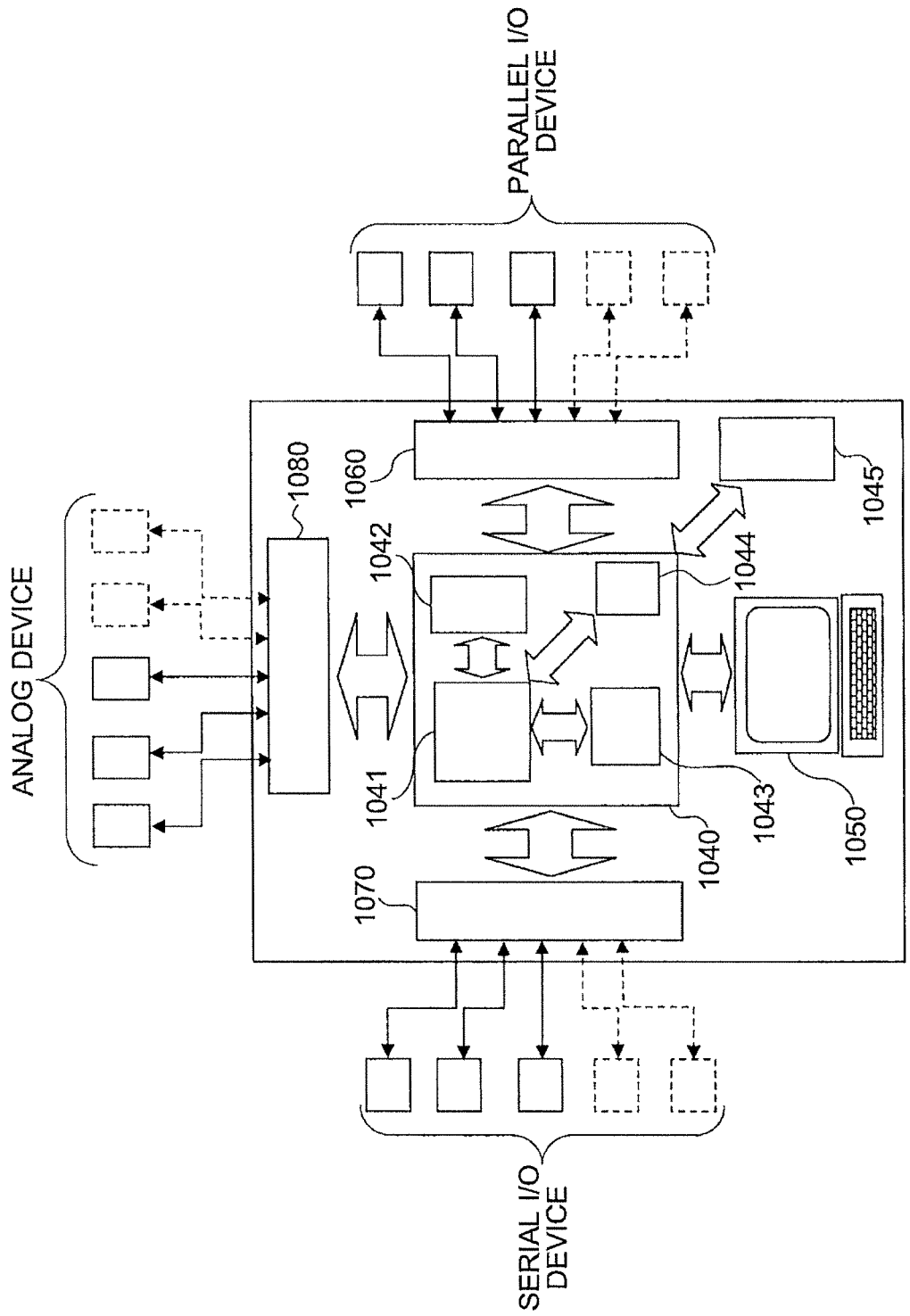
FIG. 53 is a diagram showing a structure example of each controller of the light source apparatus according to the disclosure.

FIG. 53 is a diagram showing a structure example of each controller of the light source apparatus according to the disclosure.

Each controller of the light source apparatus may be structured by the general-purpose control instrument such as a computer, a programmable controller, or the like. For example, each controller may be structured as the following.

The controller may include a processor 1040, a storage memory 1045 connected to the processor 1040, a user interface 1050, a parallel I/O controller 1060, a serial I/O controller 1070 and a D/A converter 1080. The processor 1040 may include a CPU 1041, a memory 1042 connected to the CPU 1041, a timer 1043 and a GPU 1044.

The processor 1040 may load a program stored in the storage memory 1045. The processor 1040 may execute the loaded program, load data from the storage memory 1045 according to the execution of the program, and store data in the storage memory 1045.

The parallel I/O controller 1060 may be connected to devices capable of communicating via parallel I/O ports. The parallel I/O controller 1060 may control communications using digital signals via the parallel I/O ports, which are executed during the processor 1040 executes the program.

The serial I/O controller 1070 may be connected to devices capable of communicating via serial I/O ports. The serial I/O controller 1070 may control communications using digital signals via the serial I/O ports, which are executed during the processor 1040 executes the program.

A/D D/A converter 1080 may be connected to devices capable of communicating via analog ports. The A/D D/A converter 1080 may control communications using analog signals via the analog ports, which are executed during the processor 1040 executes the program.

The user interface 1050 may be structured so that an operator can let the processor 1040 display an execution status of the program by the processor 1040, let the processor 1040 break the execution of the program, and let the processor 1040 execute an interruption handling with respect to the execution of the program.

The CPU 1041 of the processor 1040 may execute arithmetic processing of the program. The memory 1042 may execute a temporary storage of the program and a temporary storage of data in the arithmetic processing during the CPU 1041 executes the program. The timer 1043 may measure a time and an elapsed time, and output the time and the elapsed time to the CPU 1041 according to the execution of the program. The GPU 1044 may process, when image data is inputted into the processor 1040, the image data according to the execution of the program, and output a result thereof to the CPU 1041.

The devices capable of communicating via the parallel I/O ports connected to the parallel I/O controller 1060 may be various kinds of devices, the other controllers, or the like.

The devices capable of communicating via the serial I/O ports connected to the serial I/O controller 1070 may be various kinds of devices, the other controllers, or the like.

The devices capable of communicating via the analog ports connected to the A/D D/A converter 1080 may be various kinds of devices, the other controllers, or the like.

The above-described embodiments and the modifications thereof are merely examples for implementing the present disclosure, and the present disclosure is not limited thereto. Making various modifications according to the specifications or the like is within the scope of the present disclosure, and other various embodiments are possible within the scope of the present disclosure. For example, the modifications illustrated for particular embodiments can be applied to other embodiments as well (including the other embodiments described herein).

The terms used in this specification and the appended claims should be interpreted as "non-limiting." For example, the terms "include" and "be included" should be interpreted as "including the stated elements but not limited to the stated elements." The term "have" should be interpreted as "having the stated elements but not limited to the stated elements." Further, the modifier "one (a/an)" should be interpreted as "at least one" or "one or more."

What is claimed is:

1. A light source apparatus configured for an exposure apparatus which exposes a plurality of wafers by repeating a wafer exposure for exposing a total exposure area of each wafer, the wafer exposure including a sequential execution of scanning exposures in which each divided area defined by dividing the total exposure area of each wafer is scanned by pulsed light, the apparatus comprising:
    a light source controller configured to execute a control for outputting the pulsed light based on a luminescence trigger signal received from the exposure apparatus;
    a detector configured to detect a characteristic of the pulsed light; and
    a data collection processor configured to collect at least a piece of data in data included in a pulse light data group related to the pulsed light detected by the detector and a control data group related to the control, and to execute a mapping process of mapping the data collected for each pulse of the pulsed light of each scanning exposure for at least one wafer, each pulse of the pulsed light of a particular scanning exposure exposing a same area of the divided area, the mapping process mapping the data collected for each pulse of the pulsed light with respect to each pulse of a total number of pulses of the pulsed light for exposure of the at least one wafer,
    the data collection processor being configured to execute a process of collecting the mapped data by each item and transmit the data collected by each item to a monitor device, the item being for the particular scanning exposure for the at least one wafer, the monitor device being configured to monitor a state of a semiconductor production equipment that includes the exposure apparatus by providing an ability to analyze the mapped data.

2. The apparatus according to claim 1, wherein
    the data collection processor includes
        a storage configured to store at least the piece of data, and
        an arithmetic processor configured to execute the mapping process.

3. The apparatus according to claim 1, wherein the data collection processor is installed in the light source controller.

4. The apparatus according to claim 1, wherein the data collection processor executes a process of associating a wafer ID defined at the exposure apparatus with one of the data on which the mapping process is executed and the data on which the process of collecting by each item is executed.

5. The apparatus according to claim 1, wherein the mapping process includes a process of determining that the pulsed light is one of a starting pulse or an ending pulse of the wafer exposure based on a reception interval of the luminescence trigger signals.

6. The apparatus according to claim 1, wherein the mapping process includes a process of determining that the pulsed light is an ending pulse of the wafer exposure based on the number of times of the scanning exposures.

7. The apparatus according to claim 1, wherein
    in a case where the light source apparatus is configured for the exposure apparatus which executes an adjustment oscillation of outputting the pulsed light without exposing the wafer before the wafer exposure,
    the mapping process includes a process of distinguishing the adjustment oscillation and a start of the wafer exposure based on the pulse number of the pulsed lights.

8. The apparatus according to claim 6, wherein the mapping process includes a process of determining that the pulsed light is a starting pulse of the wafer exposure based on a reception interval of the luminescence trigger signals.

9. The apparatus according to claim 8, wherein the mapping process
    determines, when the reception interval of the luminescence trigger signals is equal to or greater than a first specific term, that the pulsed light is one of a starting pulse or an ending pulse of the wafer exposure,
    determines, when the reception interval of the luminescence trigger signals is within a range of a second specific term, that the pulsed light is a starting pulse of the scanning exposure, and
    determines, when the reception interval of the luminescence trigger signals is equal to or smaller than a third specific term, that the pulsed light is pulsed light during the scanning exposure.

10. The apparatus according to claim 1, wherein the pulse light data group includes at least one of pulse energy, a wavelength and a spectrum width.

11. The apparatus according to claim 1, wherein the control data group includes a set value of a charge voltage set to a charger.

12. The apparatus according to claim 1, wherein
    the pulsed light is a pulse laser beam, and
    the light source apparatus is structured as a laser apparatus outputting the pulse laser beam.

13. The apparatus according to claim 1, wherein
    the pulsed light is EUV light, and
    the light source apparatus is structured as an EUV light generation apparatus outputting the EUV light.

14. The apparatus according to claim 1, wherein the monitor device comprises one of a fault detection and classification system and a manufacturing execution system.

15. A data processing method configured for an exposure apparatus which exposes a plurality of wafers by repeating a wafer exposure for exposing a total exposure area of each wafer, the wafer exposure including a sequential execution of scanning exposures in which each divided area defined by dividing the total exposure area of each wafer is scanned by pulsed light, the method including:
- executing a control for outputting the pulsed light based on a luminescence trigger signal received from the exposure apparatus;
- detecting a characteristic of the pulsed light;
- executing a data collection process of collecting at least a piece of data in data included in a pulse light data group related to the pulsed light detected by the detector and a control data group related to the control;
- executing a mapping process of mapping the data collected for each pulse of the pulsed light of each scanning exposure for at least one wafer, each pulse of the pulsed light of a particular scanning exposure being of a same area of the divided area, by mapping the data collected with respect to each pulse of a total number of pulses of the pulsed light for exposure of the at least one wafer; and
- executing a data transmission process,
- the data collection process including a process of collecting the mapped data by each item, the item being for the particular scanning exposure for the at least one wafer,
- the data transmission process including transmitting the data collected by each item to a monitor device, the monitor device being configured to monitor a state of a semiconductor production equipment that includes the exposure apparatus by providing an ability to analyze the mapped data.

16. The method according to claim 15, further including executing a process of associating a wafer ID defined at the exposure apparatus with one of the data on which the mapping process is executed and the data on which the process of collecting by each item is executed.

17. The method according to claim 15, wherein the mapping process includes a process of determining that the pulsed light is one of a starting pulse or an ending pulse of the wafer exposure based on a reception interval of the luminescence trigger signals.

18. The method according to claim 15, wherein the mapping process includes a process of determining that the pulsed light is an ending pulse of the wafer exposure based on the number of times of the scanning exposures.

19. The method according to claim 18, wherein the mapping process includes a process of determining that the pulsed light is a starting pulse of the wafer exposure based on a reception interval of the luminescence trigger signals.

20. The method according to claim 19, wherein the mapping process
- determines, when the reception interval of the luminescence trigger signals is equal to or greater than a first specific term, that the pulsed light is one of a starting pulse or an ending pulse of the wafer exposure,
- determines, when the reception interval of the luminescence trigger signals is within a range of a second specific term, that the pulsed light is a starting pulse of the scanning exposure, and
- determines, when the reception interval of the luminescence trigger signals is equal to or smaller than a third specific term, that the pulsed light is pulsed light during the scanning exposure.

21. The method according to claim 15, wherein
in a case where the data collection method is configured for the exposure apparatus which executes an adjustment oscillation of outputting the pulsed light without exposing the wafer before the wafer exposure,
the mapping process includes a process of distinguishing the adjustment oscillation and a start of the wafer exposure based on the pulse number of the pulsed lights.

22. The method according to claim 15, wherein the pulse light data group includes at least one of pulse energy, a wavelength and a spectrum width.

23. The method according to claim 15, wherein the control data group includes a set value of a charge voltage set to a charger.

24. The method according to claim 15, wherein the pulsed light is a pulse laser beam.

25. The method according to claim 15, wherein the pulsed light is EUV light.

26. The method according to claim 15, wherein the monitor device comprises one of a fault detection and classification system and a manufacturing execution system.

27. A light source apparatus configured for an exposure apparatus which exposes a plurality of wafers by repeating a wafer exposure for exposing a total exposure area of each wafer, the wafer exposure including a sequential execution of scanning exposures in which each divided area defined by dividing the total exposure area of each wafer is scanned by pulsed light, the apparatus comprising:
- a light source controller configured to execute a control for outputting the pulsed light based on a luminescence trigger signal received from the exposure apparatus;
- a detector configured to detect a characteristic of the pulsed light; and
- a data collection processor configured to collect at least a piece of data in data included in a pulse light data group related to the pulsed light detected by the detector and a control data group related to the control, and to execute a mapping process of mapping the data collected for each pulse of the pulsed light of each scanning exposure for at least one wafer, each pulse of the pulsed light of a particular scanning exposure exposing a same area of the divided area, the mapping process mapping the data collected for each pulse of the pulsed light with respect to each pulse of a total number of pulses of the pulsed light for exposure of the at least one wafer,
- the data collection processor being configured to transmit the mapped data to a monitor device, the monitor device being configured to monitor a state of a semiconductor production equipment that includes the exposure apparatus by providing an ability to analyze the mapped data, and comprising one of a fault detection and classification system and a manufacturing execution system.

* * * * *